(12) United States Patent
Andrews

(10) Patent No.: US 11,817,526 B2
(45) Date of Patent: Nov. 14, 2023

(54) TEXTURING FOR HIGH DENSITY PIXELATED-LED CHIPS AND CHIP ARRAY DEVICES

(71) Applicant: CREELED, INC., Durham, NC (US)

(72) Inventor: Peter Scott Andrews, Durham, NC (US)

(73) Assignee: CreeLED, Inc., Durham, NC (US)

(*) Notice: Subject to any disclaimer, the term of this patent is extended or adjusted under 35 U.S.C. 154(b) by 162 days.

(21) Appl. No.: 17/084,194

(22) Filed: Oct. 29, 2020

(65) Prior Publication Data
US 2021/0126160 A1     Apr. 29, 2021

Related U.S. Application Data

(60) Provisional application No. 62/927,504, filed on Oct. 29, 2019.

(51) Int. Cl.
    *H01L 33/38*        (2010.01)
    *H01L 33/08*        (2010.01)
    (Continued)

(52) U.S. Cl.
    CPC .............. *H01L 33/08* (2013.01); *H01L 33/24* (2013.01); *H01L 33/387* (2013.01); *H01L 33/50* (2013.01); *H01L 33/54* (2013.01)

(58) Field of Classification Search
    CPC ........... H01L 27/156; H01L 2933/0083; H01L 33/08; H01L 33/20; H01L 33/24; H01L 33/387; H01L 33/50; H01L 33/54
See application file for complete search history.

(56) References Cited

U.S. PATENT DOCUMENTS

| | | |
|---|---|---|
| 4,319,070 A | 3/1982 | Imai et al. |
| 5,955,747 A | 9/1999 | Ogihara et al. |
| (Continued) | | |

FOREIGN PATENT DOCUMENTS

| | | |
|---|---|---|
| CN | 101894851 A | 11/2010 |
| CN | 102737555 A | 10/2012 |
| (Continued) | | |

OTHER PUBLICATIONS

Notice of Allowance for U.S. Appl. No. 16/983,553, dated Apr. 14, 2022, 9 pages.

(Continued)

*Primary Examiner* — Matthew C Landau
*Assistant Examiner* — Dmitriy Yemelyanov
(74) *Attorney, Agent, or Firm* — Withrow & Terranova, P.L.L.C.; Vincent K. Gustafson

(57) ABSTRACT

A pixelated-LED chip includes an active layer with active layer portions, segregated by streets, that are configured to illuminate different light-transmissive substrate portions to form pixels. A light extraction surface of each substrate portion includes protruding features and light extraction surface recesses that may be formed by sawing. Underfill material may be provided between a pixelated-LED chip and a mounting surface, as well as between pixels and between anodes and cathodes thereof. Certain implementations provide light extraction surface recesses that are non-parallel to each street defined through the active layer. Certain implementations provide light extraction surface recesses that are non-aligned with (e.g., non-parallel to) anode-cathode boundaries of each anode-cathode pair. Such arrangements reduce a likelihood of cracking in portions of a pixelated-LED chip. Methods for fabricating pixelated-LED chips are also provided.

45 Claims, 32 Drawing Sheets

(51) Int. Cl.
*H01L 33/24* (2010.01)
*H01L 33/50* (2010.01)
*H01L 33/54* (2010.01)

(56) References Cited

U.S. PATENT DOCUMENTS

| | | | |
|---|---|---|---|
| 6,160,354 A | 12/2000 | Ruvinskiy et al. |
| 6,657,236 B1 | 12/2003 | Thibeault et al. |
| 6,747,298 B2 | 6/2004 | Slater, Jr. et al. |
| 6,791,119 B2 | 9/2004 | Slater, Jr. et al. |
| 6,821,804 B2 | 11/2004 | Thibeault et al. |
| 6,888,167 B2 | 5/2005 | Slater, Jr. et al. |
| 7,211,803 B1 | 5/2007 | Dhurjaty et al. |
| 7,829,906 B2 | 11/2010 | Donofrio |
| 8,212,297 B1 | 7/2012 | Law et al. |
| 8,716,724 B2 | 5/2014 | von Malm et al. |
| 8,835,959 B2 | 9/2014 | Nakamura et al. |
| 8,940,561 B2 | 1/2015 | Donofrio et al. |
| 8,963,121 B2 | 2/2015 | Odnoblyudov et al. |
| 8,969,897 B2 | 3/2015 | Choi |
| 8,981,395 B2 | 3/2015 | Choi et al. |
| 9,048,368 B2 | 6/2015 | Jeong |
| 9,099,575 B2 | 8/2015 | Medendorp, Jr. et al. |
| 9,123,864 B2 | 9/2015 | Tomonari et al. |
| 9,129,977 B2 | 9/2015 | Marchand et al. |
| 9,130,127 B2 | 9/2015 | Katsuno et al. |
| 9,130,128 B2 | 9/2015 | Shinohara |
| 9,130,137 B2 | 9/2015 | Lin et al. |
| 9,136,432 B2 | 9/2015 | Yun et al. |
| 9,136,433 B2 | 9/2015 | Park et al. |
| 9,142,725 B1 | 9/2015 | Suzuki |
| 9,153,750 B2 | 10/2015 | Seo et al. |
| 9,159,894 B2 | 10/2015 | Cho et al. |
| 9,166,107 B2 | 10/2015 | Park |
| 9,166,108 B2 | 10/2015 | Unosawa |
| 9,166,110 B2 | 10/2015 | Aihara |
| 9,166,111 B2 | 10/2015 | Matsui et al. |
| 9,171,882 B2 | 10/2015 | Akimoto et al. |
| 9,172,002 B2 | 10/2015 | Wang et al. |
| 9,172,021 B2 | 10/2015 | Sugizaki et al. |
| 9,178,121 B2 | 11/2015 | Edmond et al. |
| 9,196,653 B2 | 11/2015 | Leatherdale et al. |
| 9,209,223 B2 | 12/2015 | Lee et al. |
| 9,219,196 B2 | 12/2015 | Seo et al. |
| 9,219,200 B2 | 12/2015 | Erchak et al. |
| 9,231,037 B2 | 1/2016 | Shimayama |
| 9,236,526 B2 | 1/2016 | Choi et al. |
| 9,240,433 B2 | 1/2016 | Kim et al. |
| 9,252,345 B2 | 2/2016 | Cho et al. |
| 9,263,643 B2 | 2/2016 | Huang et al. |
| 9,263,652 B2 | 2/2016 | Yoon et al. |
| 9,269,858 B2 | 2/2016 | Schubert et al. |
| 9,277,618 B2 | 3/2016 | Odnoblyudov et al. |
| 9,281,448 B1 | 3/2016 | Choi et al. |
| 9,281,449 B2 | 3/2016 | Kim et al. |
| 9,287,457 B2 | 3/2016 | Jeong et al. |
| 9,293,664 B2 | 3/2016 | Seo et al. |
| 9,293,674 B2 | 3/2016 | Kususe et al. |
| 9,293,675 B2 | 3/2016 | Yang et al. |
| 9,299,889 B2 | 3/2016 | Katsuno et al. |
| 9,299,893 B2 | 3/2016 | Chen et al. |
| 9,300,111 B2 | 3/2016 | Lee et al. |
| 9,318,529 B2 | 4/2016 | Jang et al. |
| 9,324,765 B2 | 4/2016 | An |
| 9,337,175 B2 | 5/2016 | Seo et al. |
| 9,362,335 B2 | 6/2016 | von Malm |
| 9,362,337 B1 | 6/2016 | Wu et al. |
| 9,373,756 B2 | 6/2016 | Lee et al. |
| 9,653,643 B2 | 5/2017 | Bergmann et al. |
| 9,729,676 B2 | 8/2017 | Kobayashi et al. |
| 9,748,309 B2 | 8/2017 | von Malm |
| 9,754,926 B2 | 9/2017 | Donofrio et al. |
| 9,831,220 B2 | 11/2017 | Donofrio et al. |
| 10,317,787 B2 | 6/2019 | Graves et al. |
| 10,903,265 B2 | 1/2021 | Andrews et al. |
| 2003/0015959 A1 | 1/2003 | Tomoda et al. |
| 2005/0023550 A1 | 2/2005 | Eliashevich et al. |
| 2005/0253492 A1 | 11/2005 | Besshi et al. |
| 2006/0012588 A1 | 1/2006 | Shinohara |
| 2006/0281203 A1 | 12/2006 | Epler et al. |
| 2007/0001943 A1 | 1/2007 | Lee et al. |
| 2008/0055555 A1 | 3/2008 | Nakamura et al. |
| 2008/0179611 A1 | 7/2008 | Chitnis et al. |
| 2008/0211416 A1 | 9/2008 | Negley et al. |
| 2008/0290351 A1 | 11/2008 | Ajiki et al. |
| 2009/0052171 A1 | 2/2009 | Li |
| 2009/0179843 A1 | 7/2009 | Ackermann et al. |
| 2009/0241390 A1 | 10/2009 | Roberts |
| 2010/0015574 A1 | 1/2010 | Van der Zel et al. |
| 2010/0051785 A1 | 3/2010 | Dai et al. |
| 2010/0052574 A1 | 3/2010 | Blakely et al. |
| 2010/0123386 A1 | 5/2010 | Chen |
| 2010/0163887 A1 | 7/2010 | Kim et al. |
| 2010/0163900 A1 | 7/2010 | Seo et al. |
| 2010/0241255 A1 | 9/2010 | Benetz et al. |
| 2010/0296285 A1 | 11/2010 | Chemel et al. |
| 2011/0049545 A1 | 3/2011 | Basin et al. |
| 2011/0084294 A1 | 4/2011 | Yao |
| 2011/0121732 A1 | 5/2011 | Tsutsumi |
| 2011/0220934 A1 | 9/2011 | Gotoda et al. |
| 2011/0291143 A1 | 12/2011 | Kim et al. |
| 2011/0294240 A1 | 12/2011 | Kim |
| 2011/0297979 A1 | 12/2011 | Diana et al. |
| 2011/0301776 A1 | 12/2011 | Goyal et al. |
| 2012/0062135 A1 | 3/2012 | Tamaki et al. |
| 2012/0119237 A1 | 5/2012 | Leatherdale et al. |
| 2012/0130544 A1 | 5/2012 | Mohan et al. |
| 2012/0205634 A1 | 8/2012 | Ikeda et al. |
| 2012/0236582 A1 | 9/2012 | Waragaya et al. |
| 2012/0268042 A1 | 10/2012 | Shiobara et al. |
| 2013/0181617 A1 | 7/2013 | Maddox |
| 2013/0264592 A1 | 10/2013 | Bergmann et al. |
| 2014/0070245 A1 | 3/2014 | Haberern et al. |
| 2014/0110730 A1 | 4/2014 | Lee et al. |
| 2014/0361321 A1 | 12/2014 | Saito et al. |
| 2015/0049502 A1 | 2/2015 | Brandl et al. |
| 2015/0207045 A1 | 7/2015 | Wada et al. |
| 2015/0228876 A1 | 8/2015 | Place et al. |
| 2015/0262978 A1 | 9/2015 | Shibata |
| 2015/0279902 A1 | 10/2015 | Von Malm et al. |
| 2015/0295009 A1 | 10/2015 | Wang et al. |
| 2015/0311407 A1 | 10/2015 | Gootz et al. |
| 2015/0340346 A1 | 11/2015 | Chu et al. |
| 2015/0380622 A1 | 12/2015 | Miyoshi et al. |
| 2016/0150614 A1 | 5/2016 | Randolph |
| 2016/0163916 A1 | 6/2016 | Iiievski et al. |
| 2016/0240516 A1 | 8/2016 | Chang |
| 2016/0293811 A1 | 10/2016 | Hussell et al. |
| 2017/0062680 A1 | 3/2017 | Yoo et al. |
| 2017/0092820 A1 | 3/2017 | Kim et al. |
| 2017/0098746 A1 | 4/2017 | Bergmann et al. |
| 2017/0135177 A1 | 5/2017 | Wang et al. |
| 2017/0141280 A1 | 5/2017 | Zhong et al. |
| 2017/0148771 A1 | 5/2017 | Cha et al. |
| 2017/0207284 A1 | 7/2017 | Dykaar |
| 2017/0229431 A1 | 8/2017 | Bergmann et al. |
| 2017/0250164 A1 | 8/2017 | Takeya et al. |
| 2017/0271561 A1 | 9/2017 | Bergmann et al. |
| 2017/0287887 A1 | 10/2017 | Takeya et al. |
| 2017/0294417 A1* | 10/2017 | Edmond ............... H01L 33/502 |
| 2017/0294418 A1 | 10/2017 | Edmond et al. |
| 2017/0317251 A1 | 11/2017 | Sweegers et al. |
| 2017/0318636 A1 | 11/2017 | Kums |
| 2017/0358624 A1 | 12/2017 | Takeya et al. |
| 2018/0012949 A1 | 1/2018 | Takeya et al. |
| 2018/0076368 A1 | 3/2018 | Hussell |
| 2018/0145058 A1 | 5/2018 | Meitl et al. |
| 2018/0212108 A1 | 7/2018 | Leirer et al. |
| 2018/0359825 A1 | 12/2018 | Hussell |
| 2019/0044040 A1 | 2/2019 | Andrews |

(56) References Cited

U.S. PATENT DOCUMENTS

| | | | |
|---|---|---|---|
| 2020/0144460 A1 | 5/2020 | Onuma et al. | |
| 2021/0151422 A1 | 5/2021 | Iguchi et al. | |

FOREIGN PATENT DOCUMENTS

| | | | |
|---|---|---|---|
| CN | 103137803 A | | 6/2013 |
| CN | 105391499 A | * | 3/2016 |
| EP | 2197051 A2 | | 6/2010 |
| EP | 2296179 A2 | | 3/2011 |
| EP | 2320483 A1 | | 5/2011 |
| EP | 2325883 A2 | | 5/2011 |
| EP | 2393132 A2 | | 12/2011 |
| EP | 3076442 A1 | | 10/2016 |
| JP | 2006008956 A | | 1/2006 |
| JP | 2008262993 A | | 10/2008 |
| JP | 2009111098 A | | 5/2009 |
| JP | 2010087292 A | | 4/2010 |
| JP | 2013106048 A | | 5/2013 |
| JP | 2013179197 A | | 9/2013 |
| JP | 5788046 B2 | | 9/2015 |
| JP | 2015201473 A | | 11/2015 |
| JP | 2016072379 A | | 5/2016 |
| JP | 2019016821 A | | 1/2019 |
| KR | 100652133 A | | 11/2006 |
| KR | 1020130086109 B1 | | 3/2015 |
| WO | 2005062905 A2 | | 7/2005 |
| WO | 2008005508 A2 | | 1/2008 |
| WO | 2008062783 A1 | | 5/2008 |
| WO | 2011014490 A2 | | 2/2011 |
| WO | 2013154818 A1 | | 10/2013 |
| WO | 2015063077 A1 | | 5/2015 |
| WO | 2015135839 A1 | | 9/2015 |
| WO | 2016087542 A1 | | 6/2016 |
| WO | 2016188505 A1 | | 12/2016 |

OTHER PUBLICATIONS

Notice of Allowance and Examiner-Initiated Interview Summary for U.S. Appl. No. 17/078,733, dated Apr. 4, 2022, 9 pages.
Preliminary Examination Report for Taiwanese Patent Application No. 107127064, dated Mar. 10, 2022, 7 pages.
Invitation to Pay Additional Search Fees for European Patent Application No. 18762420.0, dated Feb. 11, 2022, 4 pages.
Notice of Allowance for Taiwanese Patent Application No. 107127064, dated Jun. 27, 2022, 3 pages.
First Office Action for Chinese Patent Application No. 2017800363223, dated Sep. 30, 2022, 20 page.
Office Action for Korean Patent Application No. 10-2020-7005916, dated Oct. 26, 2022, 19 pages.
Applicant-Initiated Interview Summary for U.S. Appl. No. 15/621,731, dated May 12, 2021, 2 pages.
Advisory Action for U.S. Appl. No. 15/621,731, dated May 28, 2021, 3 pages.
Notice of Allowance for U.S. Appl. No. 15/621,731, dated Jun. 18, 2021, 15 pages.
Examination Report for European Patent Application No. 17721889.8, dated Apr. 20, 2021, 7 pages.
Grant of Patent for Korean Patent Application No. 10-2018-7032540, dated May 21, 2021, 4 pages.
International Preliminary Report on Patentability for International Patent Application No. PCT/IB2019/060455, dated Jul. 1, 2021 10 pages.
Examiner-Initiated Interview Summary for U.S. Appl. No. 17/078,733, dated May 3, 2022, 3 pages.
Notice of Reasons for Rejection for Japanese Patent Application No. 2020-505841, dated Apr. 19, 2022, 9 pages.
Decision of Dismissal of Amendment for Japanese Patent Application No. 2018-553935, dated Apr. 26, 2022, 4 pages.
Decision of Refusal for Japanese Patent Application No. 2018-553935, dated Apr. 26, 2022, 2 pages.
Written Decision on Registration for Korean Patent Application No. 10-2021-7026409, dated Jun. 27, 2022, 4 pages.
Examination Report for European Patent Application No. 18762420.0, dated Apr. 19, 2022, 10 pages.
Carey, Julian, "New LED architectures and phosphor technologies lower costs and boost quality (Magazine)," LEDs Magazine, accessed Feb. 17, 2017, http://www.ledsmagazine.com/articles/print/volume-11/issue-7/features/manufacturing/new-led-architectures-and-phosphor-technologies-lower-costs-and-boost-quality.html, published Sep. 4, 2014, PennWell Corporation, 7 pages.
Chong, Wing et al., "1700 pixels per inch (PPI) Passive-Matrix Micro-LED Display Powered by ASIC," IEEE Compound Semiconductor Integrated Circuit Symposium (CSICs), Oct. 19-22, 2014, IEEE, 4 pages.
Dodel, Dr. Kerstin et al., "Capital Markets Day 2015," HELLA KGaA Hueck & Co, Dec. 2, 2015, London, HELLA, pp. 1-89.
Herrnsdorf, Johannes et al., "Active-Matrix GaN Micro Light-Emitting Diode Display With Unprecedented Brightness," IEEE Transactions on Electron Devices, vol. 62, Issue 6, Jun. 2015, IEEE, pp. 1918-1925.
Jiang, H. X. et al., "Nitride micro-LEDs and beyond—a decade progress review," Optics Express, vol. 21, Issue S3, Apr. 22, 2013, OSA, 10 pages.
Non-Final Office Action for U.S. Appl. No. 15/401,240, dated May 26, 2017, 7 pages.
Non-Final Office Action for U.S. Appl. No. 15/401,240, dated Jan. 17, 2018, 8 pages.
Invitation to Pay Additional Fees and Partial Search Report for International Patent Application No. PCT/US2017/026163, dated Aug. 1, 2017, 23 pages.
International Search Report and Written Opinion for International Patent Application No. PCT/US2017/026163, dated Oct. 25, 2017, 30 pages.
Author Unknown, "MBI5026: 16-bit Constant Current LED Sink Driver," Datasheet, Version 1.0, Mar. 2004, Hsinchu, Taiwan, www.DatasheetCatalog.com, Macroblock, Inc., pp. 1-15.
Non-Final Office Action for U.S. Appl. No. 15/399,729, dated Jan. 24, 2018, 12 pages.
Final Office Action for U.S. Appl. No. 15/399,729, dated Jun. 28, 2018, 9 pages.
Final Office Action for U.S. Appl. No. 15/401,240, dated Jun. 26, 2018, 11 pages.
Official Letter for Taiwanese Patent Application No. 106112033, dated Aug. 27, 2018, 19 pages.
Notice of Allowance for U.S. Appl. No. 15/399,729, dated Oct. 23, 2018, 8 pages.
Notice of Allowance for U.S. Appl. No. 15/401,240, dated Oct. 25, 2018, 7 pages.
International Preliminary Report on Patentability for International Patent Application No. PCT/US2017/026163, dated Oct. 25, 2018, 20 pages.
Invitation to Pay Additional Fees and Partial Search Report for International Patent Application No. PCT/US2018/045102, dated Oct. 30, 2018, 14 pages.
Quayle Action for U.S. Appl. No. 15/896,805, dated Jan. 10, 2019, 5 pages.
Non-Final Office Action for U.S. Appl. No. 15/621,731, dated Dec. 31, 2018, 43 pages.
International Search Report and Written Opinion for International Patent Application No. PCT/US2018/045102, dated Jan. 21, 2019, 23 pages.
Non-Final Office Action for U.S. Appl. No. 15/399,729, dated Mar. 27, 2019, 9 pages.
Notice of Allowance for U.S. Appl. No. 15/401,240, dated Apr. 1, 2019, 8 pages.
Final Office Action for U.S. Appl. No. 15/621,731, dated Jul. 11, 2019, 15 pages.
Non-Final Office Action for U.S. Appl. No. 16/053,980, dated Jun. 13, 2019, 7 pages.
Notice of Allowance for U.S. Appl. No. 15/896,805, dated Jun. 21, 2019, 8 pages.
Examination Report for European Patent Application No. 17721889.8, dated Apr. 26, 2019, 12 pages.

(56) References Cited

OTHER PUBLICATIONS

Non-Final Office Action for U.S. Appl. No. 16/414,162, dated Sep. 13, 2019, 11 pages.
Non-Final Office Action for U.S. Appl. No. 16/414,162, dated Dec. 23, 2019, 10 pages.
Final Office Action for U.S. Appl. No. 16/414,162, dated Jul. 15, 2020, 11 pages.
Notice of Allowance for U.S. Appl. No. 16/414,162, dated Sep. 23, 2020, 8 pages.
Advisory Action and AFCP 2.0 Decision for U.S. Appl. No. 15/621,731, dated Oct. 9, 2019, 4 pages.
Non-Final Office Action for U.S. Appl. No. 15/621,731, dated Dec. 30, 2019, 15 pages.
Non-Final Office Action for U.S. Appl. No. 15/621,731, dated Jul. 8, 2020, 15 pages.
Notice of Allowance for U.S. Appl. No. 16/053,980, dated Oct. 21, 2019, 9 pages.
Non-Final Office Action for U.S. Appl. No. 16/174,584, dated Oct. 21, 2019, 7 pages.
Notice of Allowance for U.S. Appl. No. 16/174,584, dated Mar. 23, 2020, 11 pages.
Notice of Allowance for U.S. Appl. No. 16/229,986, dated Sep. 24, 2020, 8 pages.
Quayle Action for U.S. Appl. No. 16/229,986, dated May 29, 2020, 6 pages.
Examination Report for European Patent Application No. 17721889.8, dated Dec. 13, 2019, 5 pages.
International Preliminary Report on Patentability for International Patent Application No. PCT/US2018/045102, dated Feb. 13, 2020, 15 pages.
International Search Report and Written Opinion for International Patent Application No. PCT/IB2019/060455, dated Feb. 7, 2020, 17 pages.
Notice of Allowance for U.S. Appl. No. 17/008,544, dated Sep. 29, 2020, 8 pages.
Notice of Reasons for Refusal for Japanese Patent Application No. 2018-553935, dated Nov. 24, 2020, 6 pages.
Office Action for Korean Patent Application No. 10-2018-7032540, dated Oct. 21, 2020, 23 pages.
Notice of Allowance for U.S. Appl. No. 16/950,142, dated Jan. 18, 2022, 9 pages.
Non-Final Office Action for U.S. Appl. No. 16/983,553, dated Nov. 24, 2021, 8 pages.
Notice of Reasons for Rejection for Japanese Patent Application No. 2018-553935, dated Jan. 5, 2022, 6 pages.
Office Action for Korean Patent Application No. 10-2021-7026409, dated Dec. 21, 2021, 4 pages.
Notice of Reasons for Refusal for Japanese Patent Application No. 2018-553935, dated Aug. 17, 2021, 8 pages.
Non-Final Office Action for U.S. Appl. No. 17/152,127, dated Oct. 5, 2022, 9 pages.
Intention to Grant for European Patent Application No. 17721889.8, dated Oct. 13, 2022, 8 pages.
Notice of Reasons for Rejection for Japanese Patent Application No. 2020-505841, dated Sep. 20, 2022, 6 pages.
Final Office Action for U.S. Appl. No. 15/621,731, dated Mar. 15, 2021, 17 pages.
Examination Report for European Patent Application No. 18762420.0, dated Jan. 28, 2021, 4 pages.
International Search Report and Written Opinion for International Patent Application No. PCT/US2020/057955, dated Feb. 12, 2021, 18 pages.
Non-Final Office Action for U.S. Appl. No. 17/740,982, dated Jan. 27, 2023, 6 pages.
Non-Final Office Action for U.S. Appl. No. 17/501,113, dated Mar. 7, 2023, 27 pages.
Notice of Allowance for U.S. Appl. No. 17/152,127, dated Jan. 26, 2023, 7 pages.
Notice of Allowance for U.S. Appl. No. 17/740,982, dated May 18, 2023, 8 pages.
First Office Action for Chinese Patent Application No. 2018800567102, dated Mar. 23, 2023, 16 pages.
Final Office Action for Korean Patent Application No. 10-2020-7005916, dated Apr. 12, 2023, 9 pages.
Notice of Allowance for U.S. Appl. No. 17/501,113, dated Jun. 28, 2023, 8 pages.
Second Office Action for Chinese Patent Application No. 2017800363223, dated May 9, 2023, 12 pages.
Examination Report for European Patent Application No. 19828829.2, dated Jun. 12, 2023, 7 pages.
Examination Report for European Patent Application No. 20812168.1, dated May 23, 2023, 10 pages.

* cited by examiner

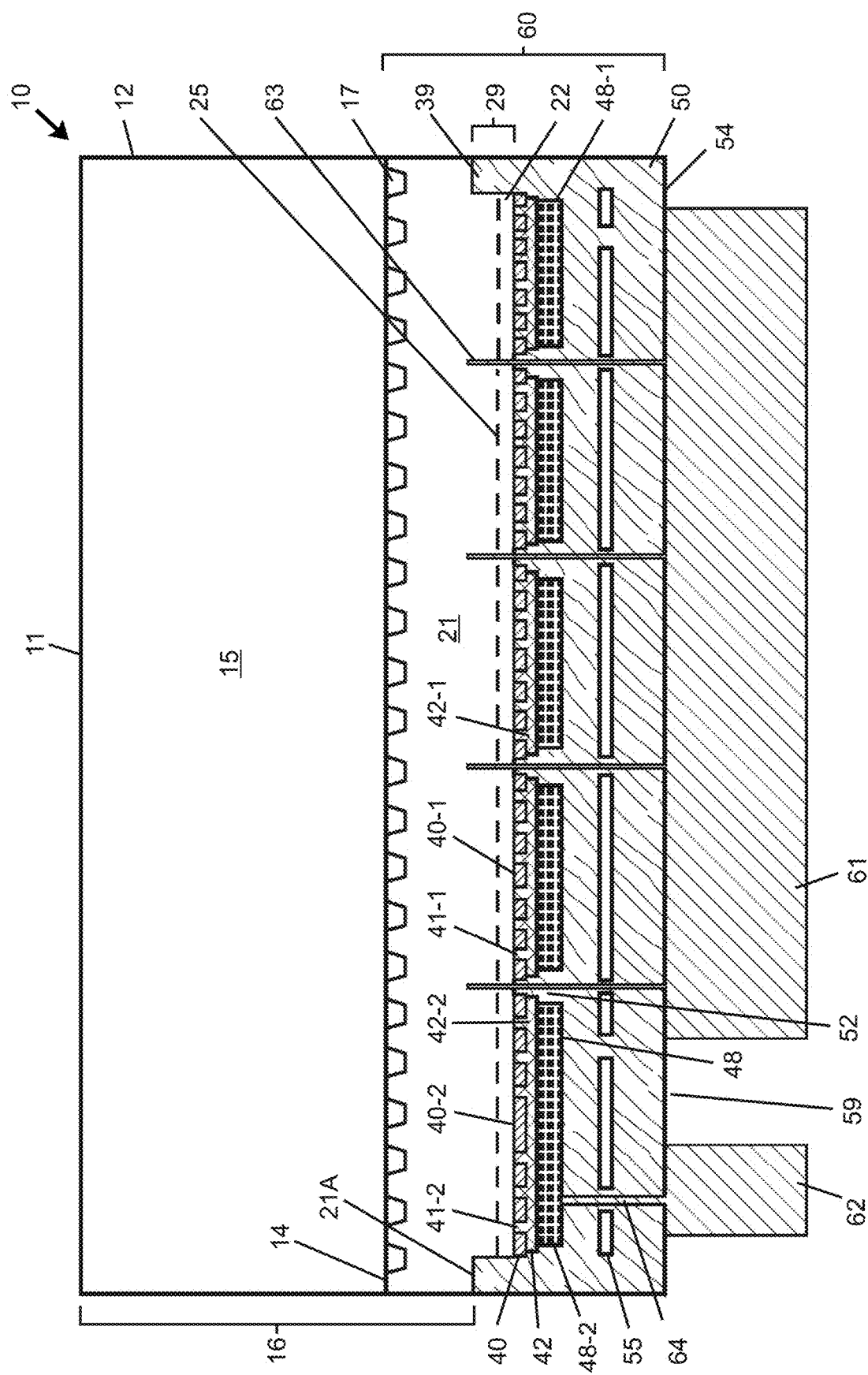
FIG._1

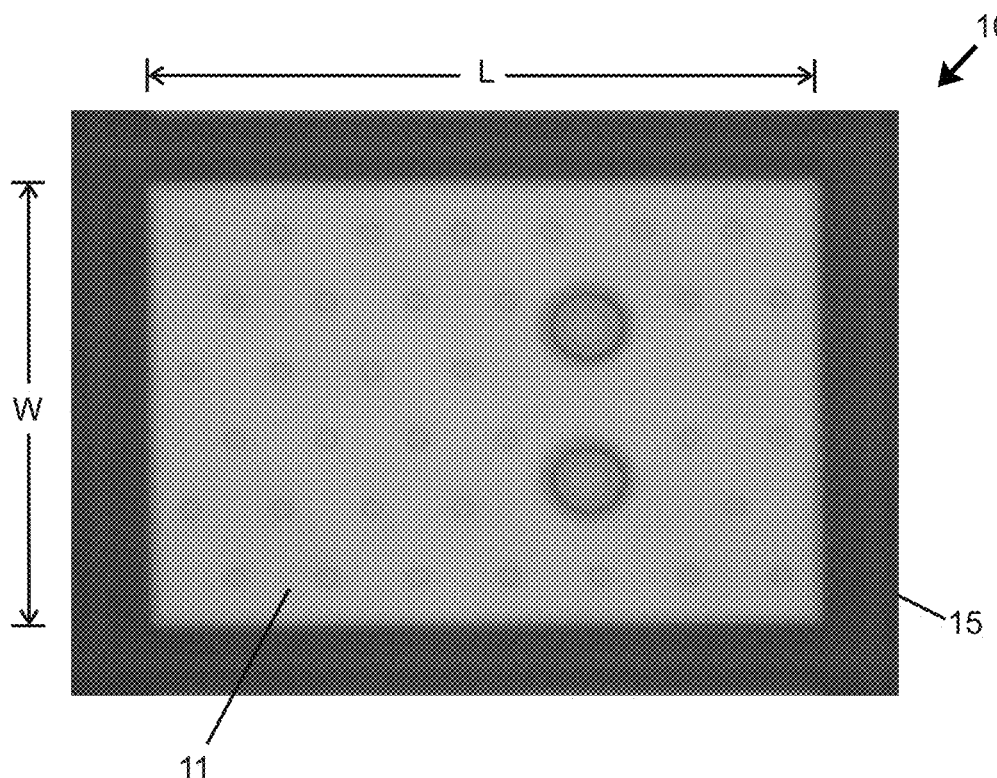
FIG._2A
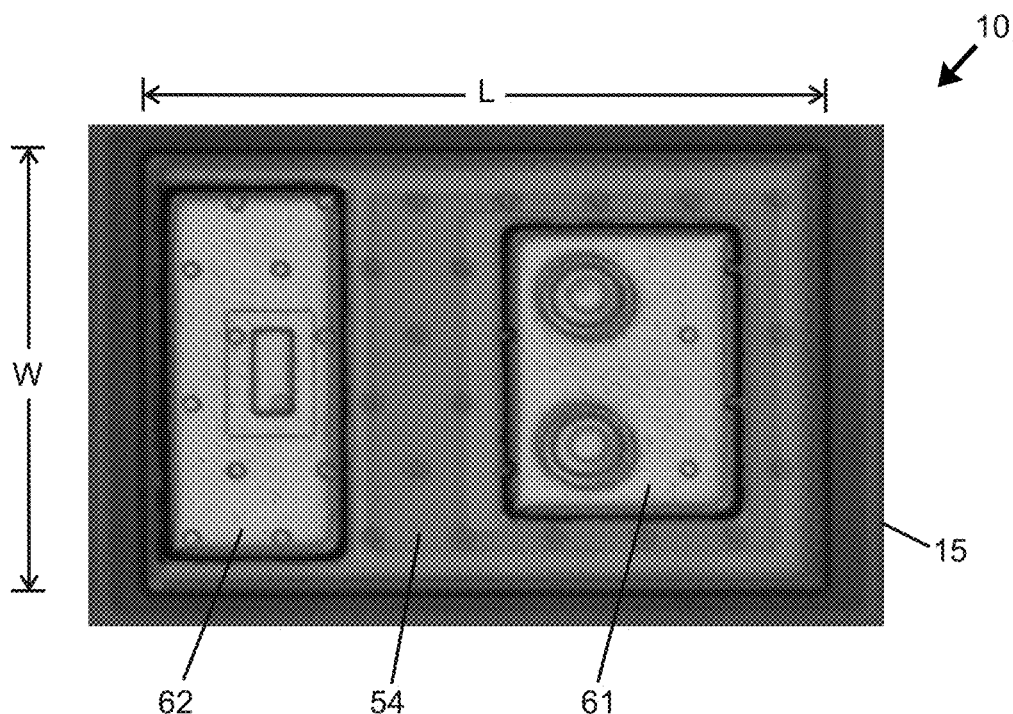
FIG._2B

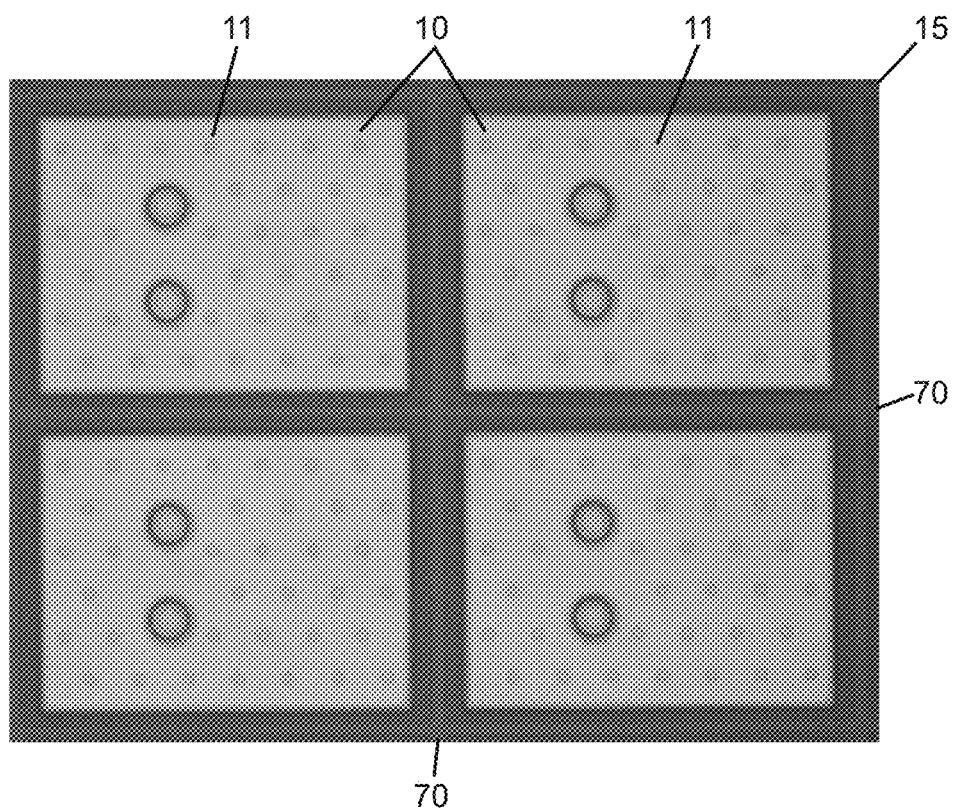
FIG._3A
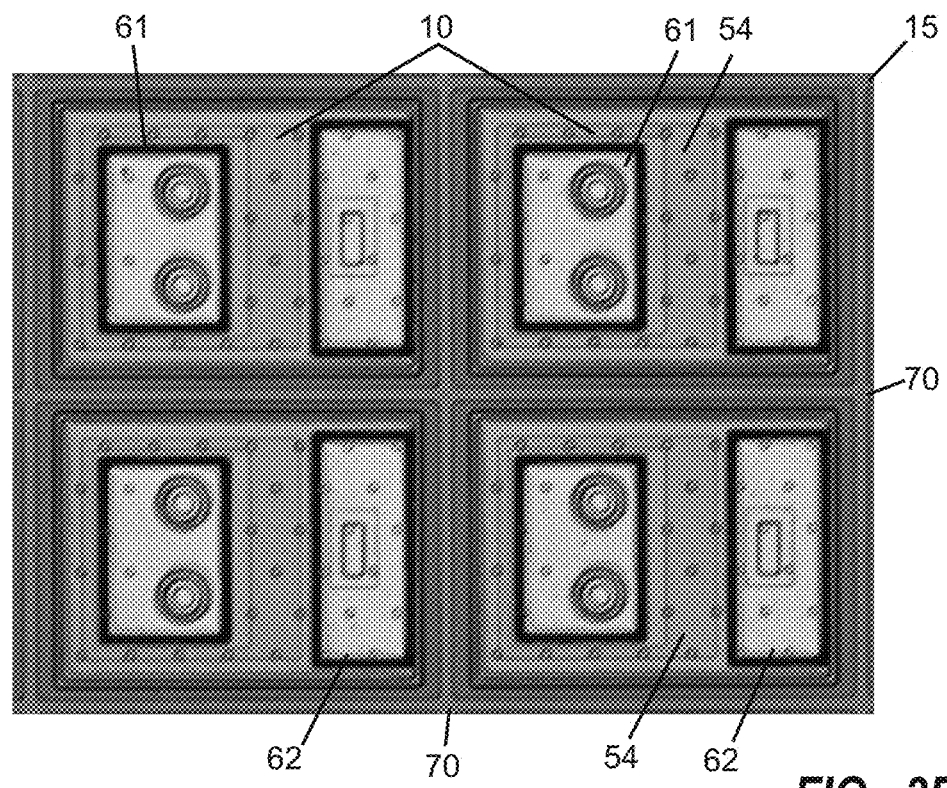
FIG._3B

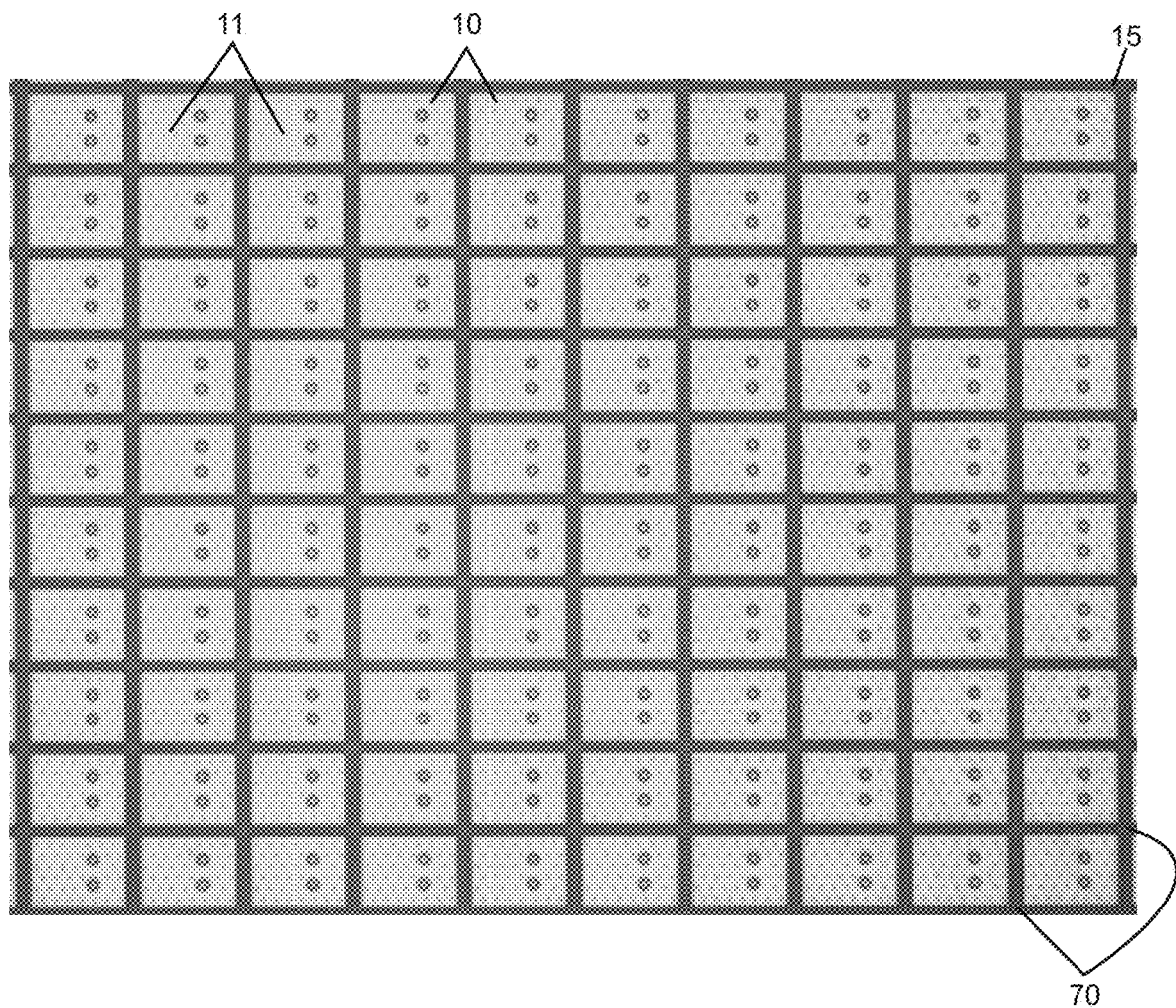
FIG._4A

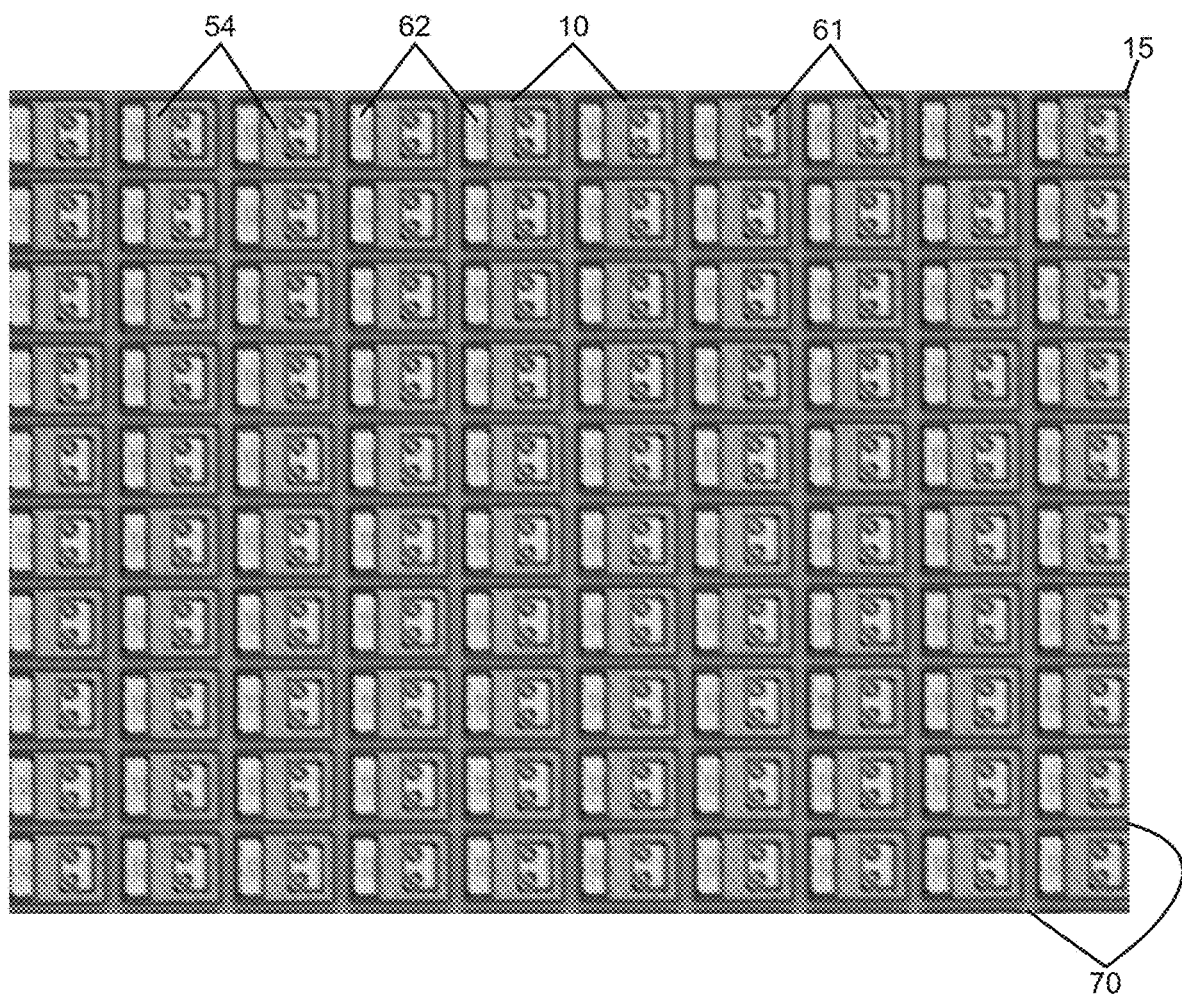
FIG._4B

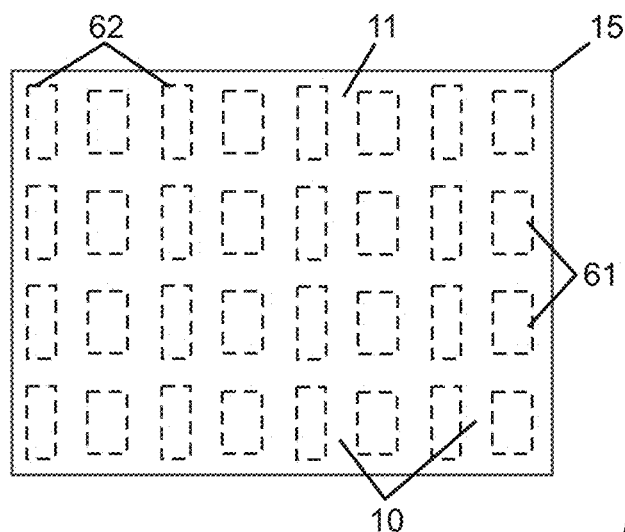
FIG. _5A
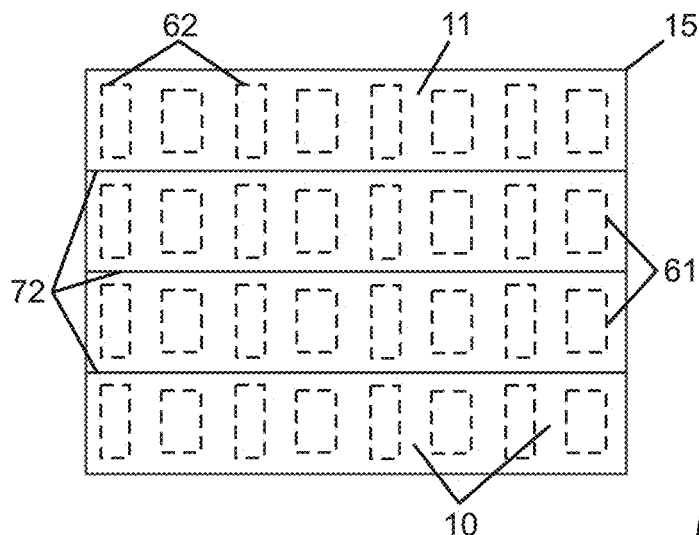
FIG. _5B
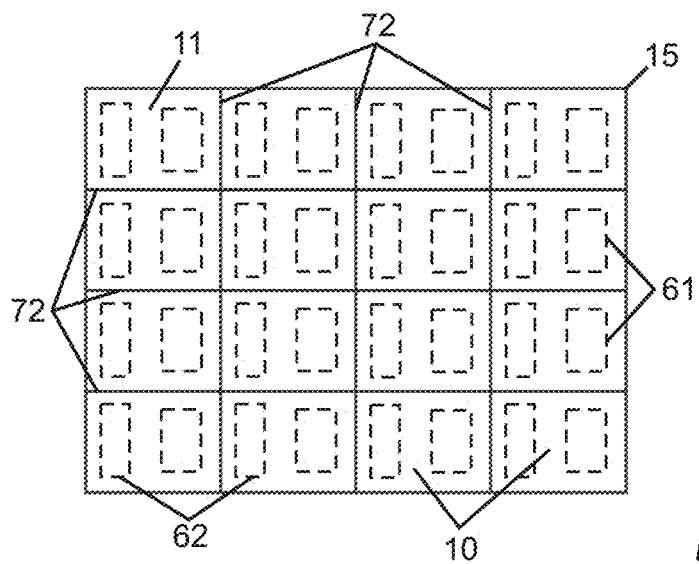
FIG. _5C

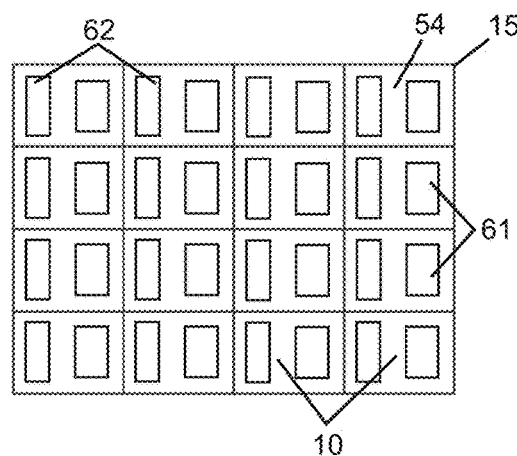
*FIG._6A*
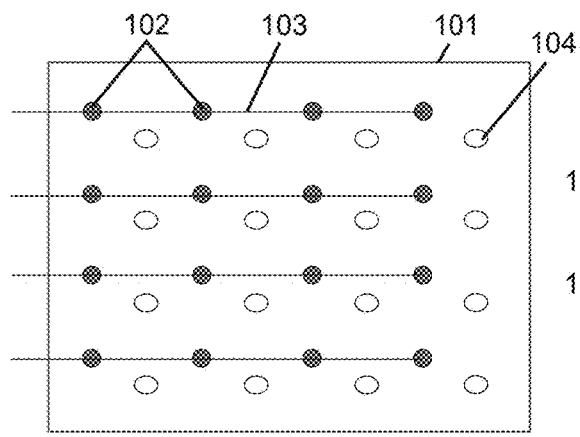
*FIG._6B*
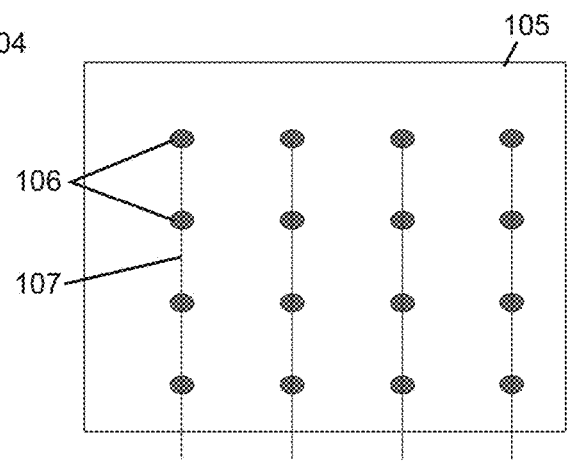
*FIG._6C*
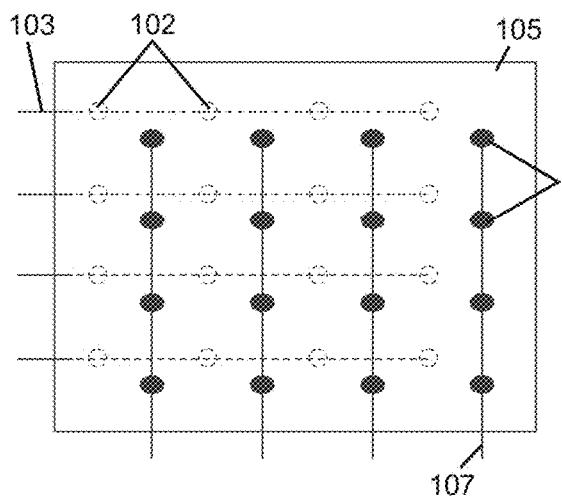
*FIG._6D*
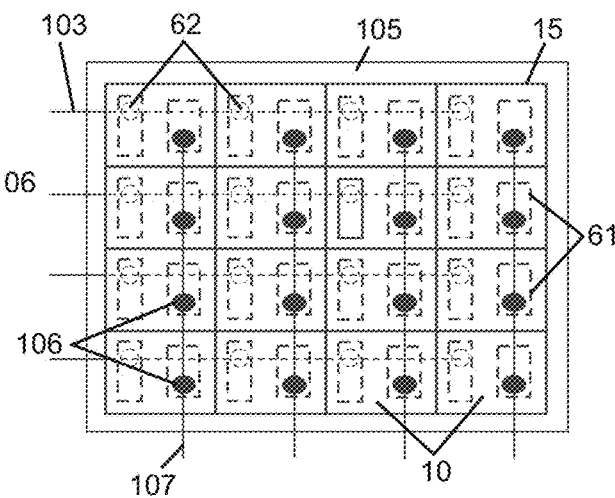
*FIG._6E*

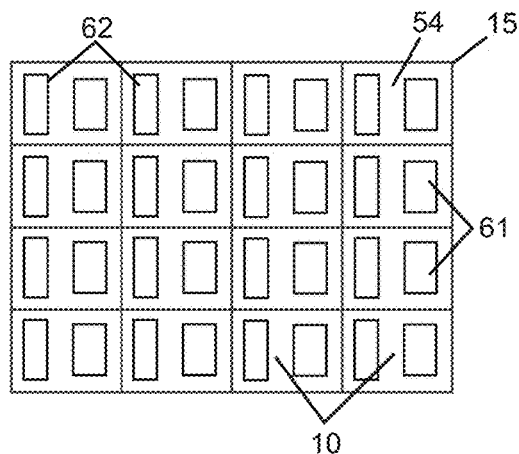
FIG._7A
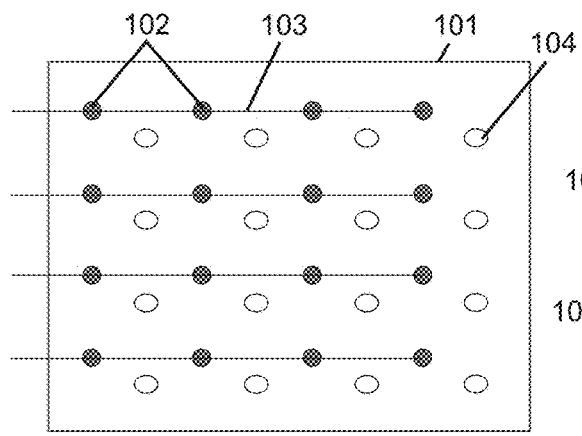
FIG._7B
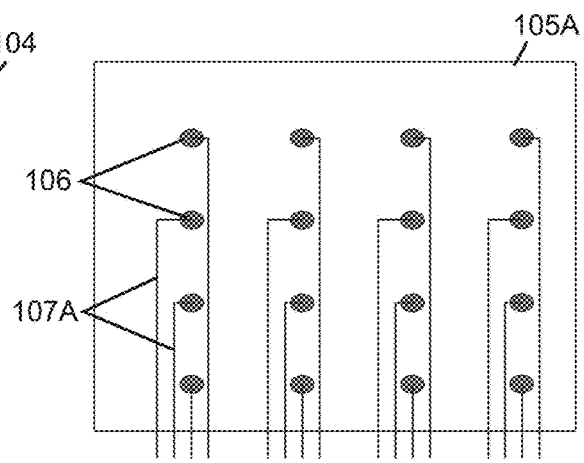
FIG._7C
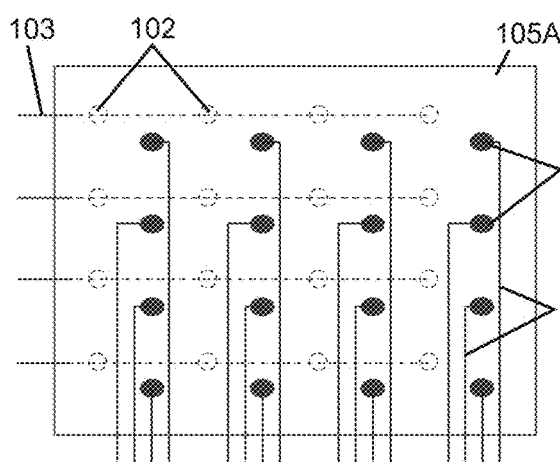
FIG._7D
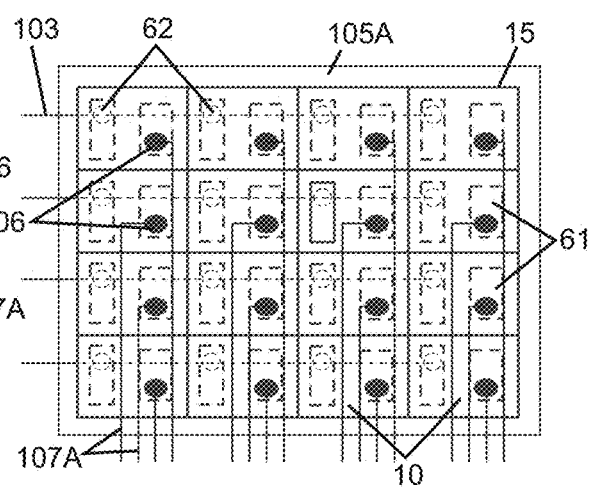
FIG._7E

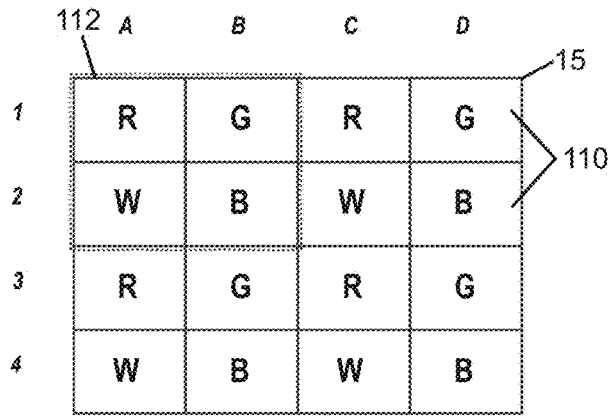
FIG._8A
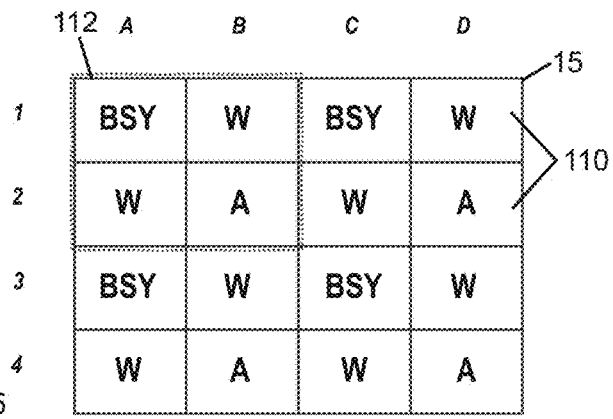
FIG._8C
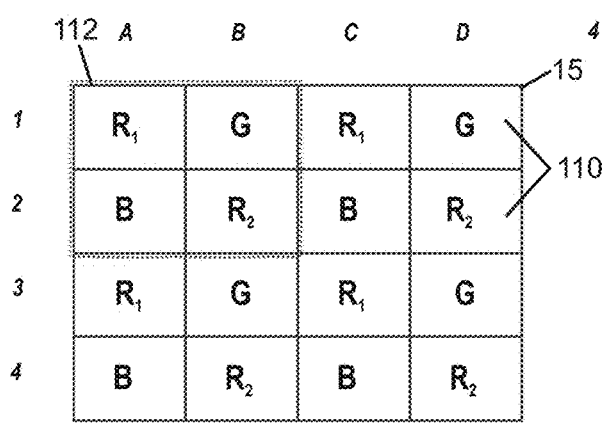
FIG._8B
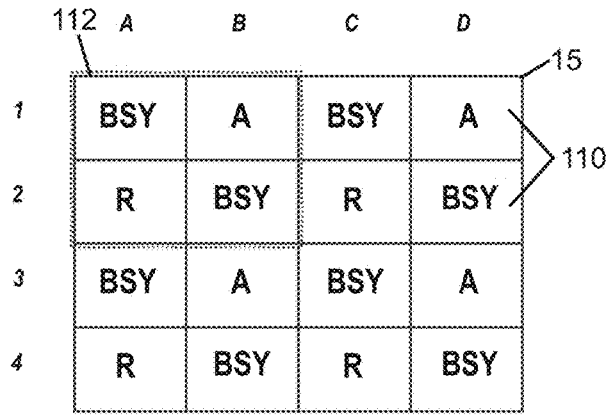
FIG._8D

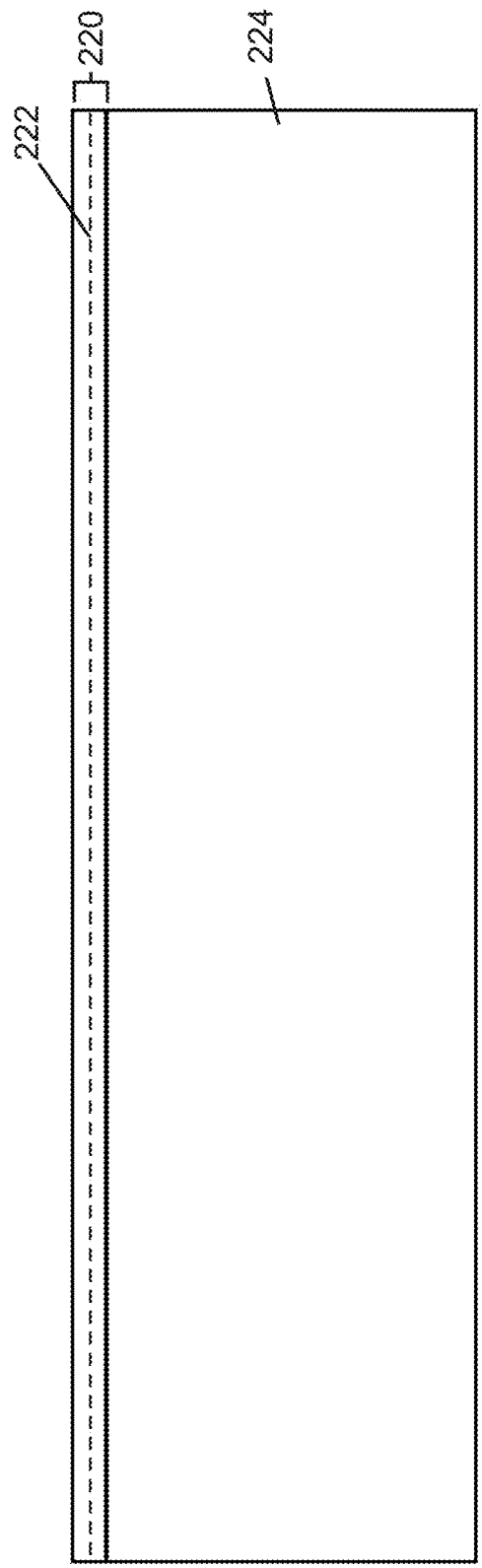
FIG._9A

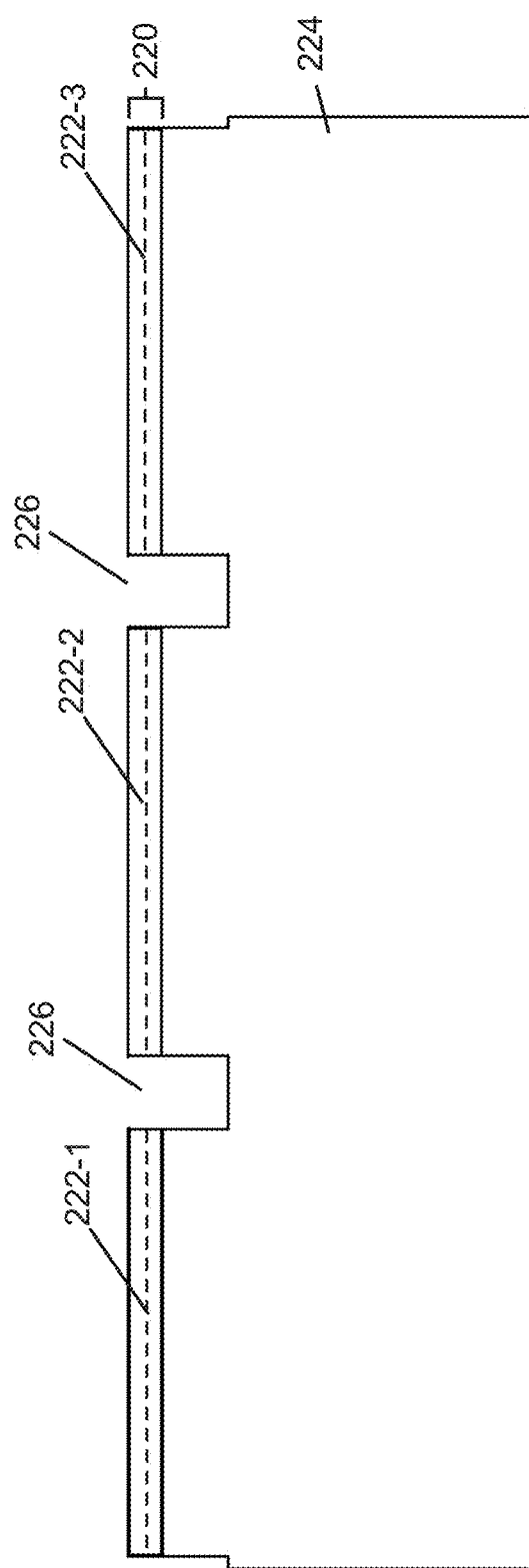
FIG._9B

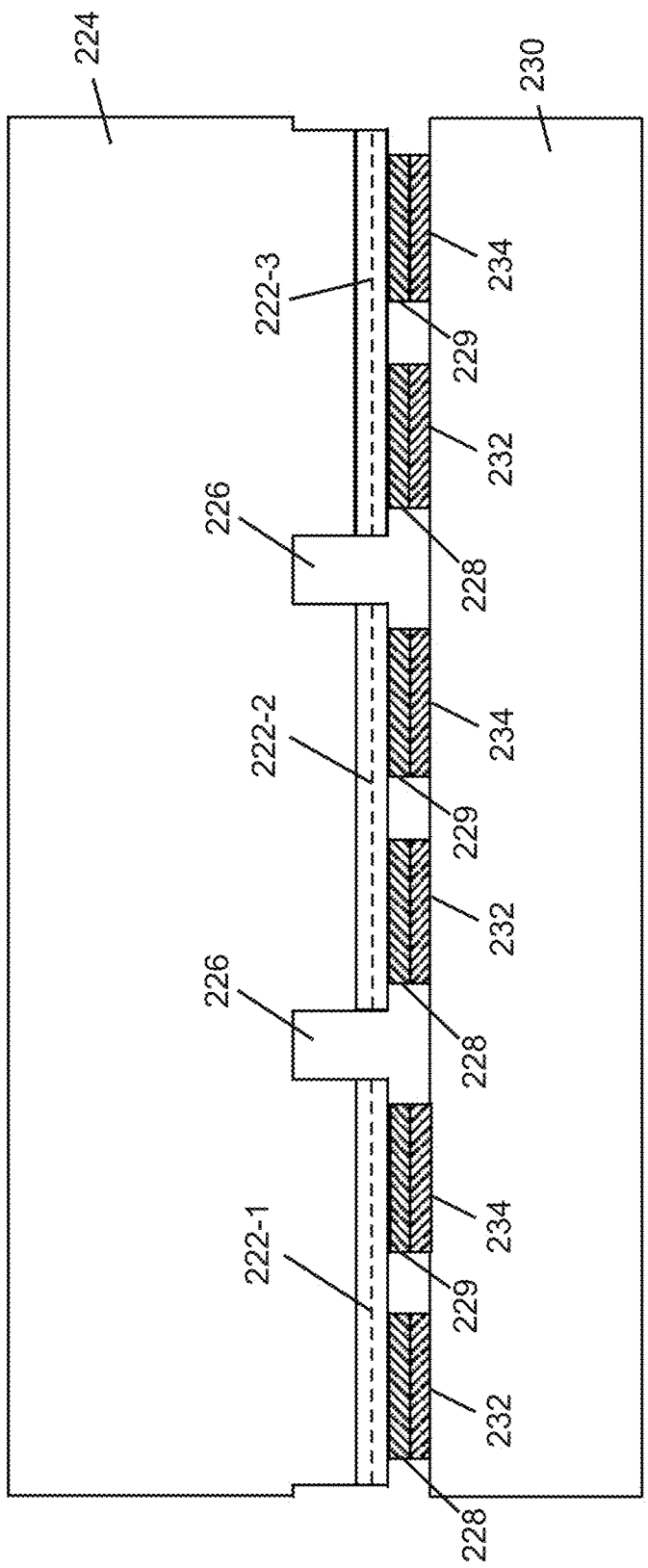
FIG._9E

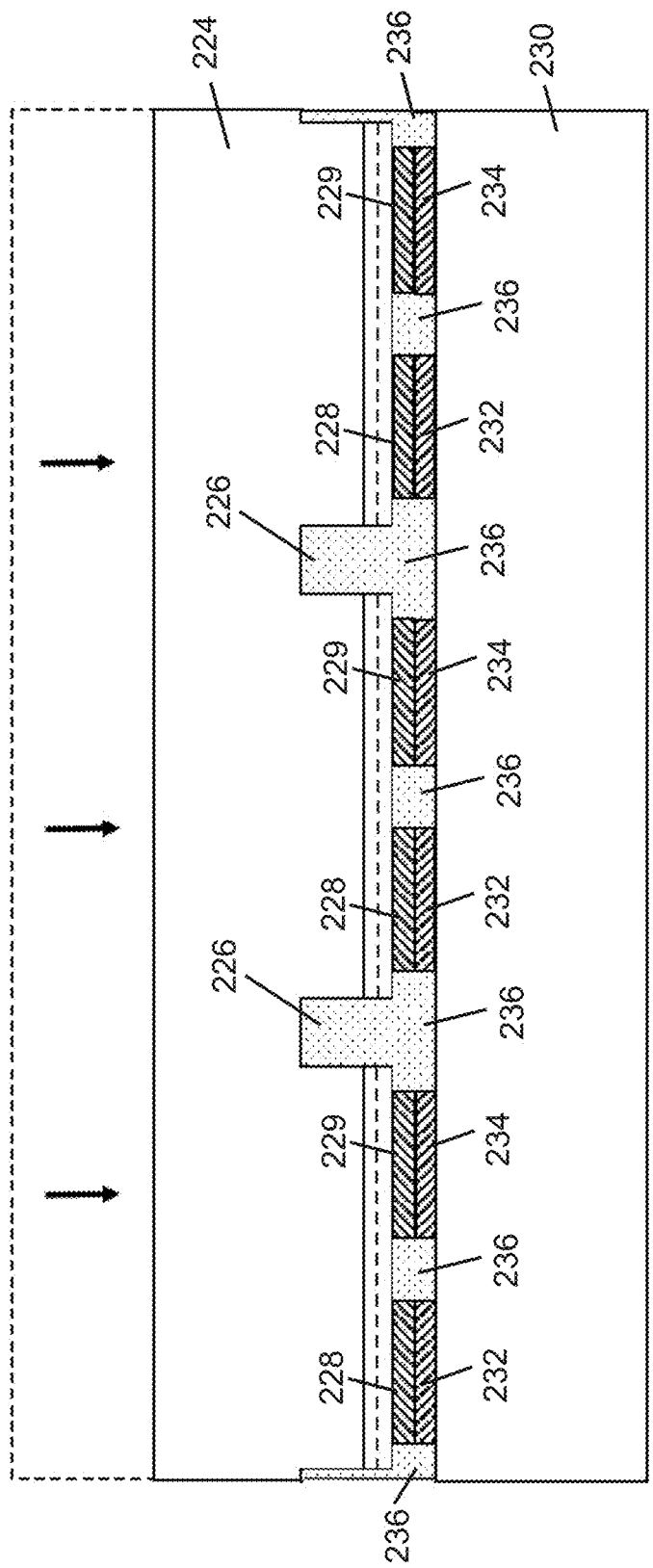
FIG._9G

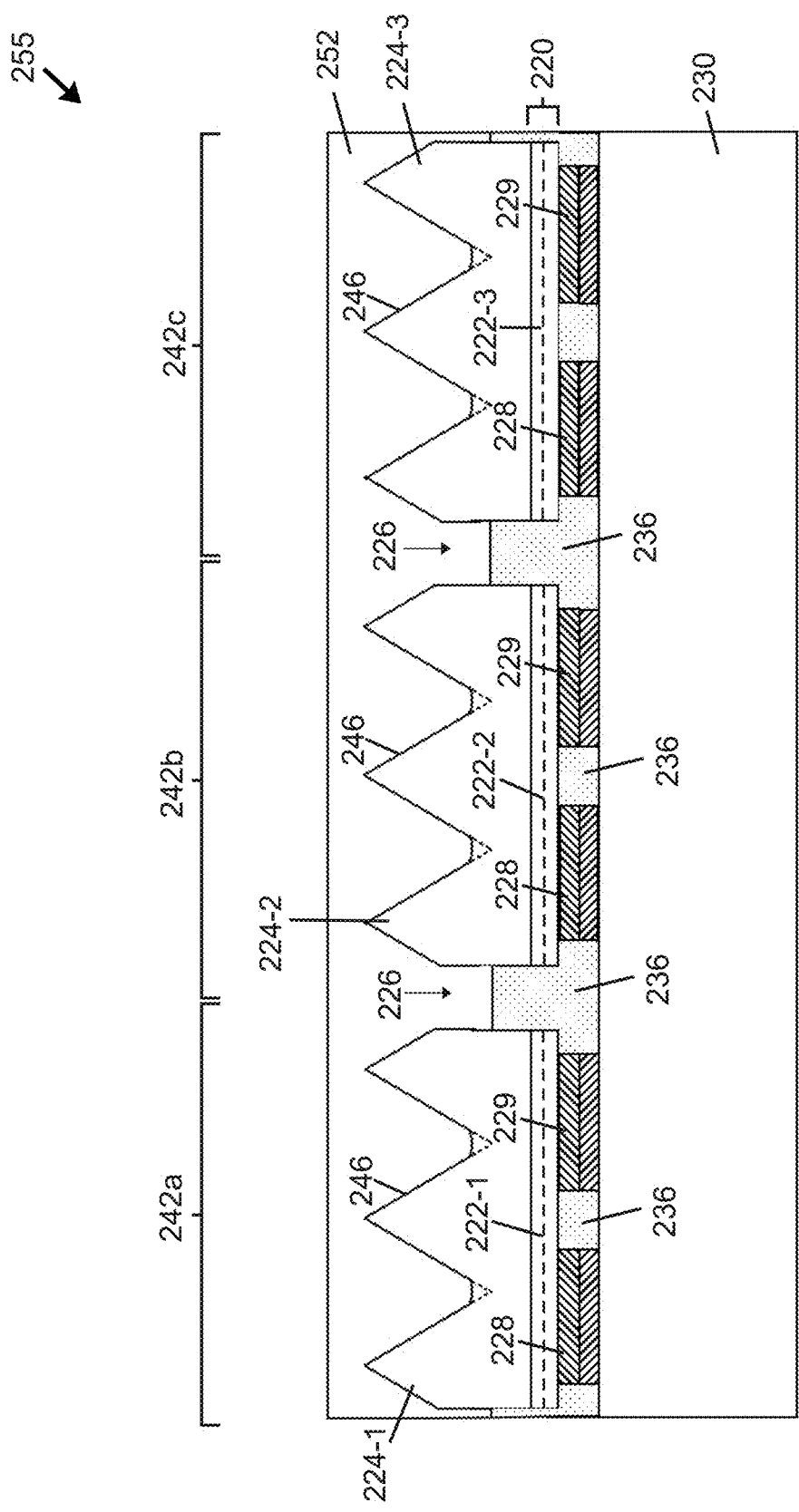
FIG._9I

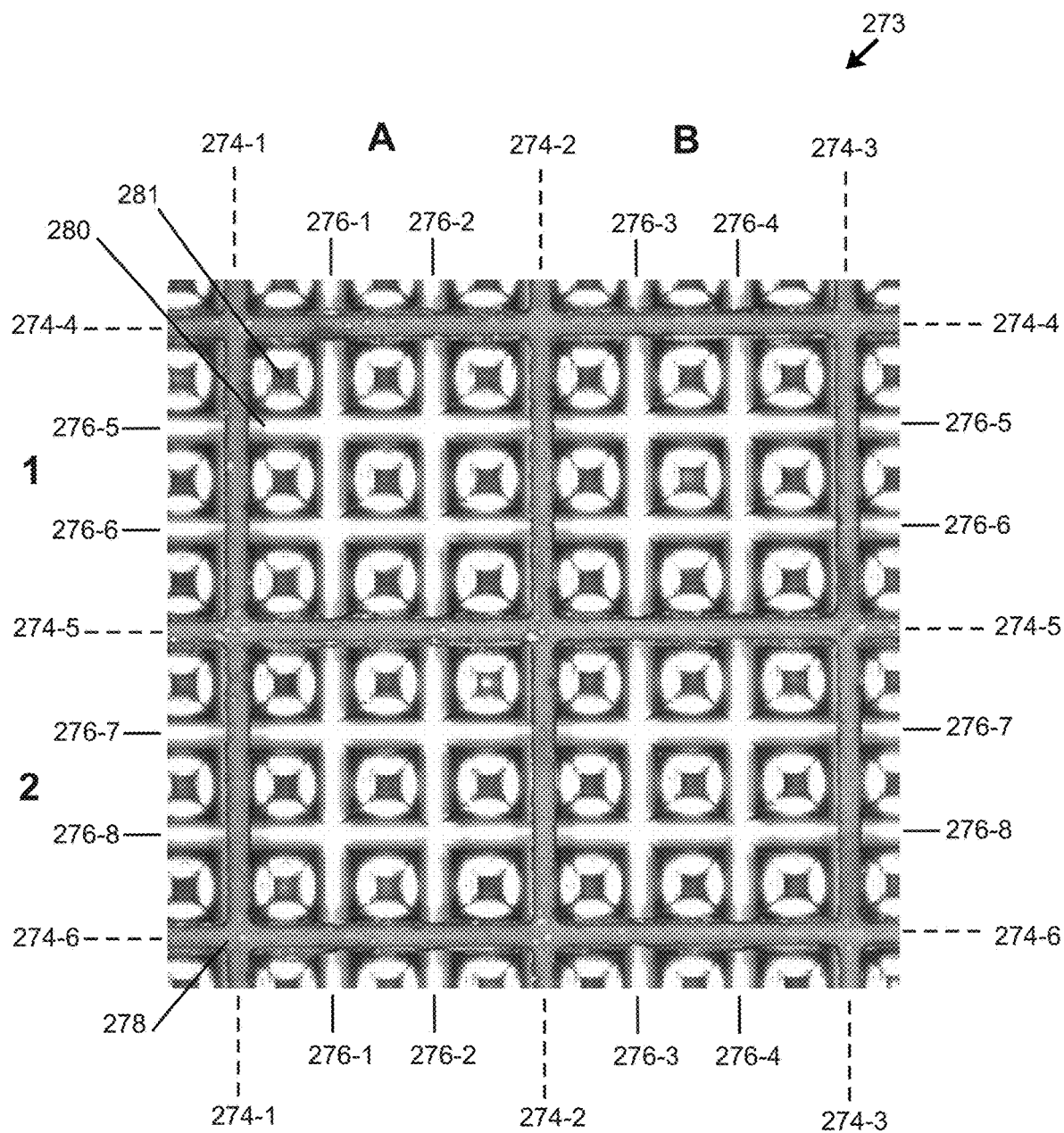
FIG._10

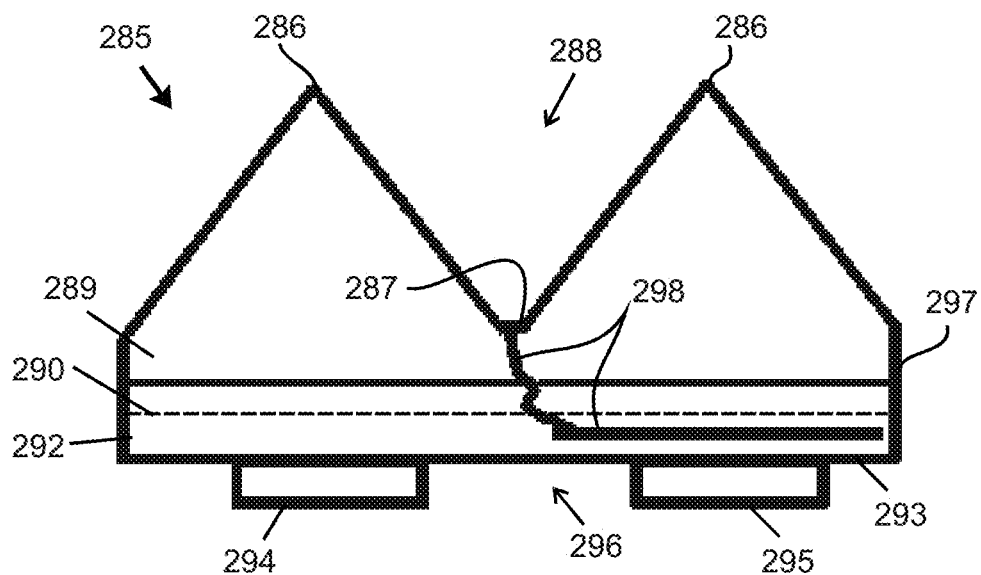
FIG._11
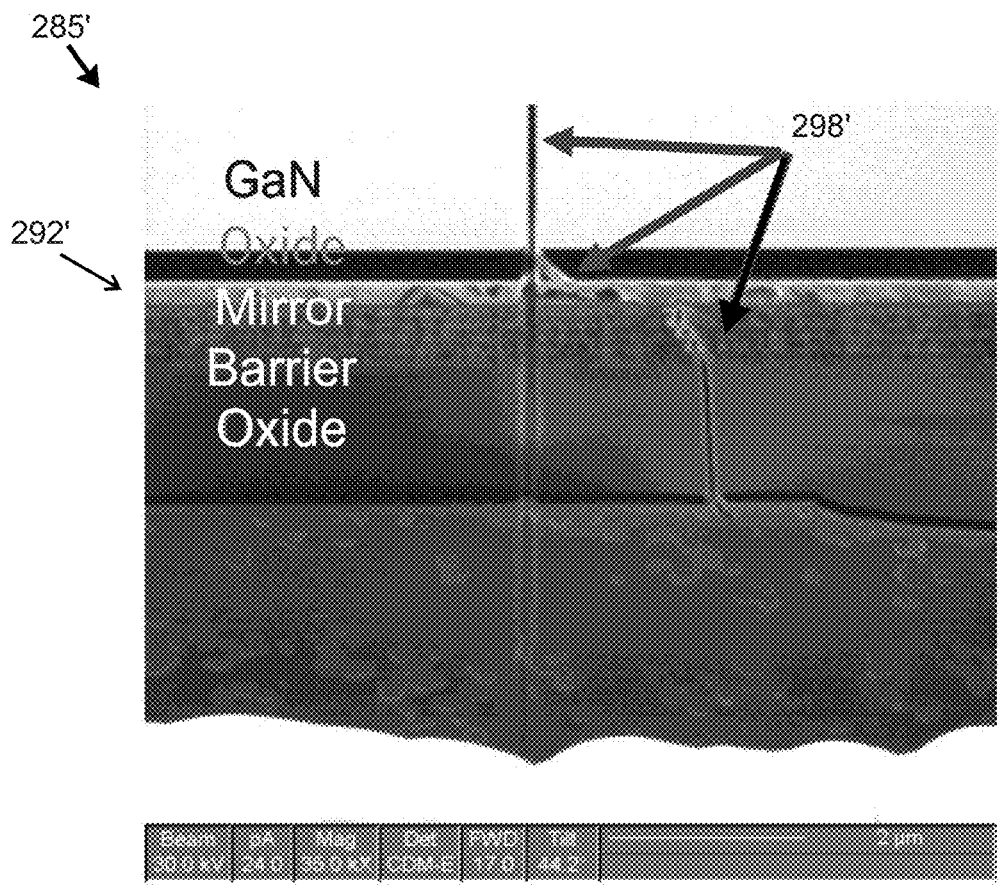
FIG._12

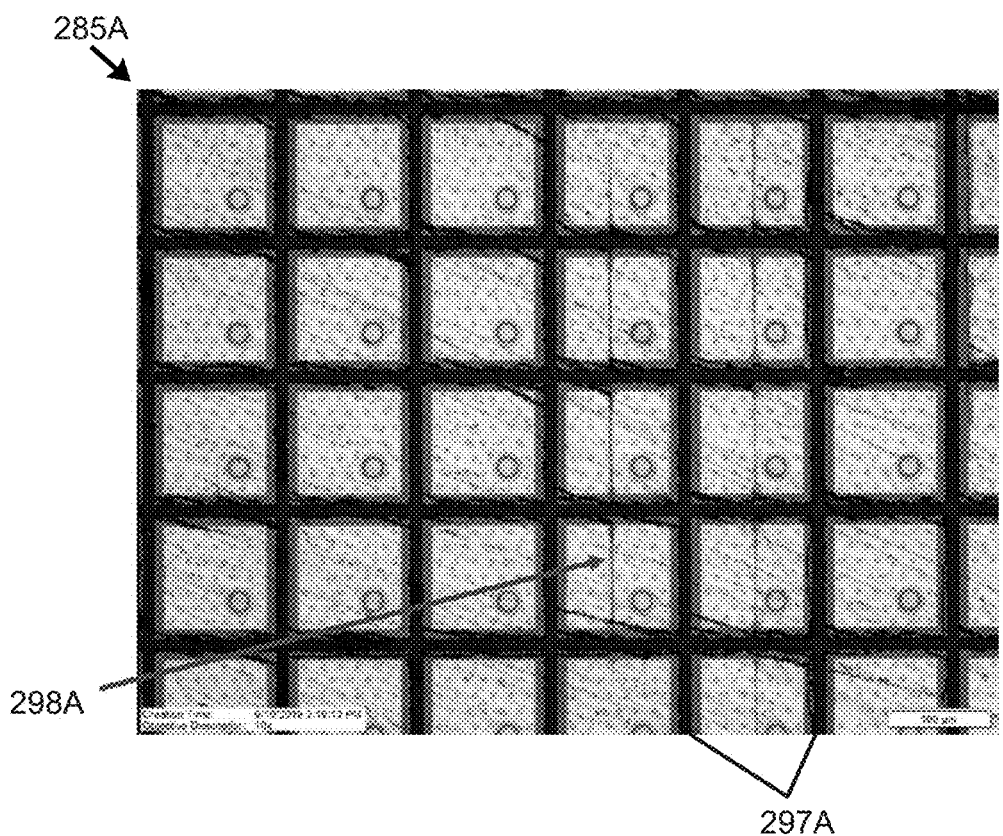
FIG._13
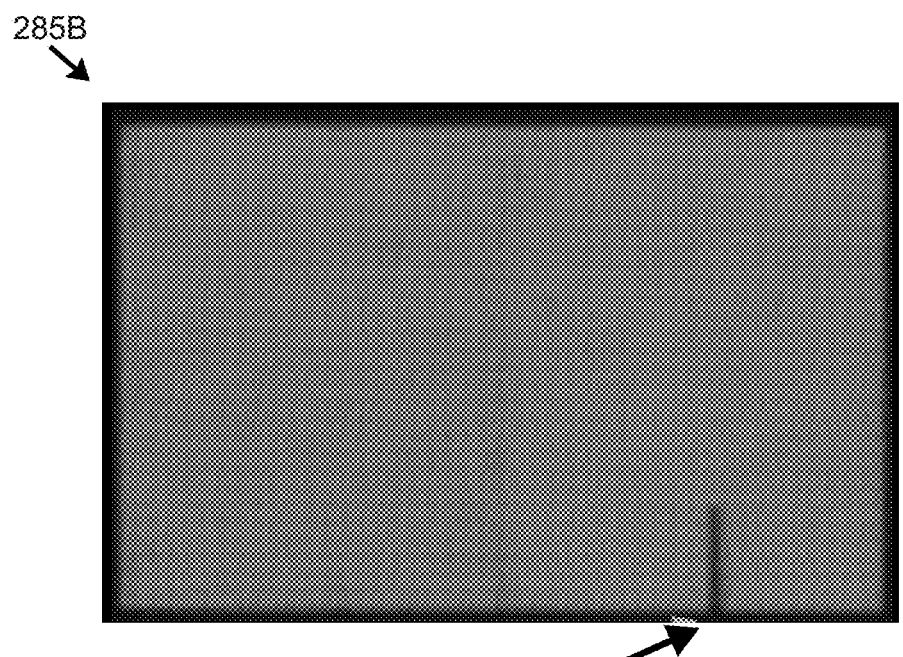
FIG._14

TEXTURING FOR HIGH DENSITY PIXELATED-LED CHIPS AND CHIP ARRAY DEVICES

CROSS-REFERENCE TO RELATED APPLICATION(S)

This application claims priority to U.S. Provisional Patent Application No. 62/927,504 filed on Oct. 29, 2019, wherein the entire contents of the foregoing application are hereby incorporated by reference herein.

TECHNICAL FIELD

Subject matter herein relates to solid state light-emitting devices, including light emitting diode (LED) array chips with textured surfaces and reduced interaction between emissions of adjacent emitters, devices incorporating one or more LED array chips, and LED displays and illumination apparatuses including such devices, as well as related fabrication methods

BACKGROUND

LEDs have been widely adopted in various illumination contexts, for backlighting of liquid crystal display (LCD) systems (e.g., as a substitute for cold cathode fluorescent lamps), and for sequentially illuminated LED displays. Applications utilizing LED arrays include automotive headlamps, roadway illumination, light fixtures, and various indoor, outdoor, and specialty contexts. Desirable characteristics of LED devices according to various end uses include high luminous efficacy, long lifetime, and wide color gamut.

Conventional color LCD display systems require color filters (e.g., red, green, and blue) that inherently reduce light utilization efficiency. Sequential illuminated LED displays, which utilize self-emitting LEDs and dispense with the need for backlights and color filters, provide enhanced light utilization efficiency.

Large format multi-color sequentially illuminated LED displays (including full color LED video screens) typically include numerous individual LED panels, packages, and/or components providing image resolution determined by the distance between adjacent pixels or "pixel pitch." Sequentially illuminated LED displays may include "RGB" three-color displays with arrayed red, green and blue LEDs, or "RG" two-color displays with arrayed red and green LEDs. Other colors and combinations of colors may be used. Large format displays (e.g., electronic billboards and stadium displays) intended for viewing from great distances typically have relatively large pixel pitches and usually include discrete LED arrays with multi-color (e.g., red, green, and blue) LEDs that may be independently operated to form what appears to a viewer to be a full color pixel. Medium-sized displays with relatively shorter viewing distances require shorter pixel pitches (e.g., 3 mm or less), and may include panels with arrayed red, green, and blue LED components mounted on a single electronic device attached to a driver printed circuit board (PCB) that controls the LEDs.

Various LED array applications, including (but not limited to) automotive headlamps, high resolution displays suitable for short viewing distances, and other lighting devices, may benefit from smaller pixel pitches; however, practical considerations have limited their implementation. Conventional pick-and-place techniques useful for mounting LED components and packages to PCBs may be difficult to implement in a reliable manner in high-density arrays with small pixel pitches. Additionally, due to the omnidirectional character of LED and phosphor emissions, it may be difficult to prevent emissions of one LED (e.g., a first pixel) from significantly overlapping emissions of another LED (e.g., a second pixel) of an array, which would impair the effective resolution of a LED array device. It may also be difficult to avoid non-illuminated or "dark" zones between adjacent LEDs (e.g., pixels) to improve homogeneity, particularly while simultaneously reducing crosstalk or light spilling between emissions of the adjacent LEDs. Moreover, conventional techniques for texturing light-transmitting substrates of highly pixelated LED chips having flip-chip configurations may lead to undesirable cracking of such chips.

The art continues to seek improved LED array devices with small pixel pitches while overcoming limitations associated with conventional devices and production methods.

SUMMARY

The present disclosure relates in various aspects to solid state light emitting devices including pixelated-LED chips, which include a plurality of independently electrically accessible active layer portions that form a plurality of pixels. A plurality of streets are defined through an active layer to segregate the active layer into active layer portions each having an associated anode-cathode pair. A light extraction surface of a light-transmissive substrate is textured to provide a plurality of protruding features and a plurality of light extraction surface recesses. In certain implementations, light extraction surface recesses are non-parallel to each street defined through the active layer. In certain implementations, each anode-cathode pair includes an anode and a cathode separated by an anode-cathode boundary, and each light extraction surface recess of the plurality of light extraction surface recesses is non-aligned with (e.g., non-parallel to) the anode/cathode boundary of each anode-cathode pair. Reducing or avoiding alignment between light extraction surface recesses (i.e., defined in a top surface of a chip) and spans or boundaries between anode-cathode pairs (i.e., arranged on a bottom surface of a chip) reduce a likelihood of cracking in portions of a pixelated-LED chip that may be due to mechanical processing, such as formation of the light extraction surface recesses, with such arrangement serving to reduce a likelihood of cracking in portions of a pixelated-LED chip, such as may result during formation of light extraction surface recesses by sawing. Methods for fabricating pixelated-LED chips and associated solid state light emitting devices are further provided.

In certain embodiments, various enhancements may beneficially provide increased contrast (i.e., reduced cross-talk between pixels) and/or promote inter-pixel illumination homogeneity, without unduly restricting light utilization efficiency. Other technical benefits may additionally or alternatively be achieved. Certain enhancements may also promote efficient manufacturability.

In one aspect of the disclosure, a pixelated-LED chip comprises: an active layer comprising a plurality of active layer portions, with a plurality of streets defined through the active layer and arranged to segregate individual active layer portions of the plurality of active layer portions; a plurality of substrate portions supporting the plurality of active layer portions, wherein each substrate portion comprises a light-transmissive material, a light injection surface, and a light extraction surface, wherein the light injection surface is arranged between the active layer and the light extraction surface; and a plurality of anode-cathode pairs associated with the plurality of active layer portions. Each active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels. Additionally, the light extraction surface of each substrate portion comprises a plurality of light extraction surface recesses, and each light extraction surface recess of the plurality of light extraction surface recesses is non-parallel to each street of the plurality of streets defined through the active layer.

In certain embodiments, the plurality of light extraction surface recesses forms a crossing pattern of light extraction surface recesses, and the plurality of streets form a crossing pattern of streets.

In certain embodiments, at least some light extraction surface recesses of the plurality of light extraction surface recesses extend in a direction that differs from a direction of at least some streets of the plurality of streets by an angle within a range of 10 to 80 degrees, by an angle within a range of 30 to 60 degrees, or by an angle within a range of 40 to 50 degrees, or by an angle of about 45 degrees.

In certain embodiments, each light extraction surface recess of the plurality of light extraction surface recesses extend in a direction that differs from a direction each street of the plurality of streets by an angle of 45 degrees or by an angle of 135 degrees.

In certain embodiments, the light extraction surface of each substrate portion further comprises a plurality of protruding features, and each protruding feature of the plurality of protruding features is separated from at least one other protruding feature by a light extraction surface recess of the plurality of light extraction surface recesses.

In certain embodiments, each protruding feature of the plurality of protruding features comprises a polyhedral or truncated polyhedral shape with a plurality of inclined lateral faces, and each inclined lateral face of the plurality of inclined lateral faces comprises an angle of inclination from vertical in a range of from about fifteen degrees to about forty-five degrees.

In certain embodiments, each protruding feature of the plurality of protruding features comprises a maximum width of from about one fifth to about one half of a maximum width of a pixel of the plurality of pixels with which each protruding feature is associated.

In certain embodiments, a pixelated-LED chip further comprises at least one lumiphoric material arranged on or over the plurality of protruding features, wherein the at least one lumiphoric material is configured to receive at least a portion of light emitted by the plurality of active layer portions and to responsively generate lumiphor emissions.

In certain embodiments, the at least one lumiphoric material is continuous on the plurality of pixels. In certain embodiments, the at least one lumiphoric material comprises a plurality of light segregation elements that are registered between pixels of the plurality of pixels. In certain embodiments, the plurality of light segregation elements comprises gaps or cuts in the at least one lumiphoric material. In certain embodiments, the plurality of light segregation elements comprises reflective material arranged in gaps or cuts defined in the at least one lumiphoric material.

In certain embodiments, lumiphoric material associated with at least one first pixel of the plurality of pixels differs with respect to at least one of (a) composition, (b) concentration, (c) particle size, or (d) distribution relative to lumiphoric material associated with at least one second pixel of the plurality of pixels.

In certain embodiments, the plurality of substrate portions comprises silicon carbide, and the plurality of active layer portions comprises at least one Group III nitride material.

In certain embodiments, a pixelated-LED chip further comprises an underfill material arranged between (i) lateral sidewalls of the plurality of pixels and (ii) between the anode and the cathode of each pixel of the plurality of pixels. In certain embodiments, the underfill material comprises a light-altering or a light-reflecting material. In certain embodiments, the light-altering or light-reflecting material comprises light-altering or light-reflecting particles suspended in a binder. In certain embodiments, the light-altering or light-reflecting particles comprise titanium dioxide particles and the binder comprises silicone.

In certain embodiments, the plurality of substrate portions comprises a plurality of discontinuous substrate portions.

In certain embodiments, pixelated-LED chip further comprises a plurality of light segregation elements that are registered between pixels of the plurality of pixels. In certain embodiments, the plurality of light segregation elements comprises reflective material regions that are registered between pixels of the plurality of pixels.

In another aspect of the disclosure, a method for fabricating a pixelated-LED chip comprises: defining a plurality of streets through an active layer on a substrate to form a plurality of active layer portions, wherein the substrate comprises (i) a light injection surface proximate to a plurality of active layer portions, and (ii) a light extraction surface generally opposing the light injection surface, wherein streets of the plurality of streets are defined through the light injection surface and arranged generally between the plurality of active layer portions, and the substrate includes a plurality of anode-cathode pairs in conductive electrical communication with the plurality of active layer portions; and defining a plurality of light extraction surface recesses in the substrate, wherein each light extraction surface recess of the plurality of light extraction surface recesses is non-parallel to each street of the plurality of streets defined through the active layer. Each active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels.

In certain embodiments, the plurality of light extraction surface recesses forms a crossing pattern of light extraction surface recesses, and the plurality of streets form a crossing pattern of streets.

In certain embodiments, the method further comprises mounting the substrate over a mounting surface before the defining of a plurality of light extraction surface recesses in the substrate.

In certain embodiments, the method further comprises applying an underfill material between the substrate and the mounting surface, between the plurality of anode-cathode pairs, and between the plurality of active layer portions before the thinning of the substrate.

In certain embodiments, the underfill material comprises at least one of an insulating material, light-altering suspended in a binder, or light-reflecting particles suspended in a binder.

In certain embodiments, the mounting surface includes a plurality of electrode pairs, and the mounting comprises establishing electrically conductive paths between the plurality of anode-cathode pairs and the plurality of electrode pairs.

In certain embodiments, the method further comprises planarizing the plurality of anode-cathode pairs prior to the mounting of the substrate over the mounting surface.

In certain embodiments, the method further comprises removing portions of the substrate through an entire thickness of the substrate along a plurality of regions registered with the plurality of streets to form a plurality of discontinuous substrate portions.

In certain embodiments, the defining of a plurality of light extraction surface recesses in the substrate comprises passing a saw blade across the substrate.

In certain embodiments, the method further comprises applying a first lumiphoric material to the light extraction surface. In certain embodiments, the method further comprises removing portions of the first lumiphoric material registered between pixels of the plurality of pixels to form a plurality of light segregation elements. In certain embodiments, the method further comprises applying reflective material into gaps provided by the removing of portions of the first lumiphoric material. In certain embodiments, the method further comprises applying a second lumiphoric material over the first lumiphoric material and the plurality of light segregation elements.

In certain embodiments, at least some light extraction surface recesses of the plurality of light extraction surface recesses extend in a direction that differs from a direction of at least some streets of the plurality of streets by an angle within a range of 10 to 80 degrees, by an angle within a range of 30 to 60 degrees, by an angle within a range of 40 to 50 degrees, or an angle of about 45 degrees.

In certain embodiments, each light extraction surface recess of the plurality of light extraction surface recesses extend in a direction that differs from a direction each street of the plurality of streets by an angle of 45 degrees or by an angle of 135 degrees.

In certain embodiments, the defining of the plurality of light extraction recesses defines a plurality of protruding features in which each protruding feature of the plurality of protruding features is separated from at least one other protruding feature by a light extraction surface recess of the plurality of light extraction surface recesses.

In certain embodiments, each protruding feature of the plurality of protruding features comprises a polyhedral or truncated polyhedral shape with a plurality of inclined lateral faces, and each inclined lateral face of the plurality of inclined lateral faces comprises an angle of inclination from vertical in a range of from about fifteen degrees to about forty-five degrees.

In certain embodiments, each protruding feature of the plurality of protruding features comprises a maximum width of from about one fifth to about one half of a maximum width of a pixel of the plurality of pixels with which each protruding feature is associated.

In certain embodiments, the plurality of substrate portions comprises silicon carbide, and the plurality of active layer portions comprises at least one Group III nitride material.

Another aspect of the disclosure relates to a pixelated-LED chip comprising: an active layer comprising a plurality of active layer portions, with a plurality of streets defined through the active layer and arranged to segregate individual active layer portions of the plurality of active layer portions; a plurality of substrate portions supporting the plurality of active layer portions, wherein each substrate portion comprises a light-transmissive material, a light injection surface, and a light extraction surface, wherein the light injection surface is arranged between the active layer and the light extraction surface; and a plurality of anode-cathode pairs associated with the plurality of active layer portions, wherein each anode-cathode pair includes an anode and a cathode separated by an anode/cathode boundary. Each active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels. Additionally, the light extraction surface of each substrate portion comprises a plurality of light extraction surface recesses, and each light extraction surface recess of the plurality of light extraction surface recesses is non-aligned with the anode/cathode boundary of each anode-cathode pair of the plurality of anode-cathode pairs.

In certain embodiments, each anode/cathode boundary comprises a curved shape or an angularly segmented shape.

In certain embodiments, the anode/cathode boundary of the at least some anode-cathode pairs of the plurality of anode-cathode pairs includes a segment that extends in a direction non-parallel to each light extraction surface recesses of the plurality of light extraction surface recesses.

In certain embodiments, the light extraction surface of each substrate portion further comprises a plurality of protruding features, and each protruding feature of the plurality of protruding features is separated from at least one other protruding feature by a light extraction surface recess of the plurality of light extraction surface recesses.

In certain embodiments, each protruding feature of the plurality of protruding features comprises a polyhedral or truncated polyhedral shape with a plurality of inclined lateral faces, and each inclined lateral face of the plurality of inclined lateral faces comprises an angle of inclination from vertical in a range of from about fifteen degrees to about forty-five degrees.

In certain embodiments, each protruding feature of the plurality of protruding features comprises a maximum width of from about one fifth to about one half of a maximum width of a pixel of the plurality of pixels with which each protruding feature is associated.

In certain embodiments, the pixelated-LED chip further comprises at least one lumiphoric material arranged on or over the plurality of protruding features, wherein the at least one lumiphoric material is configured to receive at least a portion of light emitted by the plurality of active layer portions and to responsively generate lumiphor emissions.

In certain embodiments, the at least one lumiphoric material is continuous on the plurality of pixels. In certain embodiments, the at least one lumiphoric material comprises a plurality of light segregation elements that are registered between pixels of the plurality of pixels.

In certain embodiments, the plurality of light segregation elements comprises gaps or cuts in the at least one lumiphoric material. In certain embodiments, the plurality of light segregation elements comprises reflective material arranged in gaps defined in the at least one lumiphoric material. In certain embodiments, lumiphoric material associated with at least one first pixel of the plurality of pixels differs with respect to at least one of (a) composition, (b) concentration, (c) particle size, or (d) distribution relative to lumiphoric material associated with at least one second pixel of the plurality of pixels.

In certain embodiments, the plurality of substrate portions comprises silicon carbide, and the plurality of active layer portions comprises at least one Group III nitride material.

In certain embodiments, a pixelated-LED chip further comprises an underfill material arranged between (i) lateral sidewalls of the plurality of pixels and (ii) between the anode and the cathode of each pixel of the plurality of pixels. In certain embodiments, the underfill material comprises a light-altering or a light-reflecting material. In certain embodiments, the light-altering or light-reflecting material comprises light-altering or light-reflecting particles suspended in a binder. In certain embodiments, the light-altering or light-reflecting particles comprise titanium dioxide particles and the binder comprises silicone.

In certain embodiments, the plurality of substrate portions comprises a plurality of discontinuous substrate portions.

In certain embodiments, a pixelated-LED chip further comprises a plurality of light segregation elements that are registered between pixels of the plurality of pixels. In certain embodiments, the plurality of light segregation elements comprises reflective material regions that are registered between pixels of the plurality of pixels.

In certain embodiments, a first group of light extraction surface recesses of the plurality of light extraction surface recesses is substantially parallel to a first group of streets of the plurality of streets defined through the active layer; and a second group of light extraction surface recesses of the plurality of light extraction surface recesses is substantially parallel to a second group of streets of the plurality of streets defined through the active layer.

Yet another aspect of the disclosure relates to a pixelated-LED chip comprising: an active layer comprising a plurality of active layer portions, with a plurality of streets defined through the active layer and arranged to segregate individual active layer portions of the plurality of active layer portions; a plurality of substrate portions supporting the plurality of active layer portions, wherein each substrate portion comprises a light-transmissive material, a light injection surface, and a light extraction surface, wherein the light injection surface is arranged between the active layer and the light extraction surface; and a plurality of anode-cathode pairs associated with the plurality of active layer portions, wherein each anode-cathode pair includes an anode and a cathode separated by an anode/cathode boundary. Each active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels. Additionally, the light extraction surface of each substrate portion comprises a plurality of light extraction surface recesses, and each light extraction surface recess of the plurality of light extraction surface recesses is non-parallel to the anode/cathode boundary of each anode-cathode pair of the plurality of anode-cathode pairs.

In certain embodiments, the anode/cathode boundary of each anode-cathode pair comprises a linear anode/cathode boundary.

In certain embodiments, the plurality of light extraction surface recesses forms a crossing pattern of light extraction surface recesses; and the linear anode/cathode boundary line for a first group of pixels of the plurality of pixels extends in a first direction, and the linear anode/cathode boundary line for a second group of pixels of the plurality of pixels extends in a second direction that intersects with the first direction. In certain embodiments, the second direction is substantially perpendicular to the first direction.

In certain embodiments, at least some light extraction surface recesses of the plurality of light extraction surface recesses extend in a direction that differs from at least one of the first direction or the second direction by an angle within a range of 10 to 80 degrees, by an angle within a range of 30 to 60 degrees, by an angle within a range of 40 to 50 degrees, or an angle of about 45 degrees. In certain embodiments, at least some light extraction surface recesses of the plurality of light extraction surface recesses extend in a direction that differs from the first direction by an angle of 45 degrees or 135 degrees, and that differs from the second direction by an angle of 45 degrees or 135 degrees.

In certain embodiments, the light extraction surface of each substrate portion further comprises a plurality of protruding features, and each protruding feature of the plurality of protruding features is separated from at least one other protruding feature by a light extraction surface recess of the plurality of light extraction surface recesses.

In certain embodiments, each protruding feature of the plurality of protruding features comprises a polyhedral or truncated polyhedral shape with a plurality of inclined lateral faces, and each inclined lateral face of the plurality of inclined lateral faces comprises an angle of inclination from vertical in a range of from about fifteen degrees to about forty-five degrees.

In certain embodiments, each protruding feature of the plurality of protruding features comprises a maximum width of from about one fifth to about one half of a maximum width of a pixel of the plurality of pixels with which each protruding feature is associated.

In certain embodiments, a pixelated-LED chip further comprises at least one lumiphoric material arranged on or over the plurality of protruding features, wherein the at least one lumiphoric material is configured to receive at least a portion of light emitted by the plurality of active layer portions and to responsively generate lumiphor emissions.

In certain embodiments, the at least one lumiphoric material is continuous on the plurality of pixels.

In certain embodiments, the at least one lumiphoric material comprises a plurality of light segregation elements that are registered between pixels of the plurality of pixels.

In certain embodiments, the plurality of light segregation elements comprises gaps or cuts in the at least one lumiphoric material. In certain embodiments, the plurality of light segregation elements comprises reflective material arranged in gaps or cuts defined in the at least one lumiphoric material.

In certain embodiments, lumiphoric material associated with at least one first pixel of the plurality of pixels differs with respect to at least one of (a) composition, (b) concentration, (c) particle size, or (d) distribution relative to lumiphoric material associated with at least one second pixel of the plurality of pixels.

In certain embodiments, the plurality of substrate portions comprises silicon carbide, and the plurality of active layer portions comprises at least one Group III nitride material.

In certain embodiments, a pixelated-LED chip further comprises an underfill material arranged between (i) lateral sidewalls of the plurality of pixels and (ii) between the anode and the cathode of each pixel of the plurality of pixels. In certain embodiments, the underfill material comprises a light-altering or a light-reflecting material. In certain embodiments, the light-altering or light-reflecting material comprises light-altering or light-reflecting particles suspended in a binder. In certain embodiments, the light-altering or light-reflecting particles comprise titanium dioxide particles and the binder comprises silicone.

In certain embodiments, the plurality of substrate portions comprises a plurality of discontinuous substrate portions.

In certain embodiments, a pixelated-LED chip further comprises a plurality of light segregation elements that are registered between pixels of the plurality of pixels. In certain embodiments, the plurality of light segregation elements comprises reflective material regions that are registered between pixels of the plurality of pixels.

In certain embodiments, a first group of light extraction surface recesses of the plurality of light extraction surface recesses is substantially parallel to a first group of streets of the plurality of streets defined through the active layer; and a second group of light extraction surface recesses of the plurality of light extraction surface recesses is substantially parallel to a second group of streets of the plurality of streets defined through the active layer.

In certain embodiments, lighting device incorporating a pixelated-LED chip as disclosed herein is configured to generate at least one image, such as by projecting the image on at least one surface. In certain embodiments, the at least one image includes at least one of alphanumeric characters, symbols, different colors, still images, and moving images such as videos.

In certain embodiments, individual pixels or subgroups of pixels of the plurality of pixels are configured to be selectively activated or deactivated to form the at least one image.

In certain embodiments, each pixel of the plurality of pixels is configured to be simultaneously activated or deactivated to provide general illumination.

In certain embodiments, the lighting device comprises an indoor lighting device including at least one of an area light, a downlight, a high-bay or low-bay lighting fixture, a suspended lighting fixture, a troffer, a wall-mounted or ceiling-mounted fixture, track lighting, a table or floor lamp, or a light bulb.

In certain embodiments, the lighting device comprises an outdoor lighting device including at least one of an area light, a street or roadway light fixture, a canopy light fixture, a soffit light fixture, a parking garage lighting fixture, flood lighting, and a wall-mounted or ceiling-mounted outdoor fixture.

In certain embodiments, the lighting device comprises a display backlight configured to provide localized dimming for a display screen.

In certain embodiments, the lighting device comprises a portable or hand-held lighting device including at least one of a flashlight, a personal computer, a tablet, a phone, or a watch.

In certain embodiments, any of the foregoing devices or device fabrication methods (or other devices and methods as disclosed herein) may be for non-automotive products and applications.

In certain embodiments, any of the foregoing devices or device fabrication methods (or other devices and methods as disclosed herein) may be for automotive products and applications.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

FIG. 1 is a side cross-sectional illustration of a single flip chip LED including a light-transmissive surface that is patterned proximate to semiconductor layers of the LED, including a multi-layer reflector proximate to the semiconductor layers, and including a passivation layer between the multi-layer reflector and electrical contacts of the LED, with the single LED being representative of flip chips useable in flip chip LED arrays according to embodiments of the present disclosure.

FIG. 2A is a plan view photograph of a flip chip LED, with a transparent substrate facing upward, useable in flip chip arrays according to embodiments of the present disclosure.

FIG. 2B is a plan view photograph of the flip chip LED of FIG. 2A, with electrodes facing upward.

FIG. 3A is a plan view photograph of a pixelated-LED chip including an array of four flip chip type LEDs on a single transparent substrate facing upward, useable in embodiments of the present disclosure.

FIG. 3B is a plan view photograph of the pixelated-LED chip of FIG. 3A, with electrodes facing upward.

FIG. 4A is a plan view photograph of a pixelated-LED chip including an array of one hundred flip chip LEDs on a single transparent substrate facing upward, useable in embodiments of the present disclosure.

FIG. 4B is a plan view photograph of the pixelated-LED chip of FIG. 4A, with electrodes facing upward.

FIGS. 5A-5C are plan view illustrations of a pixelated-LED chip including an array of sixteen flip chip LEDs on a single transparent substrate facing upward in various states of fabrication, to define grooves or recesses between flip chip LEDs to enable formation of light segregation elements extending from a light extraction surface into an interior of the substrate and to deposit a lumiphoric material on the light extraction surface, according to certain embodiments of the present disclosure.

FIG. 6A is a plan view illustration of a light emitting device (e.g., a pixelated-LED chip) including an array of sixteen flip chip LEDs on a single transparent substrate with electrodes facing upward.

FIG. 6B is a plan view illustration of a lower layer of an electrical interface for the light emitting device of FIG. 6A, with multiple horizontal string series connections each including multiple electrically conductive vias for coupling with anodes of the light emitting device, and with the lower layer further including openings permitting passage of conductive vias defined in an upper layer of the electrical interface.

FIG. 6C is a plan view illustration of an upper layer of an electrical interface for the light emitting device of FIG. 6A, with multiple vertical string series connections each including multiple electrically conductive vias for coupling with cathodes of the light emitting device.

FIG. 6D is a plan view illustration of the upper layer of FIG. 6C superimposed over the lower layer of FIG. 6B to form an electrical interface for the light emitting device of FIG. 6A.

FIG. 6E is a plan view illustration of the electrical interface of FIG. 6D coupled with the light emitting device of FIG. 6A.

FIG. 7A is a plan view illustration of a light emitting device (e.g., a pixelated-LED chip) including an array of sixteen flip chip LEDs on a single transparent substrate with electrodes facing upward.

FIG. 7B is a plan view illustration of a lower layer of an electrical interface for the light emitting device of FIG. 7A, with multiple horizontal string series connections each including multiple electrically conductive vias for coupling with anodes of the light emitting device, and with the lower layer further including openings permitting passage of conductive vias defined in an upper layer of the electrical interface.

FIG. 7C is a plan view illustration of an upper layer of an electrical interface for the light emitting device of FIG. 7A, with multiple vertically arranged parallel connections each including multiple electrically conductive vias for coupling with cathodes of the light emitting device.

FIG. 7D is a plan view illustration of the upper layer of FIG. 7C superimposed over the lower layer of FIG. 7B to form an electrical interface for the light emitting device of FIG. 7A.

FIG. 7E is a plan view illustration of the electrical interface of FIG. 7D coupled with the light emitting device of FIG. 7A, according to an embodiment of the present disclosure.

FIG. 8A is a plan view diagram of an LED light emitting device configured to produce a first combination of colors, according to an embodiment of the present disclosure.

FIG. 8B is a plan view diagram of an LED light emitting device configured to produce a second combination of colors, according to an embodiment of the present disclosure.

FIG. 8C is a plan view diagram of an LED light emitting device configured to produce a third combination of colors, according to an embodiment of the present disclosure.

FIG. 8D is a plan view diagram of an LED light emitting device configured to produce a fourth combination of colors, according to an embodiment of the present disclosure.

FIG. 9A-9I are schematic side cross-sectional views of a pixelated-LED chip in various states of fabrication, according to certain embodiments.

FIG. 10 is an upper perspective view photograph of a portion of a pixelated-LED chip including street-aligned cut lines defining a plurality of pixels with protruding features.

FIG. 11 is a side elevational schematic view of a portion of a pixelated-LED chip showing formation of a crack initiated in a substrate thereof, with the crack starting vertically above a gap between electrodes and propagating laterally into an epitaxial region.

FIG. 12 is a side cross-sectional SEM image of a portion of pixelated-LED chip showing a crack extending into epitaxial layers thereof.

FIG. 13 is a top plan view of a portion of a pixelated-LED chip in an inactive state showing cracks propagating laterally through multiple pixels.

FIG. 14 is a top plan view of a portion of a pixelated-LED chip in an active state, showing the operational effect of a crack in the pixelated-LED chip.

DETAILED DESCRIPTION

Figure 9C:
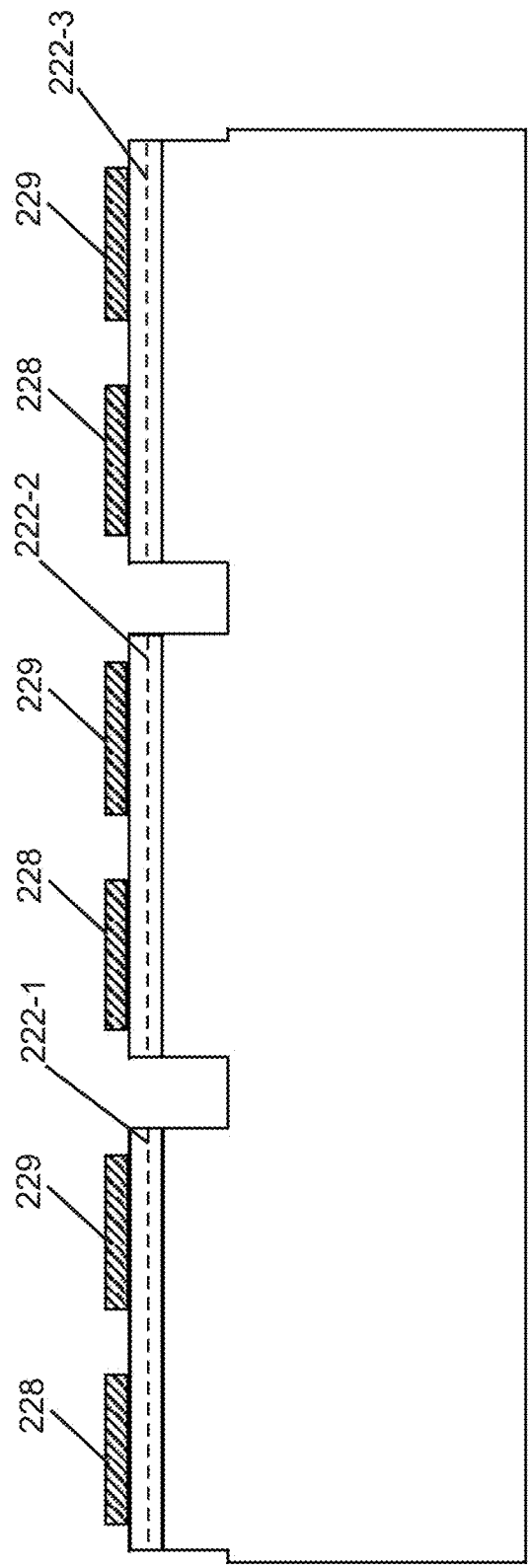

A pixelated-LED chip includes an active layer with active layer portions (segregated by streets) that are configured to illuminate different light-transmissive substrate portions to form pixels. A light extraction surface of each substrate portion includes protruding features and light extraction surface recesses (e.g., textured features), which may be formed by sawing. Certain implementations provide light extraction surface recesses that are non-parallel to each street defined through the active layer. Certain implementations provide light extraction surface recesses that are non-aligned with (e.g., non-parallel to) anode-cathode boundaries of each anode-cathode pair. Reducing or avoiding alignment between light extraction surface recesses (i.e., defined in a top surface of a chip) and spans or boundaries between anode-cathode pairs (i.e., arranged on a bottom surface of a chip) reduce a likelihood of cracking in portions of a pixelated-LED chip that may be due to mechanical processing, such as formation of the light extraction surface recesses.

As used herein, a "pixelated-LED chip" refers to an inorganic light emitting device or precursor thereof, in which a body or film comprising at least one layer or region made of a semiconductor material and being configured into sub-regions or pixels to emit visible light, infrared and/or ultraviolet light when a current is applied. The pixelated-LED chip may include an active layer that is segregated into a plurality of active layer portions such that each pixel comprises a different active layer portion. The pixelated-LED chip may also include a substrate that supports the active layer. The substrate may be segregated, either partially or entirely through a thickness of the substrate, into a plurality of substrate portions that support a different active layer portion in each pixel. Depending on the embodiment, the pixelated-LED chip may include lumiphoric materials, including phosphors or other conversion materials, and other physical optical structures that are integral with the pixelated-LED chip.

The embodiments set forth herein represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element, or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below," "above," "upper," "lower," "horizontal," or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, an "active layer" or an "active region" of a solid state light emitting device refers to the layer or region in which majority and minority electronic carriers (e.g., holes and electrons) recombine to produce light. In general, an active layer or region according to embodiments disclosed herein can include a double heterostructure or a well structure, such as a quantum well structure. An active layer or region can include multiple layers or regions, such as a multiple quantum well structure.

Solid state light emitting devices disclosed herein may include at least one solid state light source (e.g., a LED or a pixelated-LED chip) and one or more lumiphoric materials (also referred to herein as lumiphors) arranged to receive emissions of the at least one solid state light source. A lumiphoric material may include one or more of a phosphor, a scintillator, a lumiphoric ink, a quantum dot material, a day glow tape, or the like. In certain embodiments, a lumiphoric material may be in the form of one or more phosphors and/or quantum dots arranged in a binder such as silicone or glass, arranged in the form of a single crystalline plate or layer, a polycrystalline plate or layer, and/or a sintered plate. In certain embodiments, a lumiphoric material such as a phosphor may be spin coated or sprayed on a surface of a LED array or a pixelated-LED chip. In certain embodiments, a lumiphoric material may be located on a growth substrate, on epitaxial layers, and/or on a carrier substrate of a LED array or a pixelated-LED chip. If desired, multiple pixels including one or more lumiphoric materials may be manufactured in a single plate. In general, a solid state light source may generate light having a first peak wavelength. At least one lumiphor receiving at least a portion of the light generated by the solid state light source may re-emit light having a second peak wavelength that is different from the first peak wavelength. A solid state light source and one or more lumiphoric materials may be selected such that their combined output results in light with one or more desired characteristics such as color, color point, intensity, etc. In certain embodiments, aggregate emissions of one or more flip chip LEDs or pixels of a pixelated-LED chip, optionally in combination with one or more lumiphoric materials, may be arranged to provide cool white, neutral white, or warm white light, such as within a color temperature range of from 2500K to 10,000K. In certain embodiments, lumiphoric materials having cyan, green, amber, yellow, orange, and/or red peak wavelengths may be used. In certain embodiments, lumiphoric materials may be added to one or more emitting surfaces (e.g., top surface and one or more edge surfaces) by methods such as spray coating, dipping, liquid dispensation, powder coating, inkjet printing, or the like. In certain embodiments, lumiphoric material may be dispersed in an encapsulant, adhesive, or other binding medium.

In certain embodiments, photolithographic patterning or other stencil-type patterning may be used to permit different lumiphoric materials to be applied on or over different pixels associated with a substrate to provide lumiphoric material and/or scattering material that differs in (a) composition, (b) concentration, (c) particle size, or (d) distribution with respect to different pixels.

In certain embodiments, a scattering material may be added over or incorporated into a lumiphoric material. The scattering material may include scattering particles arranged in a binder, such as silicone. The scattering particles affect total internal reflection (TIR) of light to promote scattering and mixing of light that interacts with the scattering material. The scattering particles may include fused silica, fumed silica, or particles of titanium dioxide (TiO2), among others. In some embodiments, the scattering material includes a layer of scattering particles suspended in a binder that is applied on the lumiphoric material. In other embodiments, the scattering particles may be included within the lumiphoric material such that the lumiphoric material comprises lumiphoric particles and scattering particles suspended in the same binder.

As used herein, a layer or region of a light emitting device may be considered to be "transparent" when at least 70% of emitted radiation that impinges on the layer or region emerges through the layer or region. For example, in the context of LEDs configured to emit visible light, suitably pure crystalline substrate materials of silicon carbide or sapphire may be considered transparent. Moreover, as used herein, a layer or region of an LED is considered to be "reflective" or embody a "reflector" when at least 70% of the angle averaged emitted radiation that impinges on the layer or region is reflected. In some embodiments, an LED is considered to be "reflective" or embody a "reflector" when at least 90% of the angle averaged emitted radiation that impinges on the layer or region is reflected. For example, in the context of gallium nitride (GaN)-based blue and/or green LEDs, silver (for example, at least 70% reflective, or at least 90% reflective) may be considered a reflective or reflecting material. In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

Certain embodiments disclosed herein relate to the use of flip chip LED devices or flip-chip pixelated-LED chips in which a light-transmissive substrate represents the exposed light emitting surface. In certain embodiments, the light-transmissive substrate embodies or includes a LED growth substrate, wherein multiple LEDs are grown on the same substrate that forms a light emitting surface or region. In certain embodiments, a pixelated-LED chip includes multiple active layer portions formed from an active layer grown on a growth substrate. In certain embodiments, the pixels may share functional layers of the pixelated-LED chip. In certain embodiments, one or more portions (or the entirety) of a growth substrate and/or portions of epitaxial layers may be thinned or removed. In certain embodiments, a second substrate (such as a carrier substrate or a temporary substrate to perform chip processing) may be added to the pixelated-LED chip or precursor thereof, whether or not a growth substrate has been partially or fully removed. In certain embodiments, a light-transmissive substrate includes silicon carbide (SiC), sapphire, or glass. Multiple LEDs (e.g., flip chip LEDs or flip chip pixels) may be grown on a substrate and incorporated into a light emitting device. In certain embodiments, a substrate (e.g., silicon) may include vias arranged to make contact with LED chips mounted or grown thereon. In certain embodiments, as an alternative to using flip chips, individual LEDs or LED packages may be individually placed and mounted on or over a substrate to form an array. For example, multiple wafer level packaged LEDs may be used to form LED arrays or subarrays.

When LEDs embodying a flip chip configuration are used, desirable flip chip LEDs incorporate multi-layer reflectors and incorporate light-transmissive (preferably transparent) substrates patterned along an internal surface adjacent to semiconductor layers. A flip chip LED, or a flip chip pixel in some embodiments, includes anode and cathode contacts that are spaced apart and extend along the same face, with such face opposing a face defined by the light-transmissive (preferably transparent) substrate. A flip chip LED may be termed a horizontal structure, as opposed to a vertical structure having contacts on opposing faces of a LED chip. In certain embodiments, the transparent substrate may be patterned, roughened, or otherwise textured to provide a varying surface that increases the probability of refraction over internal reflection, so as to enhance light extraction. A substrate may be patterned or roughened by any of various methods known in the art, including (but not limited to) formation of nano-scale features by etching (e.g., photolithographic etching) using any suitable etchants, optionally in combination with one or more masks.

Patterning or texturing of a substrate may depend on the substrate material as well as implications on light extraction efficiency and/or pixel separation. If a silicon carbide substrate bearing multiple LEDs (e.g., flip chip LEDs or flip chip pixels) is used, then the index of refraction of the silicon carbide is well-matched to a GaN-based active region of a LED, so light emissions of the active region tend to enter the substrate easily. If a sapphire substrate bearing multiple LEDs (e.g., flip chip LEDs or flip chip pixels) is used, then it may be desirable to provide a patterned, roughened, or textured interface between the active region and the substrate to promote passage of LED emissions into the substrate. With respect to a light extraction surface of a substrate, in certain embodiments it may be desirable to provide a patterned, roughened, or textured surface to promote extraction of light from the substrate. In embodiments where the growth substrate is removed, the GaN epitaxial light emitting surface can be roughened, patterned and/or textured.

In certain embodiments, LEDs or pixels may be grown on a first substrate of a first material (e.g., silicon, silicon carbide or sapphire), the first (growth) substrate may be partially removed (e.g., thinned) or fully removed, and the LEDs or pixels may be bonded to, mounted to, or otherwise supported by a second substrate of a second material (e.g., glass, sapphire, etc.) through which LED emissions are transmitted, wherein the second material is preferably more transmissive of LED emissions than the first material. Removal of the first (growth) substrate may be done by any appropriate method, such as by use of an internal parting region or parting layer that is weakened and/or separated by: application of energy (e.g., laser rastering, sonic waves, heat, etc.), fracturing, one or more heating and cooling cycles, chemical removal, and/or mechanical removal (e.g., including one or more grinding, lapping, and/or polishing steps), or by any appropriate combination of techniques. In certain embodiments, one or more substrates may be bonded or otherwise joined to a carrier. Bonding of one or more LEDs or pixels to a substrate, or bonding of substrates to a carrier, may be performed by any suitable methods. Any suitable wafer bonding technique known in the art may be used, such as may rely on van der Waals bonds, hydrogen bonds, covalent bonds, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. In certain embodiments, one or more adhesion promoting materials may additionally or alternatively be used.

In certain embodiments, a LED array includes multiple flip chip LEDs or flip chip pixels grown on a single first (or growth) substrate, with the growth substrate removed from the LEDs, and a second substrate (or carrier) added to the LEDs, with the second substrate including one or more reflective layers, vias, and a phosphor layer (e.g., spin-coated phosphor layer). In certain embodiments, a LED array includes multiple flip chip LEDs or flip chip pixels grown on a single growth substrate, wherein grooves, recesses, or other features are defined in the growth substrate and/or a carrier, and are used to form light-affecting elements, optionally being filled with one or more materials such as to form a grid between individual LEDs or pixels.

In certain embodiments utilizing flip chip LEDs or flip chip pixels, a light-transmissive substrate, a plurality of semiconductor layers, a multi-layer reflector, and a passivation layer may be provided. The light-transmissive substrate is preferably transparent with a patterned surface including a plurality of recessed features and/or a plurality of raised features. The plurality of semiconductor layers is adjacent to the patterned surface, and includes a first semiconductor layer comprising doping of a first type and a second semiconductor layer comprising doping of a second type, wherein a light emitting active region is arranged between the first semiconductor layer and the second semiconductor layer. The multi-layer reflector is arranged proximate to the plurality of semiconductor layers and includes a metal reflector layer and a dielectric reflector layer, wherein the dielectric reflector layer is arranged between the metal reflector layer and the plurality of semiconductor layers. The passivation layer is arranged between the metal reflector layer and first and second electrical contacts, wherein the first electrical contact is arranged in conductive electrical communication with the first semiconductor layer, and the second electrical contact is arranged in conductive electrical communication with the second semiconductor layer. In certain embodiments, a first array of conductive microcontacts extends through the passivation layer and provides electrical communication between the first electrical contact and the first semiconductor layer, and a second array of conductive microcontacts extends through the passivation layer. In certain embodiments, a substrate useable for forming and supporting an array of flip chip LEDs or flip chip pixels may include sapphire; alternatively, the substrate may include silicon, silicon carbide, a Group III-nitride material (e.g., GaN), or any combination of the foregoing materials (e.g., silicon on sapphire, etc.). Further details regarding fabrication of flip chip LEDs are disclosed in U.S. Patent Application Publication No. 2017/0098746A1, with the entire contents thereof being hereby incorporated by reference herein.

FIG. 1 illustrates a single flip chip LED 10 including a substrate 15, first and second electrical contacts 61, 62, and a functional stack 60 (incorporating at least one light emitting active region 25) arranged therebetween. The flip chip LED 10 includes an internal light-transmissive surface 14 that is patterned (with multiple recessed and/or raised features 17) proximate to semiconductor layers of the LED 10, including a multi-layer-reflector proximate to the semiconductor layers according to one embodiment. The light-transmissive (preferably transparent) substrate 15 has an outer major surface 11, side edges 12, and the patterned surface 14. Multiple semiconductor layers 21, 22 sandwiching the light emitting active region 25 are adjacent to the patterned surface 14, and may be deposited via vapor phase epitaxy or any other suitable deposition process. In one implementation, a first semiconductor layer 21 proximate to the substrate 15 embodies an n-doped material (e.g., n-GaN), and the second semiconductor layer 22 embodies a p-doped material (e.g., p-GaN). A central portion of the multiple semiconductor layers 21, 22 including the active region 25 extends in a direction away from the substrate 15 to form a mesa 29 that is laterally bounded by at least one recess 39 containing a passivation material (e.g., silicon nitride as part of a passivation layer 50), and that is vertically bounded by surface extensions 21A of the first semiconductor layer 21.

A multi-layer reflector is arranged proximate to (e.g., on) the second semiconductor layer 22, with the multi-layer reflector consisting of a dielectric reflector layer 40 and a metal reflector layer 42. The dielectric reflector layer 40 is arranged between the metal reflector layer 42 and the second semiconductor layer 22. In certain implementations, the dielectric reflector layer 40 comprises silicon dioxide, and the metal reflector layer 42 comprises silver. Numerous conductive vias 41-1, 41-2 are defined in the dielectric reflector layer 40 and are preferably arranged in contact between the second semiconductor layer 22 and the metal reflector layer 42. In certain implementations, the conductive vias 41-1, 41-2 comprise substantially the same material (s) as the metal reflector layer 42. In certain implementations, at least one (preferably both) of the dielectric reflector layer 40 and the metal reflector layer 42 is arranged over substantially the entirety of a major surface of the mesa 29 terminated by the second semiconductor layer 22 (e.g., at least about 90%, at least about 92%, or at least about 95% of the major (e.g., lower) surface of the mesa portion of the second semiconductor layer 22).

A barrier layer 48 (including portions 48-1 and 48-2) is preferably provided between the metal reflector layer 42 and the passivation layer 50. In certain implementations, the barrier layer 48 comprises sputtered Ti/Pt followed by evaporated Au, or comprises sputtered Ti/Ni followed by evaporated Ti/Au. In certain implementations, the barrier layer 48 may function to prevent migration of metal from the metal reflector layer 42. The passivation layer 50 is arranged between the barrier layer 48 and (i) the first externally accessible electrical contact (e.g., electrode, or cathode) 61 and (ii) the second externally accessible electrical contact (e.g., electrode, or anode) 62, which are both arranged along a lower surface 54 of the flip chip LED 10 separated by a gap 59. In certain implementations, the passivation layer 50 comprises silicon nitride. The passivation layer 50 includes a metal-containing interlayer 55 arranged therein, wherein the interlayer 55 may include (or consist essentially of) Al or another suitable metal.

The LED 10 includes first and second arrays of microcontacts 63, 64 extending through the passivation layer 50, with the first array of microcontacts 63 providing conductive electrical communication between the first electrical contact 61 and the first (e.g., n-doped) semiconductor layer 21, and with the second array of microcontacts 64 providing conductive electrical communication between the second electrical contact 62 and the second (e.g., p-doped) semiconductor layer 22. The first array of microcontacts 63 extends from the first electrical contact 61 (e.g., n-contact) through the passivation layer 50, through openings defined in the interlayer 55, through openings 52 defined in the first portion 48-1 of the barrier layer 48, through openings defined in a first portion 42-1 of the metal reflector layer 42, through openings defined in a first portion 40-1 of the dielectric reflector layer 40, through the second semiconductor layer 22, and through the active region 25 to terminate in the first semiconductor layer 21. Within openings defined in the interlayer 55, the first portion 48-1 of the barrier layer 48, the first portion 42-1 of the metal reflector layer 42, and the first portion 40-1 of the dielectric reflector layer 40, dielectric material of the dielectric reflector layer 40 laterally encapsulates the first array of microcontacts 63 to prevent electrical contact between the first array of microcontacts 63 and the respective layers 55, 48, 42, 40. The conductive vias 41-1 defined in the first portion 40-1 of the dielectric reflector layer 40 contact the first portion 40-1 of the dielectric reflector layer 40 and the second semiconductor layer 22, which may be beneficial to promote current spreading in the active region 25. The second array of microcontacts 64 extends from the second electrical contact 62 through the passivation layer 50 and through openings defined in the interlayer 55 to at least one of (i) the second portion 48-2 of the barrier layer 48, and (ii) a second portion 42-2 of the metal reflector layer 42, wherein electrical communication is established between the metal reflector layer 42 and the second semiconductor layer 22 through the conductive vias 41-2 defined in a second portion 40-2 of the dielectric reflector layer 40. Although the second array of microcontacts 64 is preferred in certain implementations, in other implementations, a single second microcontact may be substituted for the second array of microcontacts 64. Similarly, although it is preferred in certain implementations to define multiple vias 41-2 in the second portion 40-2 of the dielectric reflector layer 40, in other implementations, a single via or other single conductive path may be substituted for the conductive vias 41-2.

Following formation of the passivation layer 50, one or more side portions 16 extending between the outer major surface 11 of the substrate 15 and surface extensions 21A of the first semiconductor layer 21 are not covered with passivation material. Such side portions 16 embody a non-passivated side surface.

In operation of the flip chip LED 10, current may flow from the first electrical contact (e.g., n-contact or cathode) 61, the first array of microcontacts 63, and the first (n-doped) semiconductor layer 21 into the active region 25 to generate light emissions. From the active region 25, current flows through the second (p-doped) semiconductor layer 22, conductive vias 41-2, second metal reflector layer portion 42-2, second barrier layer portion 48-2, and the second array of microcontacts 64 to reach the second electrical contact (e.g., p-contact or anode) 62. Emissions generated by the active region 25 are initially propagated in all directions, with the reflector layers 40, 42 serving to reflect emissions in a direction generally toward the substrate 15. As emissions reach the patterned surface 14 arranged between the substrate 15 and the first semiconductor layer 21, recessed and/or raised features 17 arranged in or on the patterned surface 14 promote refraction rather than reflection at the patterned surface 14, thereby increasing the opportunity for photons to pass from the first semiconductor layer 21 into the substrate 15 and thereafter exit the LED 10 through the outer major surface 11 and non-passivated side portions 16. In certain implementations, one or more surfaces of the LED 10 may be covered with one or more lumiphoric materials (not shown), to cause at least a portion of emissions emanating from the LED 10 to be up-converted or down-converted in wavelength.

FIGS. 2A and 2B are plan view photographs of a single flip chip LED 10 similar in structure and operation to the flip chip LED 10 of FIG. 1. Referring to FIG. 2A, the flip chip LED 10 includes an outer major surface 11 arranged for extraction of LED emissions, and includes an active region having a length L and a width W. In certain embodiments, the active region includes a length L of about 280 microns, and a width W of about 220 microns, and a substrate 15 extends beyond the active region. Referring to FIG. 2B, the flip chip LED 10 includes a cathode (e.g., first electrical contact) 61 and an anode (e.g., second electrical contact) 62 arranged along a lower surface 54. In certain embodiments, the cathode 61 includes length and width dimensions of about 95 microns by 140 microns, and the anode 62 includes length and width dimensions of about 70 microns by 170 microns.

FIGS. 3A and 3B are plan view photographs of a pixelated-LED chip including an array of four flip chip LEDs 10 formed on a single transparent substrate 15, with each flip chip LED 10 being substantially similar in structure and operation to the flip chip LED 10 of FIG. 1. Each flip chip LED 10 includes an active layer portion of an active layer. The active layer portion of each flip chip LED 10 is spaced apart from the active area of each of other adjacent flip chip LED 10 by a gap (e.g., 40 microns in a length direction and 30 microns in a width direction). A central portion of each gap embodies a street 70 (e.g., having a width of about 10 microns) consisting solely of the substrate 15, whereas peripheral portions of each gap (between each street 70 and active areas of LEDs 10) includes the substrate 15 as well as passivation material (e.g., passivation layer 50 shown in FIG. 1). Each street 70 thus represents a boundary between adjacent flip chip LEDs 10. Each flip chip LED 10 includes a cathode 61 and an anode 62 arranged along a lower surface 54, and each flip chip LED 10 is arranged to emit light through an outer major surface 11 of the substrate 15. The exposed cathodes 61 and anodes 62 permit separate electrical connections to be made to each flip chip LED 10, such that each flip chip LED 10 may be individually addressable and independently electrically accessed. Additionally, this allows groups or subgroups of the flip chip LEDs 10 to be accessed together, separately from other flip chip LEDs 10. If it were desired to separate the flip chip LEDs 10 from one another, then a conventional method to do so would be to utilize a mechanical saw to cut through the streets 70 to yield individual flip chip LEDs 10.

FIGS. 4A and 4B are plan view photographs of a pixelated-LED chip including an array of one hundred flip chip LEDs 10 on a single transparent substrate 15, with each flip chip LED 10 being substantially similar in structure and operation to the flip chip LED 10 illustrated in FIG. 1. The flip chip LEDs 10 are separated from one another by gaps including streets 70. Each flip chip LED 10 includes an outer major surface 11 arranged for extraction of LED emissions, and includes a cathode 61 and an anode 62 arranged along a lower surface 54. The exposed cathodes 61 and anodes 62 permit separate electrical connections to be made to each flip chip LED 10, such that each flip chip LED 10 may be individually addressable and independently electrically accessed.

As noted previously, the omnidirectional character of LED and phosphor emissions may render it difficult to prevent emissions of one LED (e.g., a first pixel) from significantly overlapping emissions of another LED (e.g., a second pixel) of an array of flip chip LEDs arranged on a single light-transmissive substrate. A single transparent substrate supporting multiple flip chip LEDs would permit light beams to travel in numerous directions, leading to light scattering and loss of pixel-like resolution of emissions transmitted through the substrate. Problems of light scattering and loss of pixel-like resolution would be further exacerbated by presence of one or more lumiphoric materials overlying the light extraction surface of a substrate, owing to the omnidirectional character of lumiphor emissions. Various embodiments disclosed herein address this issue by providing light segregation elements configured to reduce interaction between emissions of different LEDs and/or lumiphoric material regions, thereby reducing scattering and/or optical crosstalk and preserving pixel-like resolution of the resulting emissions. In certain embodiments, light segregation elements may extend from a light injection surface into a substrate, may extend from a light extraction surface into a substrate, may extend outward from a light extraction surface, or any combination of the foregoing. In certain embodiments, multiple light segregation elements may be defined by different methods in the same substrate and/or light emitting device. In certain embodiments, light segregation elements of different sizes and/or shapes may be provided in the same substrate and/or light emitting device. For example, in certain embodiments, a first group of light segregation elements having a first size, shape, and/or fabrication technique may extend from a light injection surface into an interior of a substrate, and a second group of light segregation elements having a second size, shape, and/or fabrication technique may extend from a light injection surface into an interior of a substrate, wherein the second size, shape, and/or fabrication technique differs from the first size, shape, and/or fabrication technique. In certain embodiments, light segregation elements may include recesses (whether filled or unfilled) defined in a substrate supporting multiple LEDs, with such recesses embodying boundaries between pixels.

In certain embodiments, each flip chip LED of an array of LEDs supported by a single substrate (e.g., a pixelated-LED chip) includes a greatest lateral dimension of no greater than about 400 microns, about 300 microns, or about 200 microns. In certain embodiments, each flip chip LED pixel of an array of LEDs supported by a single substrate includes inter-pixel spacing of no greater than about 60 microns, or about 50 microns, or about 40 microns, or about 30 microns, or about 20 microns, or about 10 microns. Such dimensional ranges provide a desirably small pixel pitch.

In certain embodiments, a pixelated-LED chip includes LEDs serving as pixels each having a substantially square shape. In certain embodiments, a pixelated-LED chip includes LEDs serving as pixels each having a rectangular (but non-square) shape. In other embodiments, LEDs may be provided as pixels having hexagonal shapes, triangular shapes, round shapes, or other shapes.

In certain embodiments, a pixelated-LED chip may include LEDs provided in a two-dimensional array as pixels of about 70 µm long×70 µm wide, each including an active region of about 50 µm long×50 µm wide, thereby providing a ratio of emitting area to total area of $0.0025$ mm$^2$ $0.0049$ mm$^2$=$0.51$ (or 51%). In certain embodiments, an array of at least 100 LEDs (as shown in FIG. 4B) may be provided in an area of no greater than 32 mm long×24 mm wide, with spacing between LEDs (pixel pitch) of no greater than 40 µm in the length direction and no greater than 30 µm in the width direction. In certain embodiments, each LED may include an emissive area of 280 µm long×210 µm wide (totaling an area of $0.0588$ mm$^2$). Considering a total top area of 320 µm long×240 µm wide (totaling an area of $0.0768$ mm$^2$) for each LED, a ratio of emissive area to total area (i.e., including emissive area in combination with non-emissive area) along a major (e.g., top) surface is 76.6%. In certain embodiments, a light emitting device as disclosed herein includes a ratio of emissive area to non-emissive (or dark) area along a major (e.g., top) surface of at least about 30%, at least about 40%, at least about 50% (i.e., about 1:1 ratio of emitting area to non-emitting (dark) area), at least about 55%, at least about 60%, at least about 65%, at least about 70%, at least about 75%, or at least about 80%. In certain embodiments, one or more of the foregoing values may optionally constitute a range bounded by an upper value of no greater than 70%, 75%, 80%, 85%, or 90%. In certain embodiments, an array of at least 1000 LEDs may be provided.

Although FIGS. 2A, 2B, 3A, 3B, 4A, and 4B show each LED as including two n-contact vias (embodying vertically offset circles registered with the n-contact or cathode 61), in certain embodiments, n-contacts and any associated n-contact vias may be shifted laterally and provided in a dark area outside the emitting area of each LED.

FIGS. 5A-5C illustrate a pixelated-LED chip including an array of sixteen flip chip LEDs or pixels 10 on a single transparent substrate 15 facing upward in various states of fabrication. Cathodes 61 and anodes 62 are facing downward. As shown in FIG. 5A, the substrate 15 is continuous in character without any surface features along an outer major (light extraction) surface 11. FIG. 5B shows the substrate 15 following formation of three lengthwise grooves or recesses 72 extending from the light extraction surface 11 into an interior of the substrate 15. Such grooves or recesses 72 may be formed by any suitable techniques described herein, including mechanical sawing. FIG. 5C shows the substrate 15 following formation of three widthwise grooves or recesses 72 extending from the light extraction surface 11 into an interior of the substrate 15.

In certain embodiments, a light emitting device (e.g., a pixelated-LED chip) including an array of flip chip LEDs or pixels may be arranged for coupling with a temporary interface element such as a carrier, submount, or mounting tape that provides temporary support during various manufacturing steps. Electrical coupling with the array of flip chip LEDs or pixels may then occur at subsequent packaging of the pixelated-LED chip.

In certain embodiments, a light emitting device (e.g., a pixelated-LED chip) including an array of flip chip LEDs or pixels may be arranged for coupling with a passive interface element such as a carrier or submount, with electrical connections between the light emitting device and the interface element. In certain embodiments, an interface element may include a first array of bond pads or electrical contacts positioned on a first surface and arranged to make contact with electrodes of an array of flip chip LEDs (e.g., embodied in one or more pixelated-LED chips), and a second array of bond pads or electrical contacts positioned on a second surface and arranged to make contact with electrodes of one or more ASICs or other switching apparatuses configured to accommodate switching of current supplied to individual pixels of the pixelated-LED chip. Optionally, conductive vias may be defined through the interface element to provide conductive paths between the first array of bond pads or electrical contacts and the second array of bond pads or electrical contacts.

In certain embodiments, a light emitting device (e.g., a pixelated-LED chip) including an array of flip chip LEDs or pixels may be arranged for coupling to a passive interface element that provides electrical connections to an off-board controller. In certain embodiments, orthogonally arranged (e.g., vertical and horizontal) conductors form rows and columns in a grid pattern, whereby individual flip chip LEDs (or pixels) are defined by each intersection of a row and column. Such construction may enable multiplex sequencing to permit individual control of each LED or pixel of the array while employing a smaller number of conductors than the number of LEDs in the array, either by utilizing a common-row anode or common-row cathode matrix arrangement, and brightness control may be provided by pulse width modulation.

FIGS. 6A-6E illustrate a first scheme for passively interfacing with an array of flip chip LEDs or pixels. FIG. 6A is a plan view illustration of a light emitting device (e.g., a pixelated-LED chip) including an array of sixteen flip chip LEDs or pixels 10 on a single transparent substrate 15 with a lower surface 54 of the substrate 15 as well as cathodes 61 and anodes 62 facing upward. FIG. 6B is a plan view illustration of a lower layer of an electrical interface for the light emitting device of FIG. 6A. A first interface carrier 101 includes multiple horizontal string series connections 103 each including multiple electrically conductive vias 102 for coupling with anodes 62 of the light emitting device of FIG. 6A, and further including openings 104 permitting passage of conductive vias 106 defined in a second interface carrier 105 (shown in FIG. 6C) forming an upper layer of the electrical interface. As shown in FIG. 6C, multiple vertical string series connections 107 each include multiple electrically conductive vias 106 arranged for coupling with cathodes 61 of the light emitting device of FIG. 6A. FIG. 6D is a plan view illustration of the upper layer of FIG. 6C superimposed over the lower layer of FIG. 6B to form an electrical interface for the light emitting device of FIG. 6A. FIG. 6E is a plan view illustration of the electrical interface of FIG. 6D coupled with the light emitting device of FIG. 6A, whereby the horizontal string series connections 103 and the vertical string series connections 107 permit each flip chip LED or pixel 10 of the array to be individually accessed. Such accessibility may permit each flip chip LED or pixel 10 to be separately controlled (e.g., using multiplex sequencing).

FIGS. 7A-7E illustrate a second scheme for passively interfacing with an array of flip chip LEDs, including individual signals supplied to cathodes of the array. FIG. 7A is a plan view illustration of a light emitting device (e.g., a pixelated-LED chip) including an array of sixteen flip chip LEDs or pixels 10 on a single transparent substrate 15 with a lower surface 54 of the substrate 15 as well as cathodes 61 and anodes 62 facing upward. FIG. 7B is a plan view illustration of a lower layer of an electrical interface for the light emitting device of FIG. 7A. A first interface carrier 101 includes multiple horizontal string series connections 103 each including multiple electrically conductive vias 102 for coupling with anodes 62 of the light emitting device of FIG. 7A, and further including openings 104 permitting passage of conductive vias 106 defined in a second interface carrier 105A (shown in FIG. 7C) forming an upper layer of the electrical interface. FIG. 7C is a plan view illustration of the upper layer of an electrical interface for the light emitting device of FIG. 7A, with multiple vertically arranged parallel connections 107A each including multiple electrically conductive vias 106 for coupling with cathodes 61 of the array. FIG. 7D is a plan view illustration of the upper layer of FIG. 7C superimposed over the lower layer of FIG. 7B to form an electrical interface for the light emitting device of FIG. 7A. FIG. 7E is a plan view illustration of the electrical interface of FIG. 7D coupled with the light emitting device of FIG. 7A, whereby the horizontal string series connections 103 and the vertically arranged parallel connections 107A permit each flip chip LED or pixel 10 of the array to be individually electrically accessed.

As noted previously, solid state emitter arrays disclosed herein may include various combinations of solid state light emitters (e.g., LEDs) and/or lumiphors configured to emit light of different wavelengths, such that an emitter array may be arranged to emit light of multiple peak wavelengths. Various color combinations are contemplated for use in different applications.

FIGS. 8A-8D are plan view diagrams of electrically accessible light emitting devices (e.g., LEDs or pixels) each including multiple light emitters 110 (each including at least one solid state light emitter, optionally in combination with at least one lumiphoric material) supported by a single substrate 15 and configured to produce a different combination of colors. Such devices may each include an array of flip chip LEDs or flip chip pixels on a transparent substrate according to various embodiments disclosed herein. It is to be appreciated that particular color combinations and the number of light emitters disclosed herein are provided by way of example only, and are not intended to limit the scope of the invention, since any suitable combination of colors and number of light emitters are contemplated.

FIG. 8A illustrates a light emitting device including four groups of four red (R), green (G), blue (B), and white (W) light emitters, with each light emitter arranged in a different row among rows 1 to 4 and a different column among columns A to D. A single repeat unit 112 including R-G-B-W light emitters is shown at upper left. In certain embodiments, the blue (B) emitters include LEDs lacking any lumiphoric material; the white (W) emitters include blue LEDs arranged to stimulate emissions of a yellow and red lumiphor combination; the green (G) emitters include either green LEDs or blue LEDs arranged to stimulate green lumiphors; and the red (R) emitters include red LEDs or blue LEDs arranged to stimulate red lumiphors. Accordingly, in certain embodiments, all of the R-G-B-W light emitters are blue LEDs, and the R-G-W light emitters are arranged with lumiphors as described above. In some embodiments, the white (W) emitters may be omitted. In certain embodiments, the light emitting device of FIG. 8A may be useable as a sequentially illuminated LED display for producing color images or text and the like.

FIG. 8B illustrates a light emitting device including four groups of four short wavelength red ($R_1$), green (G), blue (B), and long wavelength red ($R_2$) light emitters, with each light emitter arranged in a different row among rows 1 to 4 and a different column among columns A to D. A single repeat unit 112 including $R_1$-G-B-$R_2$ light emitters is shown at upper left. In certain embodiments, the blue (B) emitters include LEDs lacking any lumiphoric material; the short wavelength red ($R_1$) and long wavelength red ($R_2$) emitters each include a red LED or a blue LED arranged to stimulate emissions of red lumiphors; and the green (G) emitters include either green LEDs or blue LEDs arranged to stimulate green lumiphors. Accordingly, in certain embodiments, all of the $R_1$-G-B-$R_2$ light emitters are blue LEDs, and the $R_1$-G-$R_2$ light emitters are arranged with lumiphors as described above. Generally, solid-state light sources (e.g., LEDs) having different peak wavelengths in the red range decline in luminous efficacy with increasing peak wavelength, such that significantly more current may be required to generate the same number of red lumens from a red LED having a long peak wavelength in the red range than from a red LED having a shorter peak wavelength; however, long peak wavelength red emitters are well-suited for producing high vividness illumination. In certain embodiments, the light emitting device of FIG. 8B may be useable as a sequentially illuminated LED display or advertising billboard suitable for producing very high vividness images, owing to the presence of long wavelength red emitters.

FIG. 8C illustrates a light emitting device including four groups of four blue shifted yellow (BSY), white (W), white (W), and amber (A) light emitters, with each light emitter arranged in a different row among rows 1 to 4 and a different column among columns A to D. A single repeat unit 112 including BSY-W-W-A light emitters is shown at upper left. In certain embodiments, the blue shifted yellow (BSY) emitters include blue LEDs arranged to stimulate emissions of yellow phosphors providing better efficiency but poorer color rendering than white LEDs; the white (W) emitters include blue LEDs arranged to stimulate emissions of a yellow and red lumiphor combination; and the amber (A) emitters include either amber LEDs or blue LEDs arranged to stimulate amber lumiphors.

FIG. 8D illustrates a light emitting device including four groups of four blue shifted yellow (BSY), amber (A), red (R), and blue shifted yellow (BSY) light emitters, with each light emitter arranged in a different row among rows 1 to 4 and a different column among columns A to D. A single repeat unit 112 including BSY-A-R-BSY light emitters is shown at upper left. In certain embodiments, blue shifted yellow (BSY) emitters include blue LEDs arranged to stimulate emissions of yellow phosphors providing better efficiency but poorer color rendering than white LEDs; the amber (A) emitters include either amber LEDs or blue LEDs arranged to stimulate amber lumiphors; and the red (R) emitters include red LEDs or blue LEDs arranged to stimulate red lumiphors.

Various embodiments disclosed herein may provide strong contrast and/or sharpness between lit and unlit regions of LED arrays while seeking to reduce or eliminate crosstalk or light spill between such regions. However, when adjacent LEDs are lit, the presence of certain types of light segregation elements between such LEDs (which are intended to reduce or eliminate crosstalk) may lead to non-illuminated or "dark" zones between the LEDs, thereby degrading homogeneity of the composite emissions. Various embodiments described hereinafter are intended to provide strong contrast and/or sharpness between lit and unlit regions of a LED array, while enhancing homogeneity of composite emissions when adjacent LEDs of the array are lit. For example, in certain embodiments, an array of LEDs (optionally embodied in a pixelated-LED chip) defines multiple pixels, and light segregating elements are configured to permit limited amounts of light to be transmitted between border portions of the pixels for inter-pixel illumination at light-emitting surface portions that are registered with or proximate to a plurality of light segregation elements. Exemplary light segregation elements include recesses (whether unfilled or subsequently filled) defined through a light injection surface and less than entire thickness of a substrate. Such recesses defined in a light injection surface of a substrate may be employed in combination with protruding features of a light extraction surface of the same substrate to provide desirable illumination with and among multiple pixels.

In certain embodiments, pixelated-LED light emitting devices (e.g., pixelated-LED chips) include substrates with light extraction surfaces defining protruding features and with light segregation elements in the form of recesses defined through light injection surfaces. Multiple LEDs are associated with each substrate, with multiple LEDs configured to inject light into a substrate in each instance to form multiple pixels. In each instance, protruding features of the light extraction surfaces may be defined by bevel cutting the light extraction surfaces with a rotary saw (e.g., at a high rotation speed but a slow linear travel speed). Such cutting may form a plurality of light extraction surface recesses that intersect and that serve to define and segregate the protruding features. More particularly, bevel cutting of the light extraction surface may be performed to yield a plurality of inclined lateral faces of the light extraction surface recesses. In certain embodiments, each inclined lateral face of the plurality of inclined lateral faces comprises an angle of inclination from vertical in a range of from about fifteen degrees to about forty-five degrees, or in a subrange of from about twenty degrees to about forty degrees, or in a subrange of from about twenty-five degrees to about thirty-five degrees, or in an amount of about thirty degrees. When an angle of inclination from vertical of about thirty degrees is used, and opposing faces of a protruding feature are formed by two bevel cuts of the same magnitude, a protruding feature may include an angle of about sixty degrees between the opposing faces.

In certain embodiments, each active region of the plurality of active layer portions are configured to illuminate a different light-transmissive portion of the plurality of light-transmissive portions and transmit light through the light extraction surface, such that the plurality of active layer portions and the substrate form a plurality of pixels, and pixels of the plurality of pixels comprise a maximum pixel width; and the method further comprises forming a plurality of protruding features in the light extraction surface, wherein each protruding feature of the plurality of protruding features comprises a width in a range of from about one fifth to about one half of the maximum pixel width. Restated, in certain embodiments, a light extraction surface may include (larger-scale) protruding features of polyhedral or truncated polyhedral shapes with a plurality of inclined lateral faces, in combination with (smaller scale) microscale textural features. An initially continuous active layer grown over a substrate may be divided into active layer portions by defining streets (e.g., recesses or gaps) in the active layer, with each active layer portion having an associated anode-cathode pair to permit the active layer portion to serve as a pixel.

In certain embodiments, one or more pixelated-LED chips may include different pixels with protruding features of different sizes, shapes, numbers, and/or distributions. Protruding features of different sizes may include differences in at least one of height, width, or length. Protruding features of different shapes may include differences in symmetry (or lack thereof), angularity, curvature, or the like. Protruding features may be provided in different numbers in association with different pixels. Differences in pixel distribution may include relative or absolute placement of pixels relative to a pixel area.

In certain embodiments, protruding features of light extraction surfaces of one or more pixelated-LED chips may be defined by bevel cutting the light extraction surfaces with a rotary saw. Such cutting may form a plurality of light extraction surface recesses that intersect and that serve to define and segregate the protruding features. Either before or after (or both before and after) such bevel cutting, substrate material may be subjected to one or more thinning processes such as etching, grinding, lapping, mechanical polishing, chemical polishing, chemical-mechanical polishing, and the like. One or more thinning processes may be applied to the entirety of a substrate, or only to selected portions thereof.

In certain embodiments, a pixelated-LED chip (or a least a substrate thereof) as disclosed herein may be thinned to about 200 µm prior to formation of recesses to yield protruding features in a light extraction surface thereof.

In certain embodiments, laterally outermost (e.g., edge-adjacent, or adjacent lateral edges of the substrate) protruding features differ in size (e.g., larger or smaller) than non-edge-adjacent protruding features of one or more pixels of a pixelated-LED chip. In certain embodiments, corner-adjacent protruding features (e.g., adjacent corners of the substrate) may differ in size (e.g., larger or smaller) than non-corner-adjacent protruding features (e.g., non-corner-adjacent edge protruding features, or non-edge-adjacent protruding features) of one or more pixels of a pixelated-LED chip.

In certain embodiments, a light extraction surface may comprise a plurality of microscale textural features. In certain embodiments, each microscale textural a plurality of microscale textural features may have a maximum dimension (e.g., length, width, or height) of up to about 10 µm, or up to about 7.5 µm, or up to about 5 µm, or up to about 3 µm, or up to about 2 µm, or up to about 1 µm. In certain embodiments, microscale textural features may be defined by a subtractive material removal process, such as dry etching and/or wet etching. Examples of dry etching processes that might be used in certain embodiments include inductively coupled plasma etching and reactive ion etching.

In certain embodiments, microscale textural features may be regularly spaced and/or regularly sized. Such features may be formed through use of at least one mask with regularly spaced openings or pores, which may be defined by photolithographic patterning or other conventional mask formation methods. For example, in certain embodiments, a substrate (e.g., silicon carbide) may be blanket coated with a thin coating (e.g., 200-300 Angstroms) of aluminum. A consumable water soluble template pre-coated with resist may be bonded to the coated wafer surface with low temperature and pressure. The template may be removed with warm water, leaving resist dots. The aluminum layer may be patterned with a short chlorine etch followed by a short (e.g., 20-60 second) inductively coupled plasma (ICP) etch to transfer the pattern into the silicon carbide. A TMAH wet etch may be used to remove any residual aluminum.

In certain embodiments, at least one lateral edge or sidewall of the substrate is encased in an encapsulant material (e.g., silicone). Such encapsulant material may also cover a submount. Use of encapsulant material in these contexts may prevent an etchant from attacking edges of the substrate and/or the submount.

In certain embodiments, a pixelated LED chip comprises an active layer comprising a plurality of active layer portions and a plurality of substrate portions supporting the plurality of active layer portions. Each substrate portion comprises a light-transmissive material, a light injection surface, and a light extraction surface, wherein the light injection surface is arranged between the active layer and the light extraction surface. Each active layer portion of the plurality of active layer portions has a corresponding anode-cathode pair (e.g., to permit each chip to be independently electrically accessible) and is configured to illuminate a different substrate portion of the plurality of substrate portions and transmit light through the light extraction surface of the substrate portion, such that the plurality of active layer portions and the plurality of substrate portions form a plurality of pixels. Additionally, this allows a group or subgroup of the active layer portions to be accessed together, independently of other active layer portions. The light extraction surface of each substrate portion comprises a plurality of protruding features and a plurality of recesses, and each protruding feature of the plurality of protruding features is separated from at least one other protruding feature by a recess of the plurality of recesses. Lateral borders between different pixels of the plurality of pixels are aligned with selected troughs of the plurality of recesses.

FIG. 9A-9I are schematic cross-sectional views of a pixelated-LED chip in various states of fabrication, according to certain embodiments. In FIG. 9A, an LED structure 220 including an active layer 222 has been deposited on a substrate 224. The LED structure 220 may include a plurality of epitaxial layers deposited by metal organic chemical vapor deposition (MOCVD). In addition to the active layer 222, the LED structure 220 may further include one or more n-type semiconductor layers and one or more p-type semiconductor layers. In some embodiments, the LED structure 220 includes Group III-V nitrides including but not limited to gallium nitride, aluminum gallium nitride (AlGaN), aluminum indium gallium nitride (AlInGaN), and indium gallium nitride (InGaN). An exemplary n-type dopant is silicon (Si) and an exemplary p-type dopant is magnesium (Mg). The active layer 222 may be configured between at least one n-type layer and one p-type layer. The active layer 222 may include a single quantum well (SQW) structure that includes a layer of InGaN or a multiple quantum well (MQW) structure such as a plurality of layers that include alternating layers of InGaN and GaN. Other semiconductor materials are possible, including gallium arsenide (GaAs), gallium phosphide (GaP), and alloys thereof. The substrate 224 may include a light-transmissive material such as silicon carbide (SiC) or sapphire, although other substrate materials are possible.

In FIG. 9B, a plurality of active layer portions 222-1, 222-2, and 222-3 have been formed from the LED structure 220. A plurality of recesses or streets 226 are configured to segregate active layer portions 222-1, 222-2, and 222-3. The plurality of recesses 226 may be formed by selectively etching portions of the LED structure 220 and the substrate 224. In some embodiments, the plurality of recesses 226 extends entirely through the LED structure 220 and partially through the substrate 224. In certain embodiments, a first etching step is applied to the LED structure 220 and a second etching step is applied to the substrate 224. In other embodiments, the LED structure 220 and the substrate 224 may be etched in the same etching step. In FIG. 9C, an anode 228 and a cathode 229 are deposited over each of the active layer portions 222-1, 222-2, and 222-3.

Figure 9D:
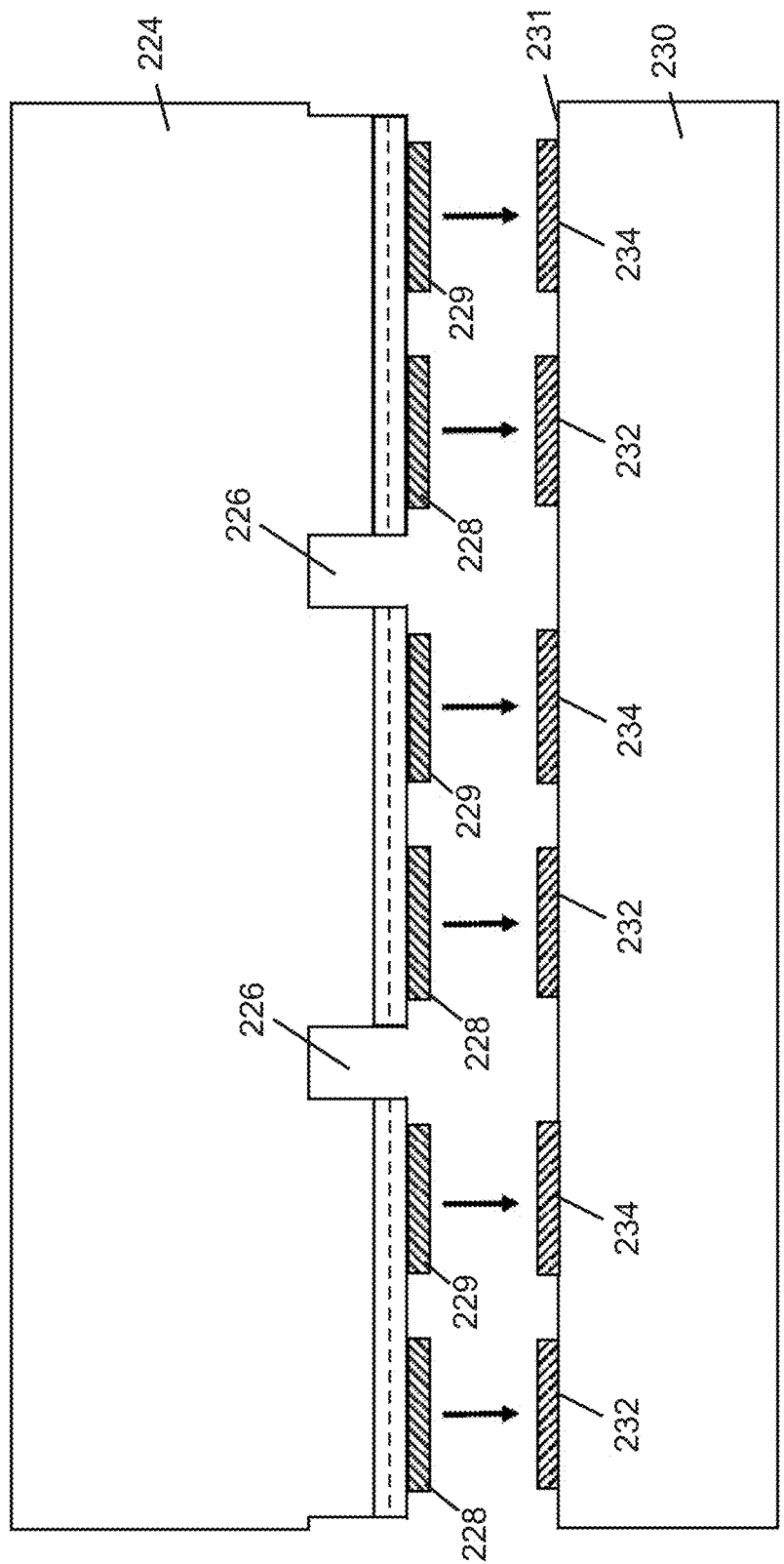

In FIG. 9D and FIG. 9E, the substrate 224 is flip-chip mounted over a mounting surface 231. In some embodiments, the mounting surface 231 is a surface of a submount 230 that includes a plurality of electrode pairs 232, 234. The submount 230 may comprise an active interface element such as an ASIC chip, a passive interface element that serves as an intermediate element that may be later-attached to an active interface element, or a temporary interface element that provides temporary support for subsequent manufacturing steps. For embodiments where the submount 230 comprises a temporary interface element, the plurality of electrode pairs 232, 234 may be omitted. The flip-chip mounting comprises establishing electrically conductive paths between the plurality of anode-cathode pairs 228, 229 and the plurality of electrode pairs 232, 234. In some embodiments, the plurality of anode-cathode pairs 228, 229 are planarized before flip-chip mounting to correct any variations in thicknesses from the anode-cathode deposition. Such planarization helps ensure that reliable electrical contacts may be made across the multiple contacts pairs 228, 230 distributed across the entire interface between the submount 230 and the substrate 224, and avoids variation in interfacial height that would otherwise promote cracking of the substrate 224 when the substrate 244 is mechanically processed (e.g., thinned and shaped) in subsequent steps. As previously described, the submount 230 may include a plurality of separate electrical paths, including one electrical path for each electrode pair of the plurality of electrode pairs 232, 234. In this regard, each of the active layer portions 222-1, 222-2, and 222-3 may be independently electrically accessible. Additionally, this allows a group or subgroup of the active layer portions (e.g. 222-1 and 222-2) to be accessed together, independently of other active layer portions (e.g. 222-3). Any suitable material and/or technique (e.g., solder attachment, preform attachment, flux or no-flux eutectic attachment, silicone epoxy attachment, metal epoxy attachment, thermal compression attachment, bump bonding, and/or combinations thereof) can electrically connect the plurality of anode-cathode pairs 228, 229 and the plurality of electrode pairs 232, 234. In some embodiments, residue from the mounting step may be left in undesired areas between the substrate 224 and the submount 230 (such as in the recesses or streets 226), and a cleaning step (such as an ultrasonic clean), may be used to remove the residue.

Figure 9F:
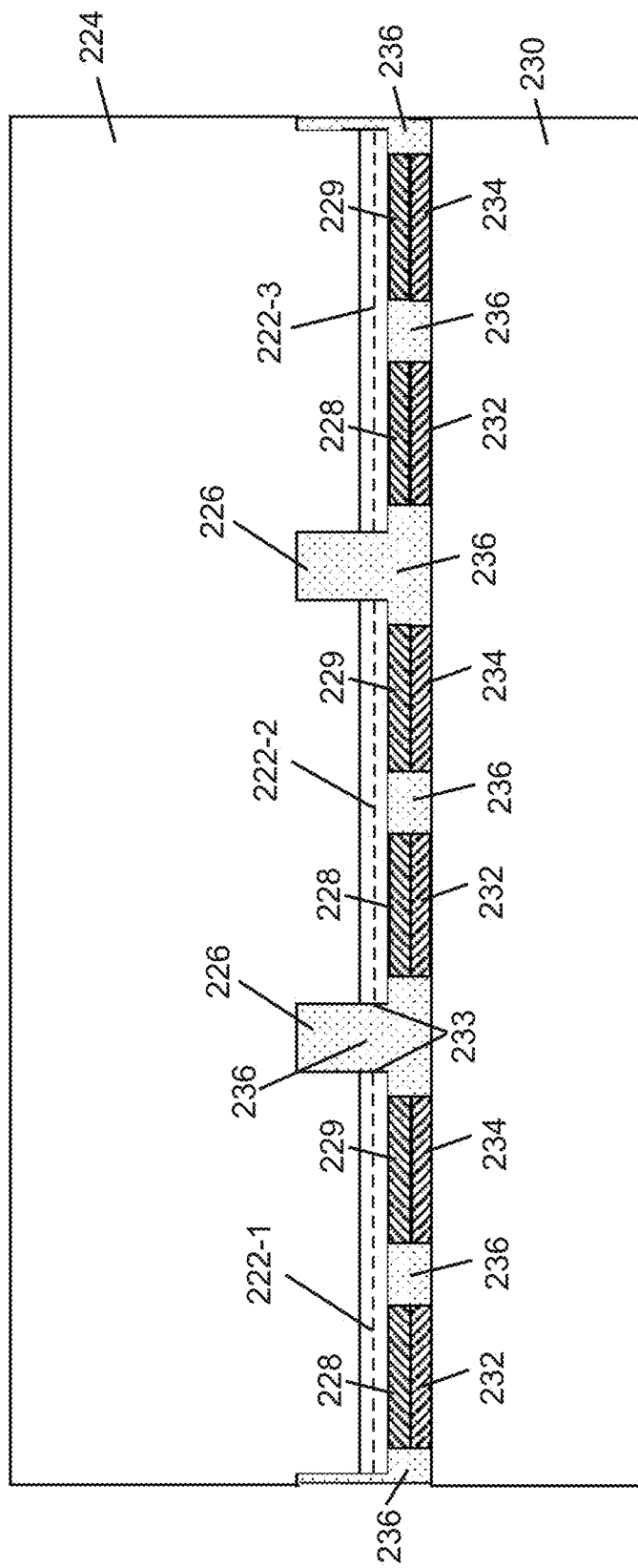

In FIG. 9F, an underfill material 236 has been applied between the substrate 224 and the submount 230. The underfill material 236 fills open spaces within the recesses or streets 226 as well as filling open spaces between the plurality of anode-cathode pairs 228, 229 that are bonded to the electrode pairs 232, 234. In this manner, the underfill material 236 is arranged between the plurality of active layer portions 222-1, 222-2, and 222-3 and the submount 230. The underfill material 236 is additionally arranged between lateral sidewalls 233 of the plurality of active layer portions 222-1, 222-2, and 222-3. In certain embodiments, the lateral sidewalls 233 are spaced from each other between the plurality of active layer portions 222-1, 222-2, and 222-3 by a distance no greater than about 60 µm, or about 50 µm, or about 40 µm, or about 30 µm, or about 20 µm, or about 10 µm, or in a range of from about 10 µm to about 30 µm, or in a range of from about 10 µm to about 20 µm. Accordingly, a width of the underfill material 236 between the lateral sidewalls 233 would have the same dimensions. In certain embodiments, the underfill material 236 comprises an insulating material. The underfill material 236 may comprise a light-altering or light-reflecting material such as light-altering or light-reflecting particles suspended in an insulating binder or a matrix, with the particles having a higher index of refraction than the binder. In some embodiments, the underfill material 236 comprises titanium dioxide (TiO$_2$) particles suspended in a silicone binder. In certain embodiments, a weight ratio of TiO$_2$ to silicone is in a range of 50% to 150%. In some embodiments, the weight ratio of TiO$_2$ to silicone is about 100%, or about 1:1. Additionally, a solvent may be added to help the underfill material 236 flow and fill the recesses or streets 226 as well as filling open spaces between the plurality of anode-cathode pairs 228, 229. In other embodiments, the underfill material 236 may comprise metallic particles suspended in an insulating binder. In some embodiments, the underfill material 236 comprises a dielectric material. In other embodiments, the underfill material 236 comprises air. In this manner, the underfill material 236 is arranged in the recesses or streets 226 to form light segregation elements, or pixel segregation elements, between each of the active layer portions 222-1, 222-2, and 222-3. Accordingly, light emissions of the active layer portions 222-1, 222-2, and 222-3 may be segregated from each other, thereby having improved contrast. The underfill material 236 may additionally comprise a material such as a solvent that may alter the viscosity. In some embodiments, the underfill material 236 is applied where the substrate 224 is mounted to the submount 230 and the underfill material 236 is allowed to fill open spaces by a wicking action, optionally aided by gravity (e.g., angling the submount/substrate assembly away from horizontal), by vibration, by establishment of a pressure differential, etc. In certain embodiments, the underfill material 236 may be applied when the substrate 224 and the submount 230 are under vacuum pressure. In addition to improving the contrast between active layer portions 222-1, 222-2, and 222-3, the underfill material 236 may additionally protect the integrity of the electrical connections between the plurality of anode-cathode pairs 228, 229 and the plurality of electrode pairs 232, 234, and further strengthen a mechanical interface between the substrate 224 and the submount 230 and between active layer portions 222-1, 222-2, and 222-3 during subsequent processing steps. In certain embodiments, the underfill material 236 comprises a material with a high durometer on a Shore hardness scale (e.g., a high durometer silicone material). A material with a high durometer, or hardness, in the underfill material 236 provides mechanical stability or anchoring to help prevent the plurality of anode-cathode pairs 228, 229 from detaching from the plurality of electrode pairs 232, 234 in subsequent processing steps. For example, the underfill material 236 may comprise a material, such as silicone, with a Shore D hardness scale durometer value of at least 40. In further embodiments, the underfill material 236 may comprise a material with a Shore D hardness scale durometer value in a range of from about 40 to about 100 or in a range from about 60 to about 80.

In FIG. 9G, the substrate 224 may be subjected to one or more thinning processes such as etching, grinding, lapping, mechanical polishing, chemical polishing, chemical-mechanical polishing, and the like. In some embodiments, the substrate 224 may initially comprise a thickness of greater than 300 μm. After mounting the substrate 224 to the submount 230, the substrate 224 may be thinned to a thickness of no more than 100 μm. In some embodiments, the substrate 224 may be thinned to about 50 μm by one or more thinning steps. In certain embodiments, multiple thinning steps may be performed in increments of 20-80 μm per thinning step. In some embodiments, the thinning process exerts mechanical stress on the substrate 224 as well as on the electrical connections between the plurality of anode-cathode pairs 228, 229 and the plurality of electrode pairs 232, 234. As previously described, the underfill material 236 may provide mechanical support to prevent cracking of the substrate 224 and/or prevent the electrical connections from being broken.

Figure 9H:
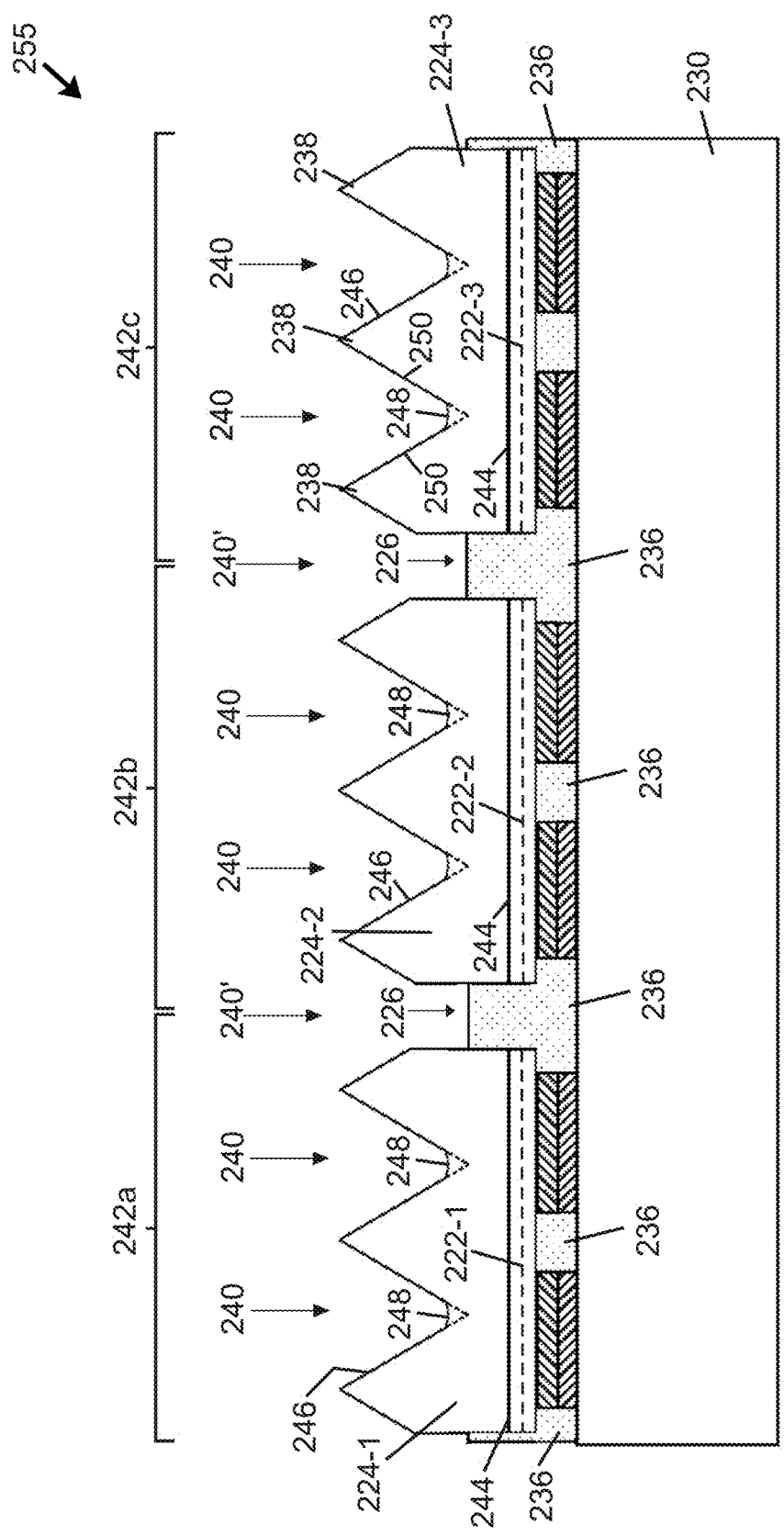

As illustrated in FIG. 9H, the substrate 224 is cut (e.g., textured by cutting) to provide a plurality of protruding features 238 defined by bevel cutting the substrate 224 with a rotary saw. The bevel cutting may be performed across the substrate 224 along various cut lines, or regions 240, 240' at a high rotation speed but a slow linear travel speed to prevent cracking of crystalline substrate material. Some of the cut lines or regions 240' are aligned with the plurality of recesses or streets 226 that segregate active layer portions 222-1, 222-2, and 222-3, thereby providing a "street-aligned" configuration. Notably, in the illustrated embodiment, the cut lines or regions 240' intersect with the plurality of recesses or streets 226, such that portions of the substrate 224 that are registered with the plurality of recesses or streets 226 are removed through an entire thickness of the substrate 224. The substrate 224 is thereby segregated into a plurality of discontinuous substrate portions 224-1, 224-2, and 224-3 that are registered with corresponding active layer portions 222-1, 222-2, and 222-3 to form a pixelated-LED chip 255 comprising a plurality of pixels 242a, 242b, and 242c. The underfill material 236 extends between each pixel of the plurality of pixels 242a, 242b, and 242c and is configured as a light segregation element, or a pixel segregation element, that reduces transmission of emissions from one pixel to another. In some embodiments, the underfill material 236 extends entirely between the plurality of substrate portions 224-1, 224-2, and 224-3 and the submount 230 such that the pixelated-LED chip 255 is devoid of an air gap between the plurality of substrate portions 224-1, 224-2, and 224-3 and the submount 230. Each of the substrate portions 224-1, 224-2, and 224-3 includes a light injection surface 244 adjacent a corresponding active layer portion 222-1, 222-2, and 222-3 and a light extraction surface 246 that generally opposes the light injection surface 244. The light injection surface 244 is arranged between the active layer 222 and the light extraction surface 246. Each active layer portion 222-1, 222-2, and 222-3 is configured to illuminate a different substrate portion 224-1, 224-2, and 224-3, and to transmit light through the light extraction surface 246. The cut lines or regions 240 may additionally form a plurality of light extraction surface recesses 248 that intersect and serve to define and segregate the protruding features 238. More particularly, bevel cutting may be performed to yield a plurality of inclined lateral faces 250 of the light extraction surface recesses 248. In certain embodiments, each inclined lateral face 250 of the plurality of inclined lateral faces 250 comprises an angle of inclination from vertical in a range of from about fifteen degrees to about forty-five degrees, or in a subrange of from about twenty degrees to about forty degrees, or in a subrange of from about twenty-five degrees to about thirty-five degrees, or in an amount of about thirty degrees. When an angle of inclination from vertical of about thirty degrees is used, and opposing faces of a protruding feature are formed by two bevel cuts of the same magnitude, a protruding feature may include an angle of about sixty degrees between the opposing faces. With further reference to FIG. 9H, a lower boundary of each light extraction surface recess 248 is radiused, reflecting the fact that a rotary saw blade useable to form each light extraction surface recess 248 has a non-zero thickness. The dashed lines shown below each light extraction surface recess 248 represent imaginary projections of the plurality of inclined lateral faces 250.

In FIG. 9I, the pixelated-LED chip 255 includes at least one lumiphoric material 252 (also referred to herein as a lumiphor). In particular, the lumiphoric material 252 is arranged on the light extraction surface 246 of each of the plurality of pixels 242a, 242b, and 242c. The lumiphoric material 252 may include one or more of a phosphor, a scintillator, a lumiphoric ink, a quantum dot material, a day glow tape, or the like. In certain embodiments, the lumiphoric material 252 may be in the form of one or more phosphors and/or quantum dots arranged in a binder such as silicone or glass, arranged in the form of a single crystalline plate or layer, a polycrystalline plate or layer, and/or a sintered plate. In certain embodiments, a lumiphoric material such as a phosphor may be spin coated or sprayed on a surface of the plurality of pixels 242a, 242b, and 242c. In certain embodiments, the lumiphoric material 252 may be located on each of the plurality of discontinuous substrate portions 224-1, 224-2, and 224-3, on the LED structure 220, and/or on the submount 230 of the plurality of pixels 242a, 242b, and 242c. In some embodiments, the lumiphoric material 252 is continuous on the plurality of discontinuous substrate portions 224-1, 224-2, and 224-3 of the plurality of pixels 242a, 242b, and 242c. In general, the plurality of active layer portions 222-1, 222-2, and 222-3 may generate light having a first peak wavelength. At least one lumiphor receiving at least a portion of the light generated by the plurality of active layer portions 222-1, 222-2, and 222-3 may re-emit light having a second peak wavelength that is different from the first peak wavelength. A solid state light source and one or more lumiphoric materials may be selected such that their combined output results in light with one or more desired characteristics such as color, color point, intensity, etc. In certain embodiments, aggregate emissions may be arranged to provide cool white, neutral white, or warm white light, such as within a color temperature range of from 2500 K to 10,000 K. In certain embodiments, a lumiphoric material comprises one or more materials including cyan, green, amber, yellow, orange, and/or red peak emission wavelengths. In certain embodiments, lumiphoric materials may be added to one or more emitting surfaces (e.g., top surface and one or more edge surfaces) by methods such as spray coating, dipping, liquid dispensation, powder coating, inkjet printing, or the like. In certain embodiments, lumiphoric material may be dispersed in an encapsulant, adhesive, or other binding medium. In certain embodiments, a scattering material may be included in the lumiphoric material 252. By way of example, the lumiphoric material 252 may include phosphor particles and scattering particles such as fused silica, fumed silica, or $TiO_2$ particles in the same silicone binder. In other embodiments the scattering material may comprise a layer of fused silica, fumed silica, or $TiO_2$ particles in a silicone binder deposited sequentially on the lumiphoric material 252.

The lumiphoric material 252 may comprise a material with a lower durometer value on a Shore hardness scale than the underfill material 236. In some embodiments, the lumiphoric material 252 and the underfill material 236 comprise silicone and the silicone of the lumiphoric material 252 has a lower durometer value on a Shore hardness scale than the silicone of the underfill material 236. As previously described, the underfill material 236 may comprise a silicone with a Shore D hardness durometer value of at least 40. In further embodiments, the underfill material 236 may comprise a silicone with a Shore D hardness durometer value in a range from about 40 to about 100 or in a range from about 60 to about 80. In that regard, the lumiphoric material 252 comprises silicone with a Shore D hardness durometer value of less than 40 in some embodiments. In some embodiments, the underfill material 236 between each pixel of the plurality of pixels 242a, 242b, and 242c and registered with the plurality of recesses or streets 226 may be omitted. Accordingly, an open space or an unfilled void of air may be provided between each pixel of the plurality of pixels 242a, 242b, and 242c to form a light segregation element, or a pixel segregation element. The underfill material 236 may be provided between the plurality of anodes 228 and cathodes 229.

In some embodiments, the submount 230 of FIGS. 9D-9I may comprise a temporary carrier. Accordingly, the plurality of discontinuous substrate portions 224-1, 224-2, and 224-3, the underfill material 236, the anode-cathode pairs 228, 229, and the lumiphoric material 252 are separated or removed from the mounting surface (231 of FIG. 9D).

FIG. 10 is an upper perspective view photograph of a portion of a pixelated-LED light emitting device 273 according to some embodiments, showing a plurality of pixels A1, A2, B1, and B2. Alphanumeric column labels A and B appear at top between vertical dashed lines, and Arabic numerals 1 and 2 appear at left between horizontal dashed lines to provide column and row references for individual pixels. The vertical and horizontal dashed lines correspond to street-aligned cut lines or regions 274-1 to 274-6 that define lateral borders between the pixels A1, A2, B1, and B2. Dashed lines extending outward beyond the image represent extensions of boundaries between pixels. The vertical and horizontal solid lines correspond to cut lines or regions 276-1 to 276-6 that are not aligned with streets between pixels. The street-aligned cut lines 274-1 to 274-6 are configured similar to the previously-described cut lines 240' of FIG. 9H. Accordingly, an underfill material 278 is configured along the lateral borders of each pixel for improved contrast. The width of the street-aligned cut lines 274-1 to 274-6 forms at least a portion of the spacing between pixels. In certain embodiments, each pixel of the pixelated-LED light emitting device 273 is spaced from adjacent pixels by a distance no greater than about 60 μm, or about 50 μm, or about 40 μm, or about 30 μm, or about 20 μm, or about 10 μm, or in a range of from about 10 μm to about 30 μm, or in a range of from about 10 μm to about 20 μm. Such dimensional ranges provide a desirably small pixel pitch. The spacing between pixels also relates to the width of the underfill material 278 that is configured between adjacent pixels. For example, in some embodiments, a 25 microns spacing between pixels allows more of the underfill material 278 (about 25 μm width) to be configured between adjacent pixels than a pixel spacing of 20 μm. Accordingly, more light may be reflected and re-directed out of each pixel without leaking into an adjacent pixel by the underfill material 278 with 25 μm spacing than the underfill material 278 with 20 μm spacing, thereby providing improved contrast and pixel brightness. Notably, for a constant spacing between street-aligned cut lines 274-1 to 274-6, a pixel spacing of 25 μm reduces the area of each pixel; however, the increase in the underfill material 278 may still provide brighter pixels with improved contrast.

The cut lines 276-1 to 276-6 that are not aligned with streets are configured similar to the previously-described cut lines 240 of FIG. 9H. Accordingly, the cut lines 276-1 to 276-6 form a plurality of light extraction surface recesses 280 that intersect and segregate a plurality of protruding light extraction features 281. For example, in pixel A1, vertical cut lines 276-1 and 276-2 and horizontal cut lines 276-5 and 276-6 form two vertical and two horizontal light extraction surface recesses 280 that intersect and define nine protruding light extraction features 281. As described above, the shape of a cutting tool as well as the number and direction of cut lines defines the shape of the protruding light extraction features 282. In FIG. 10, the cut lines are evenly spaced vertical lines that intersect with evenly spaced and orthogonal horizontal lines, and are formed with a beveled cutting tool. Accordingly, the protruding light extraction features 281 comprise square-base pyramidal shapes. In some embodiments, the pyramidal shapes comprise truncated pyramidal shapes, wherein such truncation may be vertical, lateral, or both vertical and lateral in character. Other shapes are possible, including triangle-shaped features, extruded triangle-shaped features and cuboid-shaped features. In other embodiments, the cut lines may comprise intersecting diagonal lines to form other shapes, such as diamond-shaped features or other polyhedral features.

In certain embodiments, one or more pixelated-LED chips may include different pixels with protruding light extraction features of the same or different sizes, shapes, numbers, and/or distributions. Protruding light extraction features of different sizes may include differences in at least one of height, width, length, or angularity. Protruding light extraction features of different shapes may include differences in symmetry (or lack thereof), angularity, inter-feature boundary curvature, or the like. Protruding light extraction features may be provided in different numbers in association with different pixels. Differences in pixel distribution may include relative or absolute placement of pixels relative to a pixel area.

In some embodiments, a pixelated-LED chip includes one or more reflective layers between individual pixels for improved contrast. Depending on the shape and material of the substrate portions for each pixel, the reflective layer may re-direct and reflect light toward a desired emission direction that would otherwise impinge with adjacent pixels. In some embodiments, the reflective layer may be separate from the underfill material and both the reflective layer, and the underfill material may be located between pixels. For example, the reflective layer may be a thin layer on a lateral sidewall of a pixel with the underfill material occupying the remaining space between an adjacent pixel. In other embodiments, the reflective layer may be continuous between adjacent pixels.

It has been observed by Applicant that formation of the light extraction surface recesses by sawing into a substrate may result in cracking in portions of a pixelated-LED chip, typically where a trough in the substrate overlies and is aligned with a boundary region between anode and cathode contacts of a pixelated-LED chip. Aspects of the present disclosure aims to address this problem by altering the character and degree of alignment between light extraction surface recesses and anode/cathode boundary regions, such as by altering the direction of formation of light extraction surface recesses, or by altering the orientation and/or geometry of anode/cathode boundary regions. FIGS. 11-15 aim to illustrate aspects of the problem, while embodiments addressing the problem are described thereafter.

FIG. 11 is a side elevational schematic view of a single pixel portion of a pixelated-LED chip 285 showing formation of a crack 298 initiated in a substrate 289 thereof and propagating through an active region 290 into other functional layers 292 (e.g., oxide, mirror, barrier, passivation and metallization layers, etc.). The pixelated-LED chip 285 includes protruding light extraction features 286 that are separated by light extraction surface recesses 288, which may be formed by sawing. The pixelated-LED chip 285 has a lower surface 293 with an anode 294 and a cathode 295 separated by an anode/cathode boundary region 296 having generally linear (e.g., elongated rectangular) shape extending into the page. A reduced thickness central region 287 is provided between a light extraction surface recess 288 and the bottom surface 293, with the reduced thickness central region 287 being generally aligned with the anode/cathode boundary region 296 (and extending into the page). Although not shown, an underfill material may be arranged generally below the lower surface 293 (including between the anode 294 and cathode 265 in the anode-cathode boundary region 296) as well as on side surfaces 297 that may serve as boundaries between adjacent pixels. An example of a suitable underfill material may include silicone with light-reflecting particles such as titanium dioxide. The side surfaces 297 serve as streets to segregate active regions 290 of adjacent pixels. As shown in FIG. 11, the crack 298 starts vertically in the reduced thickness central region 287 and propagates vertically above a gap between electrodes and propagates through the active region 290 into other functional layers 292. It is believed that the directional alignment between the light extraction surface recess 288 and the anode-cathode boundary region 296, together with the small extent of material present in the reduced thickness central region 287 and the mechanical stress applied during production of the light extraction surface recess 288 contribute to formation of the crack 298. Although presence of underfill material in the anode-cathode boundary region 296 would seem to provide some degree of mechanical support for the reduced thickness central region 287, the underfill material may need to have a relatively low durometer value to enable it to properly fill areas below the pixelated-LED chip 285, and therefore may be relatively easily compressed (and provide less physical support than may be desired to prevent cracking).

FIG. 12 is a side cross-sectional scanning electroscope microscopy image of a portion of a pixelated-LED chip 285' (consistent with the configuration of FIG. 11) showing a crack 298' extending into functional layers 292' of the pixelated-LED chip 285'.

FIG. 13 is a top plan view of a portion of a pixelated-LED chip 285A (consistent with the configuration of FIG. 11) following removal of protruding (pyramidal) features with the chip in an inactive state. Cracks 298A are visible, and propagate laterally through multiple pixels directly overlying a boundary region (not shown) between anode and cathode contacts on the backside of the pixelated-LED chip 285A. Although not shown, the anode and cathode contacts and are generally aligned with streets 297A between pixels of the pixelated-LED chip 285A.

FIG. 14 is a top plan view of a portion of a pixelated-LED chip (consistent with the configuration of FIG. 11) in an active state, showing the operational effect of a crack in the pixelated-LED chip. As shown, half of a pixel goes dark due to propagation of cracks through the substrate and epitaxial layers into other functional layers of a pixel.

Figure 15:
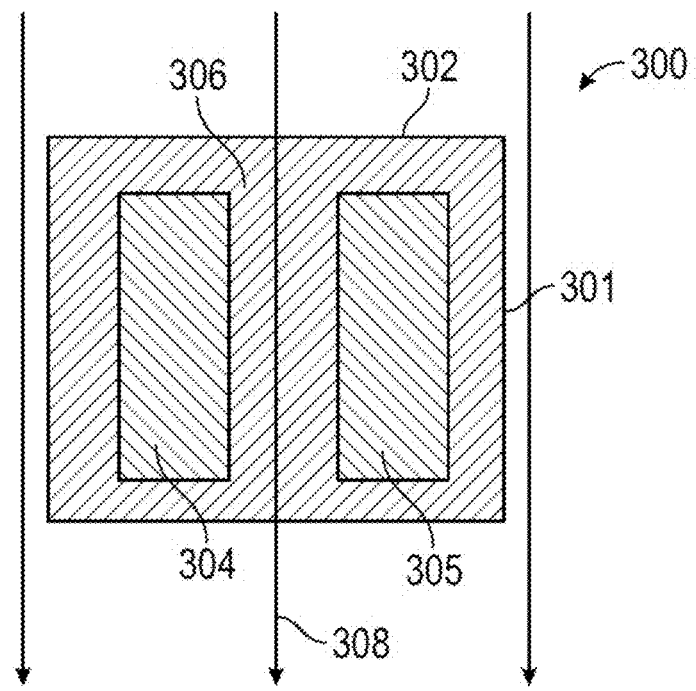
FIG. 15 is a schematic bottom plan view of one pixel of a pixelated-LED chip, depicting (with arrows) the formation of light extraction surface recesses in a direction aligned with (i.e., parallel with) an anode/cathode boundary.

FIG. 15 is a schematic bottom plan view of one pixel of a pixelated-LED chip 300 having lateral boundaries defined by streets 301, 302, and having an anode 304 and a cathode 305 separated by an anode/cathode boundary region 306. Such figure also depicts (with arrows 308) the formation of light extraction surface recesses in a direction aligned with (i.e., parallel with) the anode/cathode boundary region 306, and aligned with a first group of streets 301 (while being perpendicular to a second group of streets 302). Upon formation of light extraction surface recesses in a substrate of the pixelated-LED chip 300, the chip resulting from FIG. 15 is consistent with that described in connection with FIG. 11, rendering it susceptible to cracking due to overlap and alignment between the anode/cathode boundary region 306 and the light extraction surface recesses.

Figure 16:
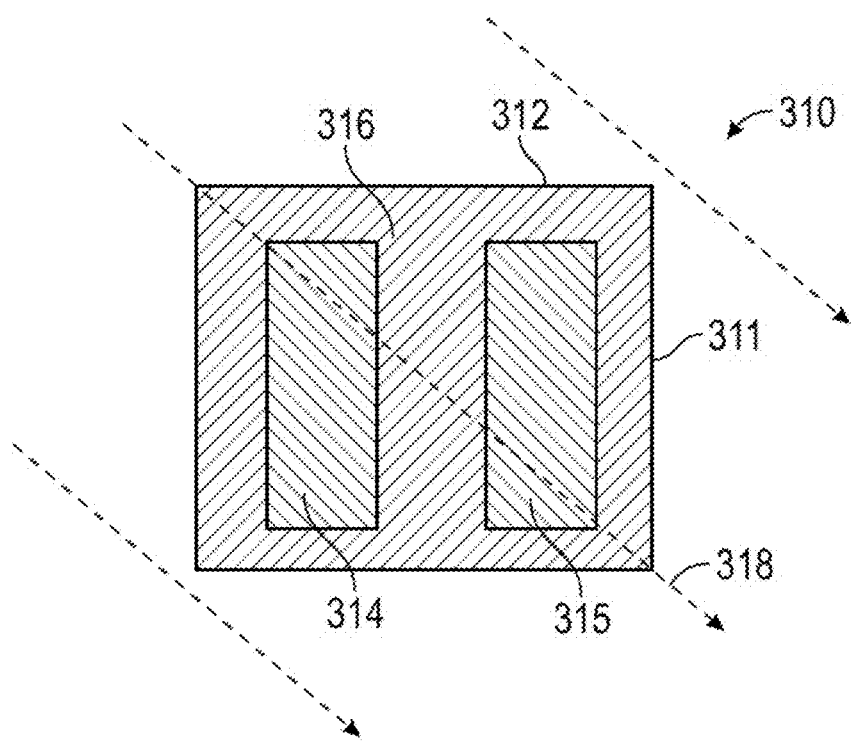
FIG. 16 is a schematic bottom plan view of one pixel of a pixelated-LED chip, depicting (with arrows) the formation of light extraction surface recesses misaligned with (i.e., arranged in a direction that differs by 45 degrees from) (i) a direction of streets segregating active regions of the pixelated-LED chip and (ii) an anode/cathode boundary of the pixelated-LED chip.

FIG. 16 is a schematic bottom plan view of one pixel of a pixelated-LED chip 310 having lateral boundaries defined by streets 311, 312 (which segregate an active region of the pixel from active regions of neighboring pixels), and having an anode 314 and a cathode 315 separated by an anode/cathode boundary region 316. Such figure also depicts (with arrows 318) the formation of light extraction surface recesses misaligned with (i.e., arranged in a direction that differs by 45 degrees from) (i) a direction of the streets 311, 312 and (ii) the anode/cathode boundary region 316. The resulting arrangement avoids overlapping alignment between the light extraction surface recesses and the anode/cathode boundary region 316, thereby reducing susceptibility of the pixelated-LED chip 310 to cracking relative to the pixelated-LED chip 300 of FIG. 15.

Figure 17A:
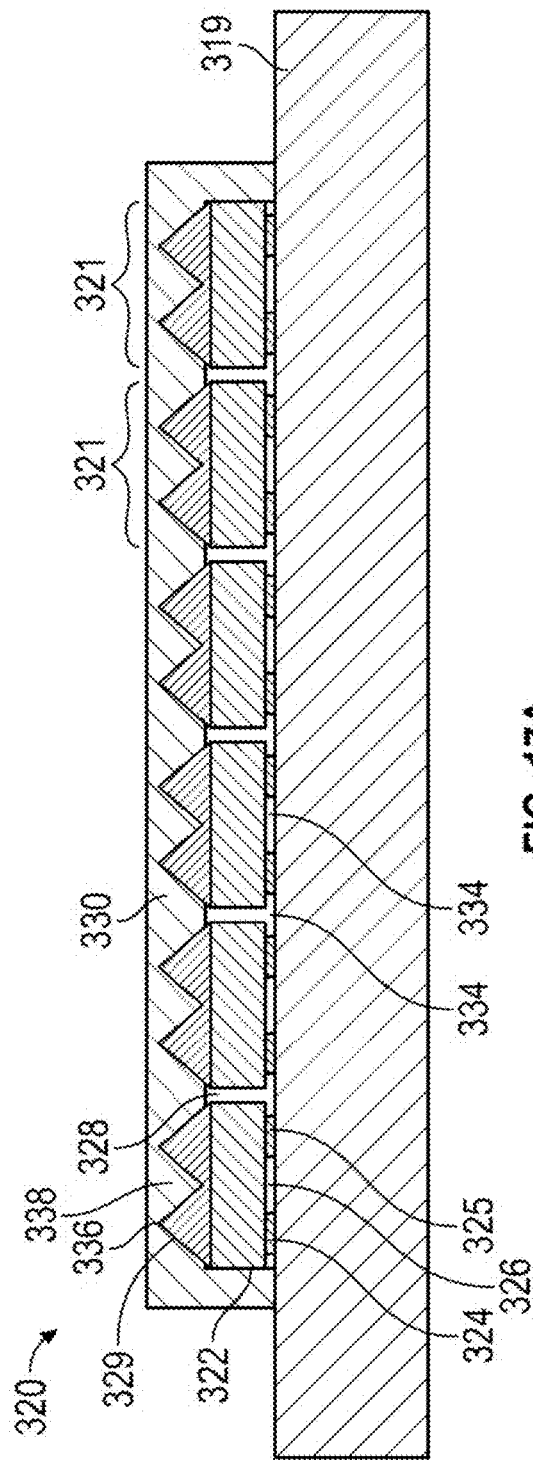
FIG. 17A is a side cross-sectional schematic view of a pixelated LED chip having light extraction surface recesses misaligned with streets and anode/cathode boundaries of the chip, with the chip being mounted to an underlying mounting element.

FIG. 17A is a side cross-sectional schematic view of a pixelated-LED chip 320 having light extraction surface recesses 338 misaligned with streets 328 and with anode/cathode boundary regions 326 of the chip 320. The pixelated-LED chip 320 includes multiple pixels 321 and is mounted to an underlying mounting element 319. Each pixel 221 includes an anode 324 and a cathode 325 arranged between an functional region 322 (including the active layer) and the mounting element 319. The streets 328 and the anode/cathode boundary regions 326 contain an underfill material 334. A substrate 329 of the pixelated-LED chip 320 overlies the functional region 322 and defines protruding regions 336 that are segregated by the light extraction surface recesses 338. A lumiphoric material 330 is arranged over an entire upper surface of the substrate 329 including the protruding regions 336 and the light extraction surface recesses 338. In certain embodiments, the pixelated-LED chip may have a thickness of about 75 μm, which may be substantially thinner than a thickness dimension of a corresponding mounting element 319 (e.g., 845 μm as illustrated).

Figure 17B:
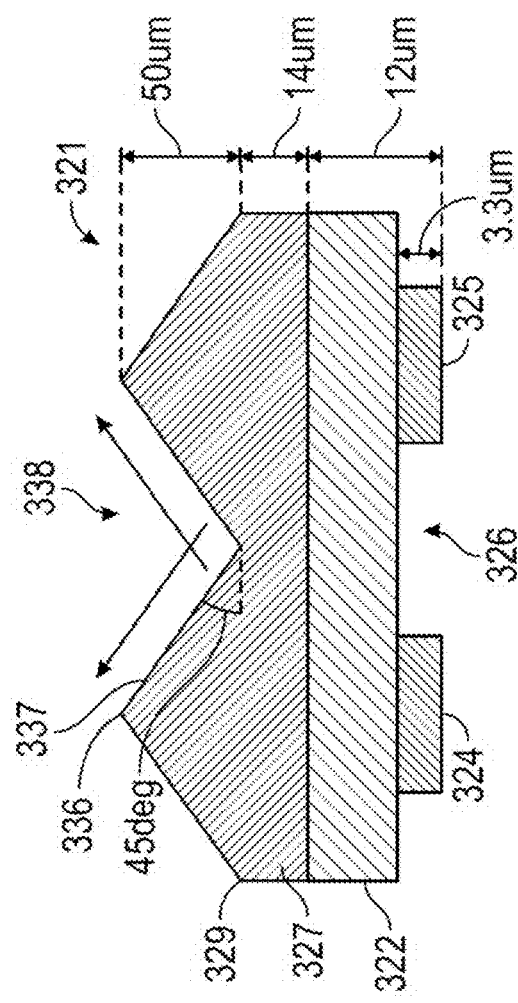
FIG. 17B is a magnified side cross-sectional schematic view of a single pixel portion of the pixelated-LED chip of FIG. 17A, including representative dimensions.

FIG. 17B is a magnified side cross-sectional schematic view of a single pixel portion of the pixelated-LED chip of FIG. 17A, including representative dimensions. Each pixel 221 includes an anode 324 and a cathode 325, and functional layers 322 (including an active region) arranged between a substrate 329 and the anode 324 and cathode 325. The anode 324 and cathode 325 may have a thickness of about 3.3 μm are separated by an anode/cathode boundary region 326. The functional layers 322 (including the active region) may have a thickness of about 8.7 μm. An untextured lower portion 327 of the substrate 329 may have a thickness of about 14 μm, with a textured portion of the substrate 329 including the protruding features 336 may have a thickness of about 50 μm. The protruding features 336 are separated by light extraction surface recesses 338. The protruding features 336 may have inclined lateral faces 337 that comprises an angle of inclination from vertical in a range of from about fifteen degrees to about forty-five degrees (or about forty-five degrees as shown).

A method for fabricating the pixelated-LED chip 320 of FIG. 17A includes epitaxially growing a multi-LED structure on a SiC substrate, followed by defining streets through the active layer to define separate active regions, and adding anode and cathode contacts. The multi-LED structure may be soldered to an underlying mounting structure, and an underfill material (e.g., silicone with titanium dioxide) may be added to trenches defined in the SiC substrate to permit the underfill material to fill areas between the substrate and the underlying mounting structure (including areas between anode and cathode contacts) and to fill the streets between adjacent pixels. After the underfill material is cured, the SiC substrate may be thinned to about 75 μm while attached to the underlying mounting structure. Thereafter, the SiC substrate may be textured using a saw blade to form light extraction surface recesses, which define protruding features therebetween. The light extraction surface recesses may be formed according to one set of passes offset 45 degrees in one direction relative to the streets, and another set of passes offset 45 degrees in the opposite direction (i.e., offset ninety degrees relative to the first set of passes) relative to the streets. Lumiphoric material may then be deposited over the resulting textured substrate surface, and post-growth processing may be performed to test and ensure that the desired color, homogeneity, and other characteristics are attained.

FIGS. 18A-18I generally illustrate portions of a pixelated-LED chip 340 in which active regions of each pixel are separated by streets 349A-349B in rectangular grid, and anode/cathode boundary regions 356 (shown in FIG. 18E) of each pixel extending in a direction generally parallel to streets 349B within the pixelated-LED, but with light extraction surface recesses 348A, 348B being unaligned with the streets 349A, 349B and anode/cathode boundary regions 356. More specifically, in the illustrated embodiment, light extraction surface recesses extend in a direction offset forty-five degrees from the streets 349A, 349B and the anode/cathode boundary regions 356, with the arrangement being suitable to avoid the potential for cracking of the pixelated-LED chip 340.

Figure 18A:
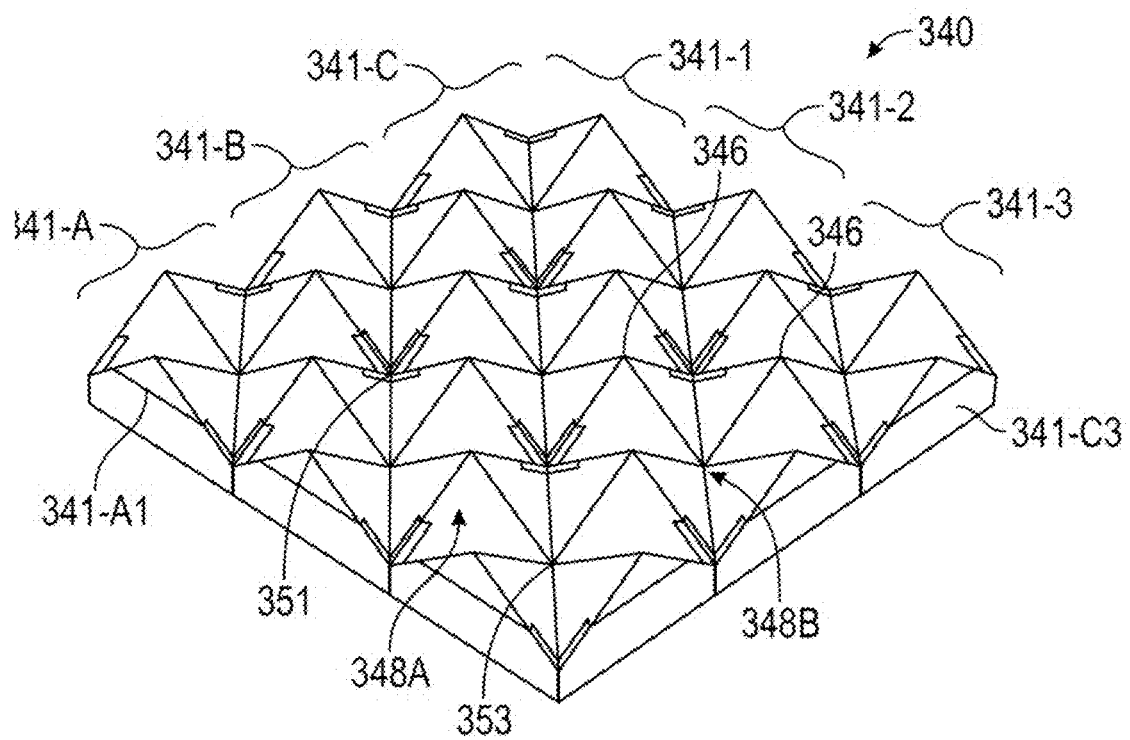
FIG. 18A is an upper perspective view illustration of a nine-pixel portion of a pixelated-LED chip having light extraction surface recesses misaligned with (i.e., arranged in a direction that differs by 45 degrees from) a direction of streets segregating active regions of the pixelated-LED chip.
Figure 18B:
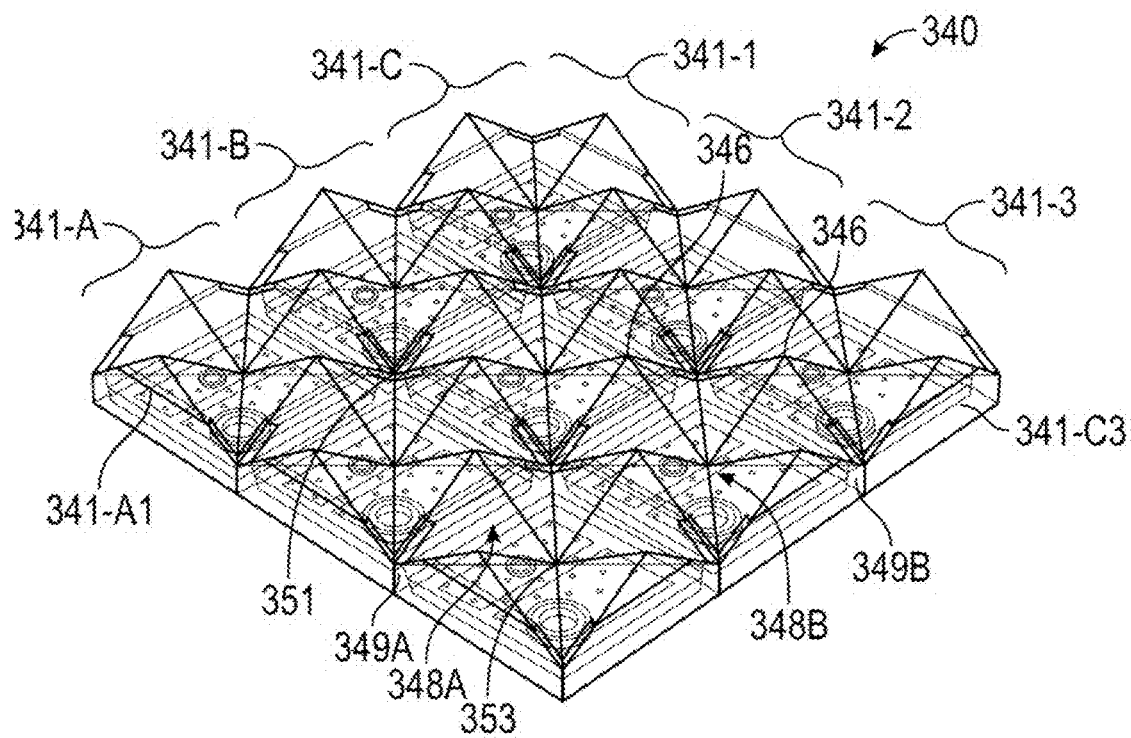
FIG. 18B is an upper perspective view illustration of the pixelated-LED chip portion of FIG. 18A in which textural features of the light extraction surface (i.e., protruding light extraction features and light extraction surface recesses) are represented as partially transparent to permit visualization of the streets between pixels.

FIG. 18A is an upper perspective view illustration of a portion of the pixelated-LED chip 340, showing protruding features 346 of the substrate segregated by light extraction surface recesses 348A, 348B extending in two directions. Further shown are labels for three columns 341-A to 341-C and three rows 341-1 to 341-3 to identify positions of nine pixels 341-A1 to 341-C3. Further shown are topside exposed underfill regions 351 that correspond to regions where local minimum thickness regions of the substrate formed by intersection of light extraction surface recesses 348A, 348B also intersect with underlying streets (349A, 349B as shown in FIG. 18B) that contain underfill material. The topside exposed underfill regions 351 corresponding to positions of corners of individual pixels 341-A1 to 341-C3. FIG. 18A also illustrates local minimum thickness regions 353 of the substrate that do not coincide with underlying streets. The resulting topography of an upper surface of the pixelated-LED chip 340 provides a plurality of four-sided pyramid shapes distributed over the pixels 341-A1 to 341-C3 in a uniform pattern.

FIG. 18B is an upper perspective view illustration of the same portion of the pixelated-LED chip 340 of FIG. 18A in which textural features of the light extraction surface (i.e., protruding light extraction features 346 and light extraction surface recesses 348A, 348B) are represented as partially transparent to permit visualization of the streets 349A, 349B between pixels 341-A1 to 341-C3. The remaining features of FIG. 18B are the same as described in FIG. 18A.

Figure 18C:
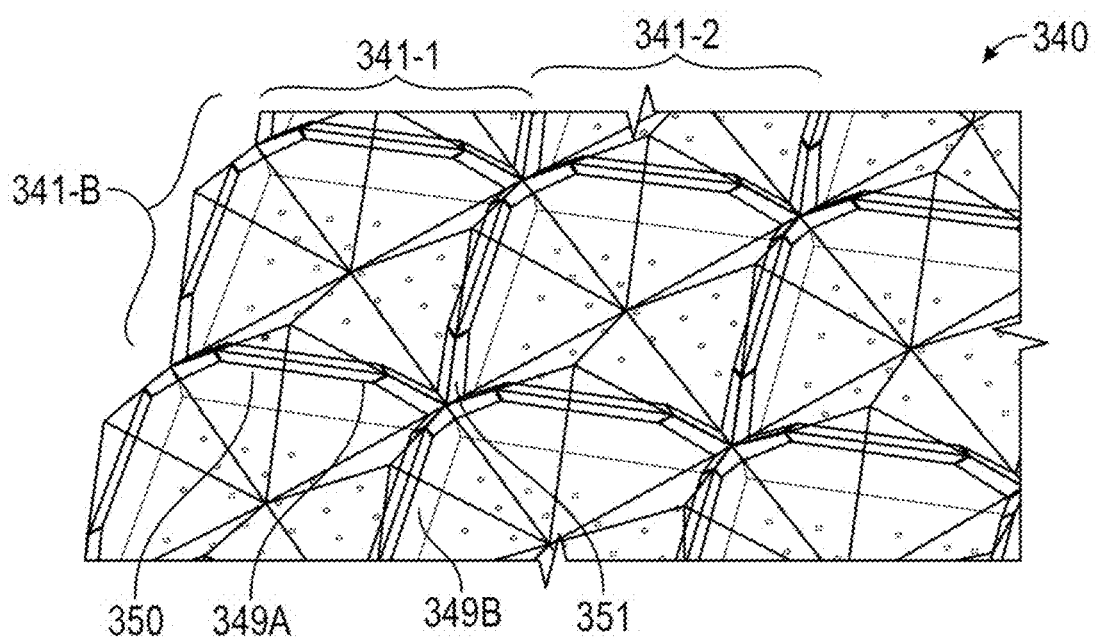
FIG. 18C is an magnified upper perspective view of a region of the pixelated-LED chip portion of FIGS. 18A and 18B, in which textural features of the light extraction surface are represented as partially transparent, to permit visualization of the shape of streets containing underfill material.

FIG. 18C is an magnified upper perspective view of a region of the pixelated-LED chip 340 portion of FIGS. 18A and 18B, in which textural features of the light extraction surface are represented as partially transparent, to permit visualization of the shape of streets 349A, 349B containing underfill material 350. The streets 349A, 349B extend in two directions perpendicular to one another to segregate pixels of the pixelated-LED chip 340. Intersections between streets 349A, 349B are notched (due to formation of the light extraction surface recesses 348A, 348B) to intersect underlying streets and yield the topside exposed underfill regions 351 (thereby exposing underfill material previously supplied to the streets).

Figure 18D:
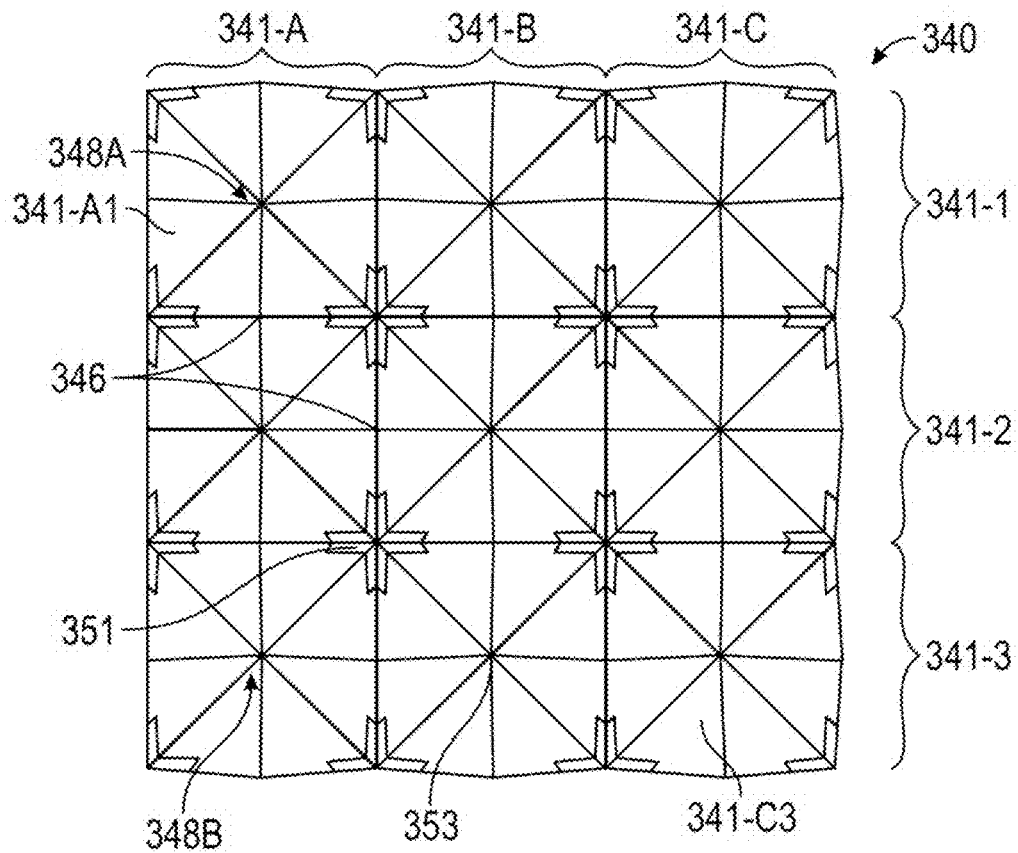
FIG. 18D is a top plan view illustration of the pixelated-LED chip portion of FIGS. 18A and 18B.
Figure 18E:
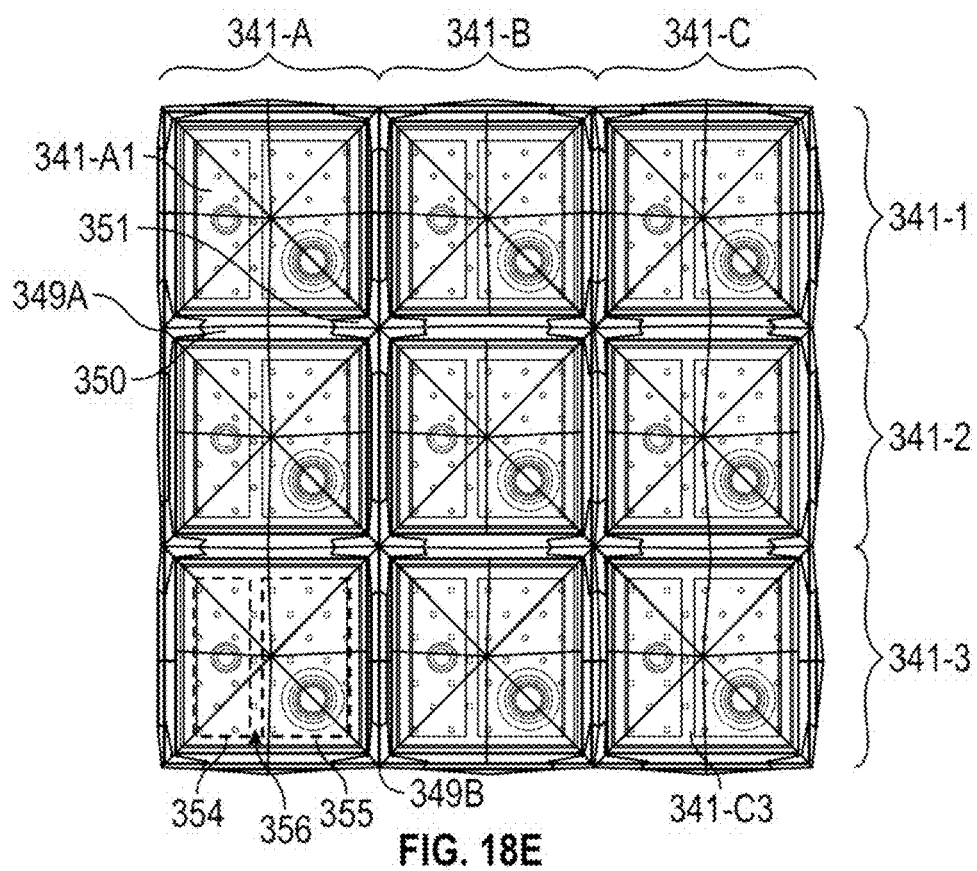
FIG. 18E is a top plan view illustration of the pixelated-LED chip portion of FIGS. 18A, 18B, and 18D in which textural features of the light extraction surface (i.e., protruding light extraction features and light extraction surface recesses) are represented as partially transparent to permit visualization of the streets between pixels.

FIG. 18D is a top plan view illustration of the portion of the pixelated-LED chip 340 of FIGS. 18A and 18B. Labels for three columns 341-A to 341-C and three rows 341-1 to 341-3 to identify positions of nine pixels 341-A1 to 341-C3. Additionally shown are topside exposed underfill regions 351 that correspond to intersections of light extraction surface recesses 348A, 348B that also intersect with underlying streets (349A, 349B as shown in FIGS. 18B and 18E) containing underfill material. Additionally shown are local minimum thickness regions 353 of the substrate that do not coincide with underlying streets.

FIG. 18E is a top plan view illustration of the portion of the pixelated-LED chip 340 of FIGS. 18A, 18B, and 18D in which textural features of the light extraction surface (i.e., protruding light extraction features 346 and light extraction surface recesses 348A, 348B, shown in FIG. 18D) are represented as partially transparent to permit visualization of the streets 349A, 349B between pixels 341-A1 to 341-C3. FIG. 18E also shows the anode 354, cathode 355, and anode/cathode boundary region 356 for one pixel, depicting the anode/cathode boundary region 356 as generally rectangular in shape and extending parallel to the streets 349B.

Figure 18F:
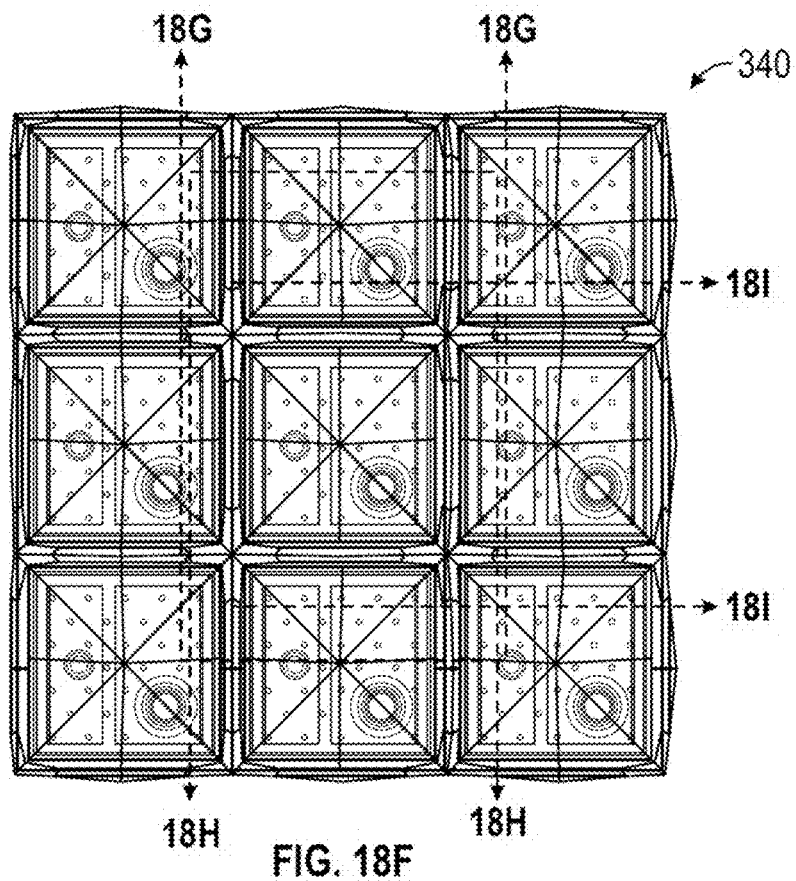
FIG. 18F presents the same view as FIG. 18E, with addition of section lines to identify the views of FIG. 18G-18I.
Figure 18G:
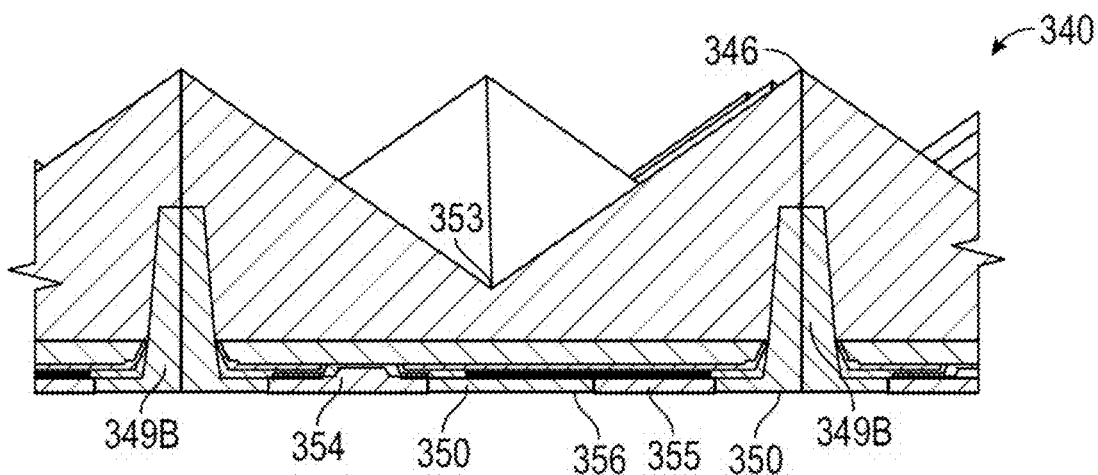
FIG. 18G is a cross-sectional view of a region of the pixelated-LED chip portion of FIGS. 18A, 18B, and 18D-18F, taken along section line "18G-18G" in FIG. 18F.
Figure 18H:
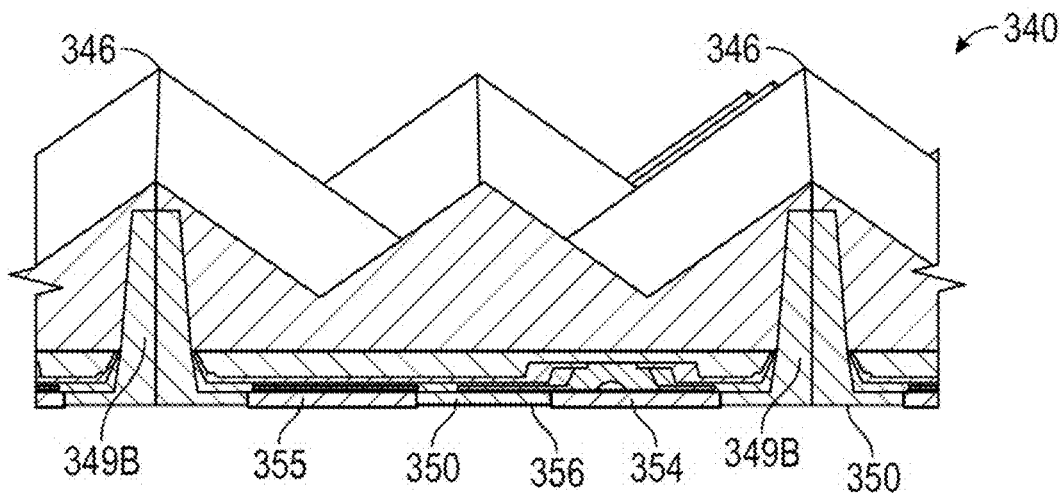
FIG. 18H is a cross-sectional view of a region of the pixelated-LED chip portion of FIGS. 18A, 18B, and 18D-18F, taken along section line "18H-18H" in FIG. 18F.
Figure 18I:
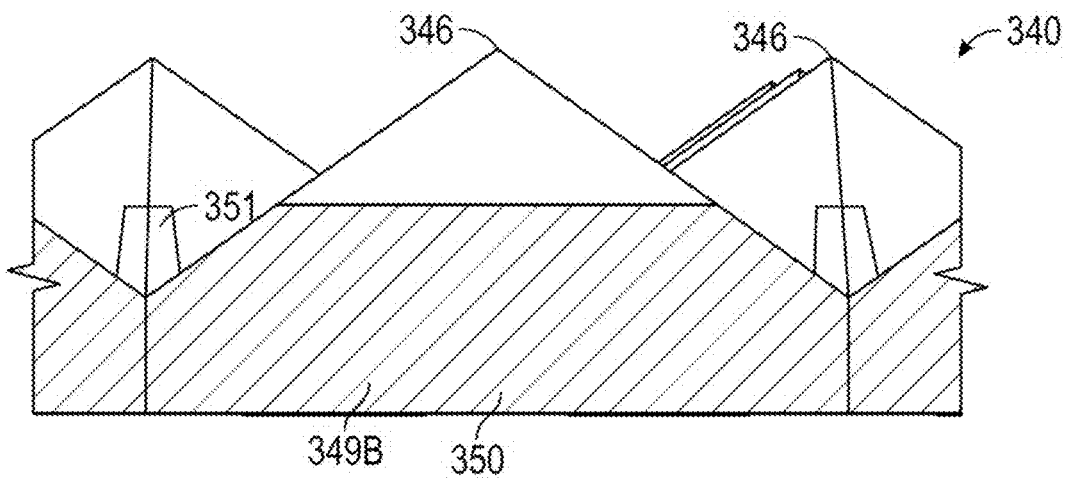
FIG. 18I is a cross-sectional view of a region of the pixelated LED portion of FIGS. 18A, 18B, and 18D-18F, taken along section line "18I-18I" in FIG. 18F.

FIG. 18F provides the same view as FIG. 18E, with addition of section lines to identify the views of FIG. 18G-18I.

FIGS. 18G and 18H provide cross-sectional views of portions of the pixelated-LED chip 340 of FIGS. 18A, 18B, and 18D-18F, taken along section lines "18G-18G" and "18H-18H", respectively, of FIG. 18F. FIGS. 18G and 18H generally show protruding light extraction features 346, local minimum thickness regions 353 (shown in FIG. 18G corresponding to intersections of light extraction surface recesses 348A, 348B that do not intersect with underlying streets), streets 349B containing underfill material 350, and an anode/cathode boundary region 356 (arranged between anode 354 and cathode 355) also containing underfill material 350.

FIG. 18I is a cross-sectional view of a portion of the pixelated-LED chip portion 340 of FIGS. 18A, 18B, and 18D-18F, taken along section line "18I-18I" extending through a street 349B in FIG. 18F. FIG. 18I shows protruding light extraction features 346, a street 349B containing underfill material 350, and topside exposed underfill regions 351.

Figure 19:
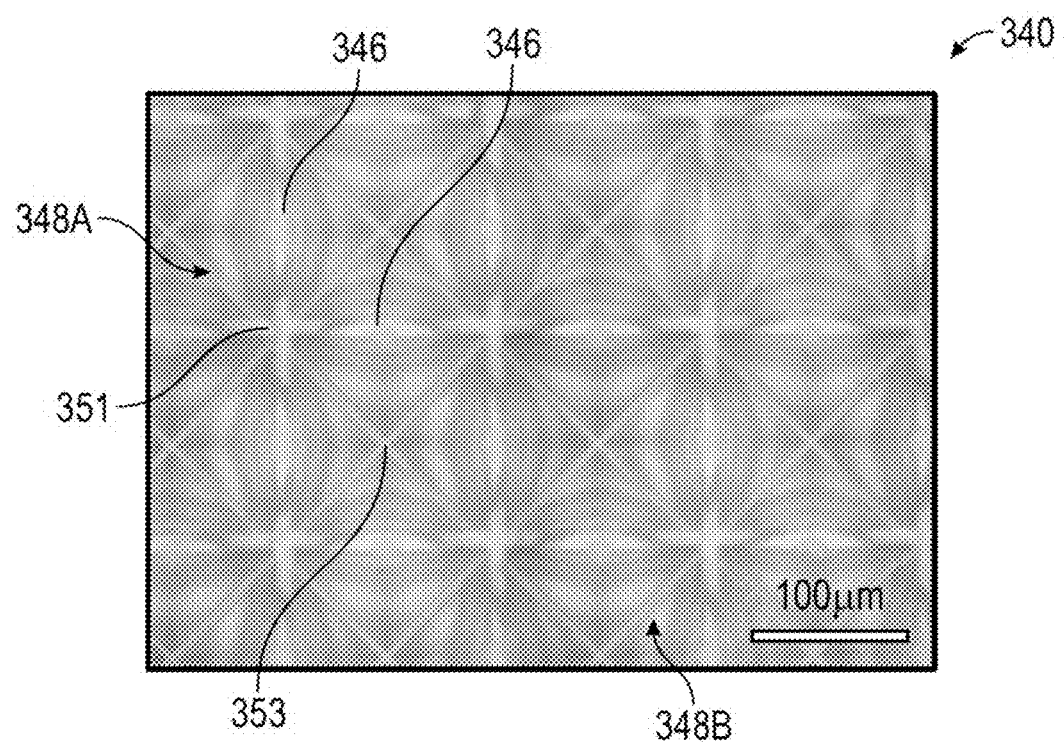
FIG. 19 is an upper perspective topographical micrograph of a portion of a pixelated-LED chip showing pyramid-shaped protruding features arranged in a grid and separated by crossing light extraction surface recesses, with a peak-to-trough height differential of between 30 and 40 µm.

FIG. 19 is a top plan view microscope image of a portion of the pixelated-LED chip 340, showing protruding features 346 of the substrate segregated by light extraction surface recesses 348A, 348B extending in two directions. Further shown are topside exposed underfill regions 351 and local minimum thickness regions 353 (corresponding to intersections of light extraction surface recesses 348A, 348B that do not intersect with underlying streets).

Figure 20:
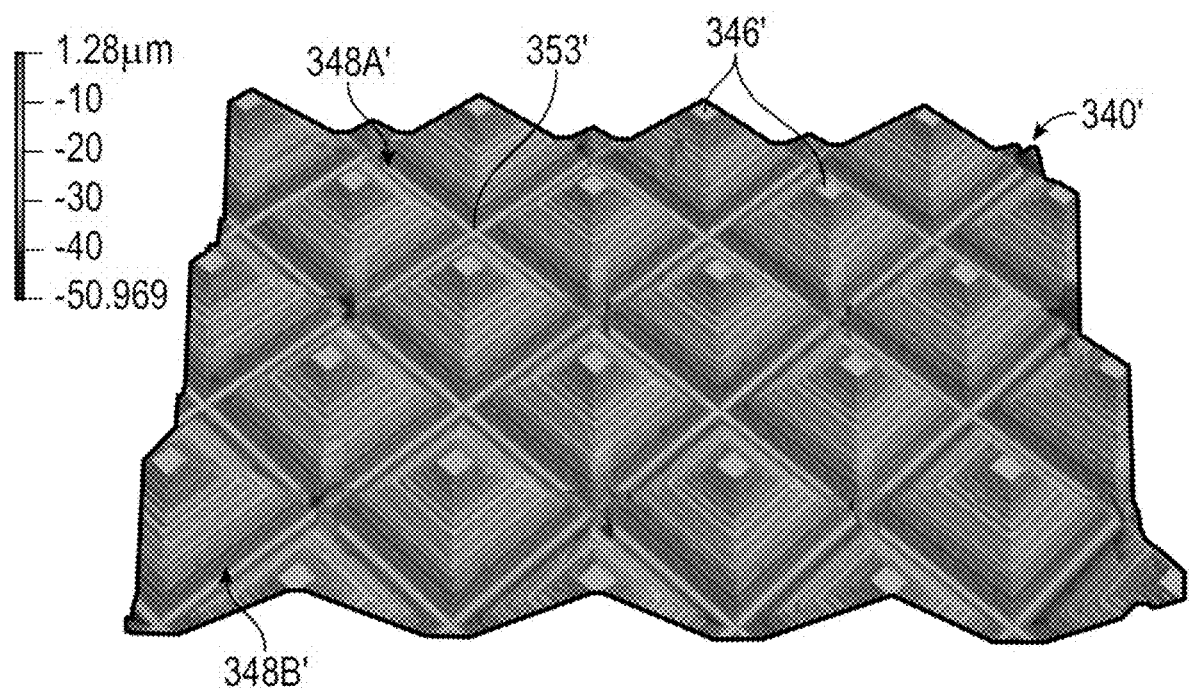
FIG. 20 is a micrograph showing a portion of a pixelated-LED chip having light extraction surface recesses misaligned with (i.e., arranged in a direction that differs by 45 degrees from) a direction of streets segregating active regions of the pixelated-LED chip.

FIG. 20 is an upper perspective topographical micrograph of a portion of a pixelated-LED chip 340' showing pyramid-shaped protruding light extraction features 346' arranged in a grid and separated by crossing light extraction surface recesses 348A'-348B', and showing local minimum thickness regions 353. As shown, the protruding light extraction features 346' and the light extraction surface recesses 348A'-348B' have a peak-to-trough height differential of between 30 and 40 μm.

Figure 21A:
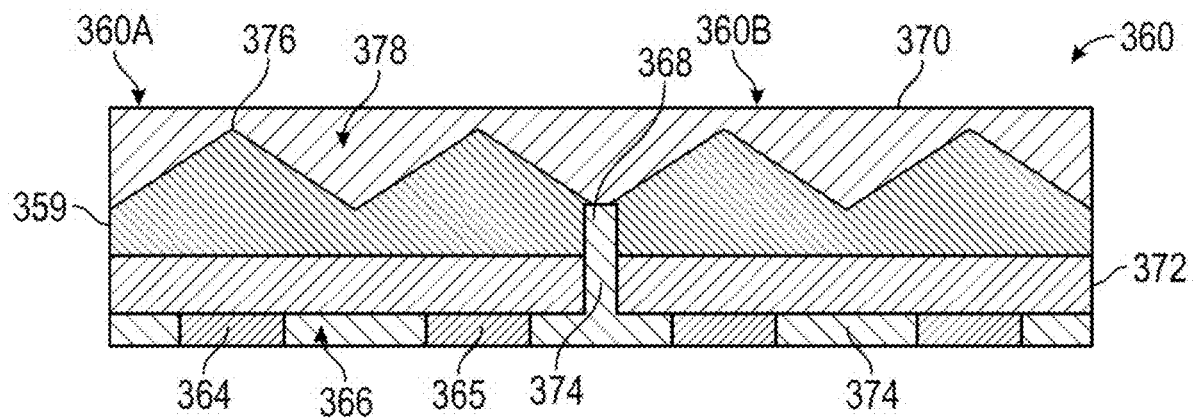
FIG. 21A is a schematic side cross-sectional view of a portion of a pixelated-LED chip including two pixels, with underfill material arranged below and between the pixels, including between substrate portions of the pixels but not extending into a lumiphoric material covering textured surfaces of the substrate portions.

FIG. 21A is a schematic side cross-sectional view of a portion of a pixelated-LED chip 360 including two pixels 360A, 360B, with underfill material 374 arranged below the pixels 360A, 360B and in streets 368 between the pixels 360A, 360B. Each pixel 360A, 360B includes functional region 322 (including the active layer) arranged between a substrate 359 and an anode 364 and a cathode 365. An anode/cathode boundary region 326 provided between the anode 364 and the cathode 365 also contains underfill material 374. The substrate 359 includes protruding regions 376 that are segregated by the light extraction surface recesses 378. A lumiphoric material 370 is arranged over an entire upper surface of the substrate 359 including the protruding regions 376 and the light extraction surface recesses 378. The light extraction surface recesses 378 extend in directions that are misaligned with (i.e., arranged in a direction that differs by 45 degrees or another threshold angle from) (i) a direction of the street 368 and (ii) the anode/cathode boundary region 366.

In certain embodiments, a pixelated-LED chip may include gaps or cuts that are defined in lumiphoric material and registered with streets that define boundaries between pixels. Such an arrangement may be formed by cutting a lumiphoric material layer (e.g., with a 10 μm saw blade), thereby creating an air gap that provides an index of refraction mismatch that improves pixel isolation, thereby increasing relative sharpness and relative contrast of images produced by a pixelated-LED chip.

Figure 21B:
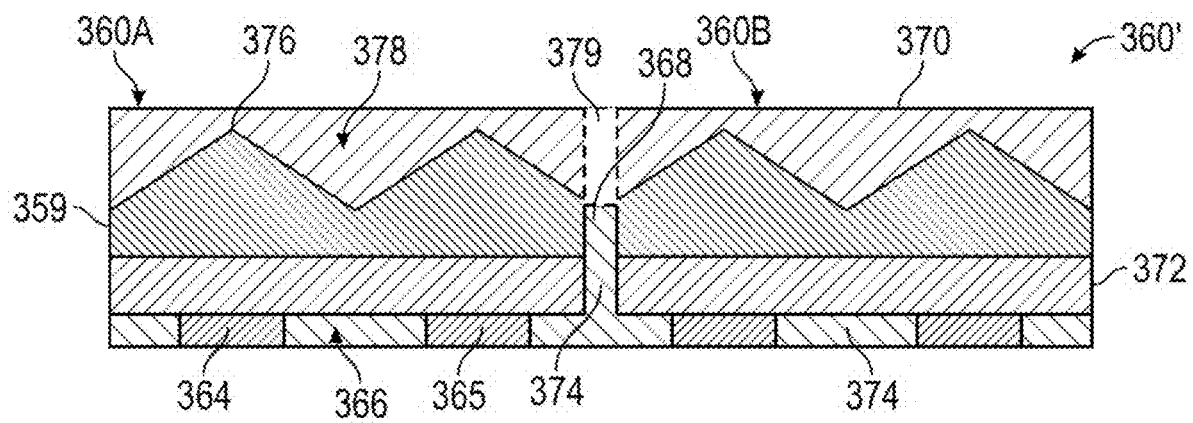
FIG. 21B is a side cross-sectional view of a portion of a pixelated-LED chip according to FIG. 21A, but with addition of a cut or gap in the lumiphoric material above textured substrate surfaces and registered with underfill material arranged at a boundary between pixels.

FIG. 21B is a side cross-sectional view of a portion of a pixelated-LED chip 360' according to FIG. 21A, but with addition of a cut or gap 379 in the lumiphoric material 370 registered with underfill material 374 contained in a street 368 between pixels 360A, 360B. Each pixel 360A, 360B includes functional region 322 (including the active layer) arranged between a substrate 359 and an anode 364 and a cathode 365. An anode/cathode boundary region 326 provided between the anode 364 and the cathode 365 also contains underfill material 374. The substrate 359, which includes protruding regions 376 that are segregated by the light extraction surface recesses 378, includes lumiphoric material 370 arranged over the protruding regions 376 and the light extraction surface recesses 378, except for the absence of lumiphoric material in the cut or gap 379.

Figure 21C:
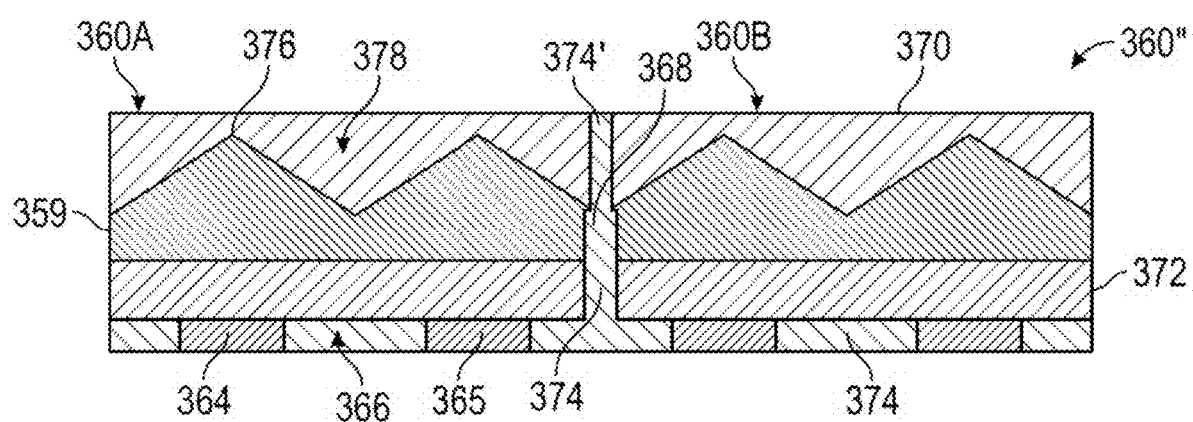
FIG. 21C is a side cross-sectional view of a portion of a pixelated-LED chip according to FIG. 21A, but with addition of underfill material to the cut or gap in the lumiphoric material between pixels.

In certain embodiments, a cut in lumiphoric material as described in FIG. 21B may be filled with reflective material 374' (e.g., which may be compositionally matched to the underfill material 374 already present in the street 368 and areas below the functional region 322 of each pixel 360A, 360B) to still further enhance pixel isolation, thereby further increasing relative sharpness and relative contrast of images produced by a pixelated-LED chip. FIG. 21C is a side cross-sectional view of a portion of a pixelated-LED chip 360' according to FIG. 21B, but with addition of reflective material 374' in a cut (e.g., cut 379 shown in FIG. 21B) defined in the lumiphoric material 370, with the reflective material 374' being registered with underfill material 374 contained in a street 368 between pixels 360A, 360B. In certain embodiments, the reflective material 374' comprises silicone with titanium dioxide therein. All of the remaining features of FIG. 21C are otherwise identical with FIGS. 21A and 21B, with the description of such features being hereby incorporated by reference as to FIG. 21C.

Figure 21D:
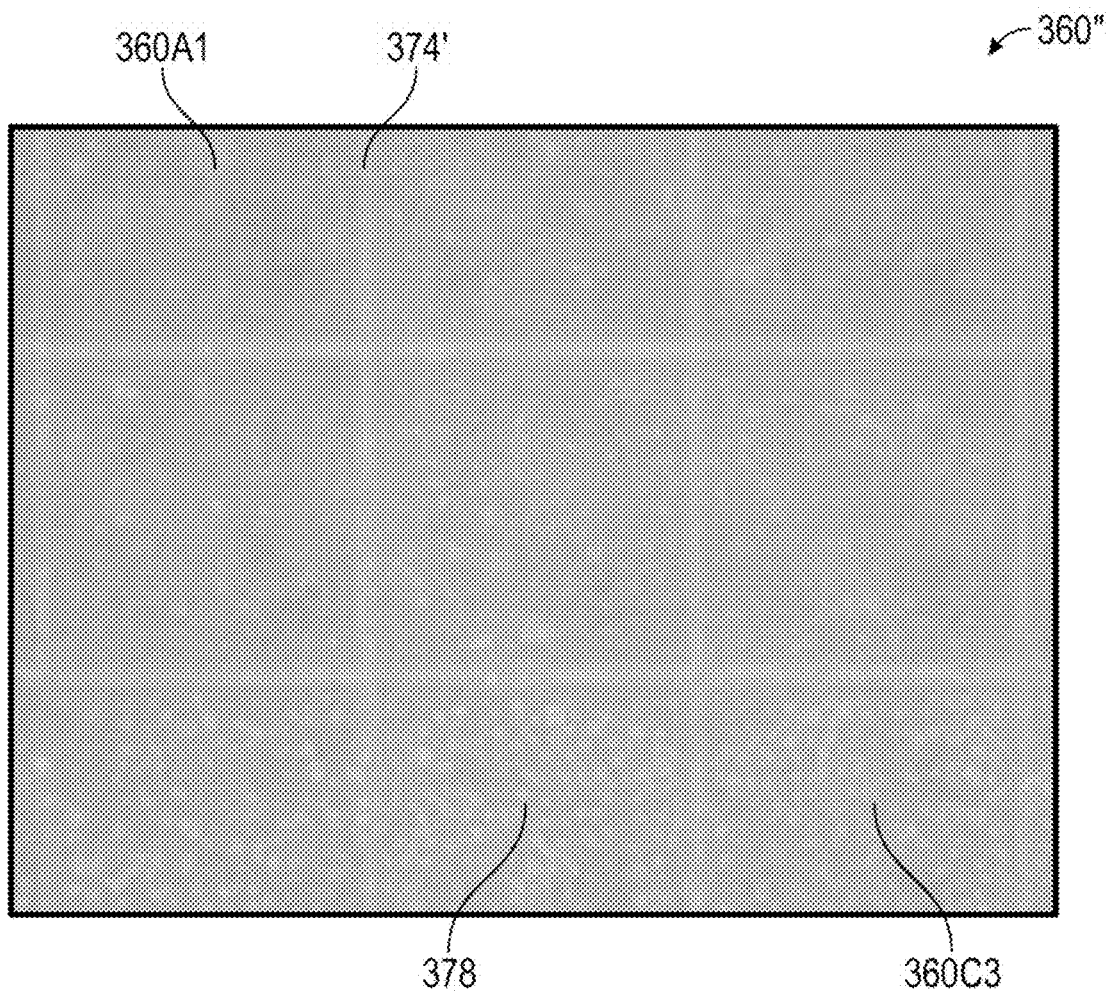
FIG. 21D is a top plan view illustration of a portion of a pixelated-LED chip including features according to FIG. 21C.

FIG. 21D is a top plan view illustration of a portion of a pixelated-LED chip 360" including features according to FIG. 21C. In particular, reflective material 374' is visible at boundaries between individual pixels 360A1 to 360C3 along a top surface of the pixelated-LED chip 360", with surface portions of the remaining portions of the pixels 360A1 to 360C3 comprising lumiphoric material 378.

In certain embodiments, an arrangement of anodes and cathodes for pixels of a pixelated-LED chip may be adjusted to promote non-alignment between anode/cathode boundary regions of each anode-cathode pair and light extraction surface recesses of the pixelated-LED chip, in order to reduce a likelihood of cracking of the pixelated-LED chip. In certain embodiments, anode/cathode boundary regions may include at least one segment (or the entirety thereof) arranged non-parallel to light extraction surface recesses. In certain embodiments, at least some light extraction surface recesses of a plurality of light extraction surface recesses of a pixelated-LED chip extend in a direction that differs from a direction of at least one of a first plurality of light extraction surface recesses or a second plurality of light extraction surface recesses by an angle within a range of 10 to 80 degrees, by an angle within a range of 30 to 60 degrees, by an angle within a range of 40 to 50 degrees, or by an angle of about 45 degrees. In certain embodiments, at least some light extraction surface recesses of the plurality of light extraction surface recesses extend in a direction that differs from a first direction of a first plurality of light extraction surface recesses by an angle of 45 degrees or 135 degrees, and that differs from a second direction of a second plurality of light extraction surface recesses by an angle of 45 degrees or 135 degrees.

In certain embodiments, each anode/cathode boundary comprises a generally linear or elongated rectangular shape. In certain embodiments, each anode/cathode boundary comprises a curved shape or an angularly segmented shape (e.g., including multiple segments that are non-paralllel to one another).

Examples of pixelated-LED chips having anode/cathode boundary regions of that are non-aligned with light extraction surface recesses are illustrated and described in connection with FIGS. 22A-22C and 23A-23C.

Figure 22A:
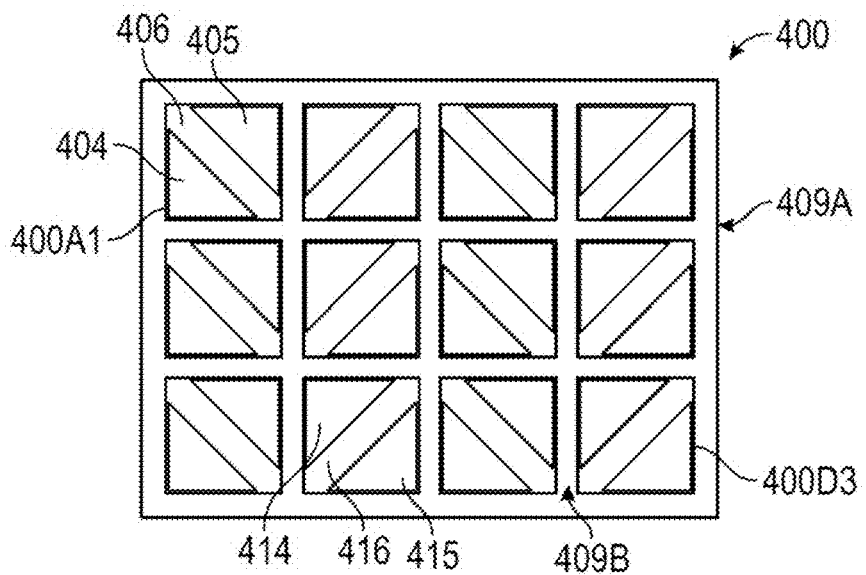
FIG. 22A is a schematic bottom plan view illustration of a portion of a pixelated-LED chip including twelve pixels each having an anode and a cathode having a right triangular shape, with a boundary line between each anode and cathode extending at a forty-five degree angle relative to streets between the pixels.
Figure 22B:
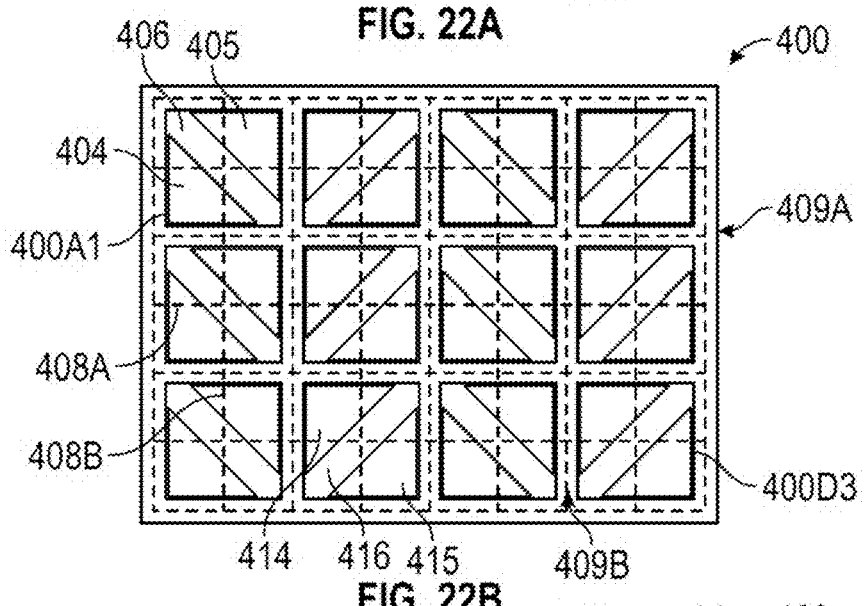
FIG. 22B is a schematic bottom plan view illustration of the pixelated-LED chip of FIG. 22A, with phantom line illustration of the light extraction surface recesses defined in a top surface of the substrate.
Figure 22C:
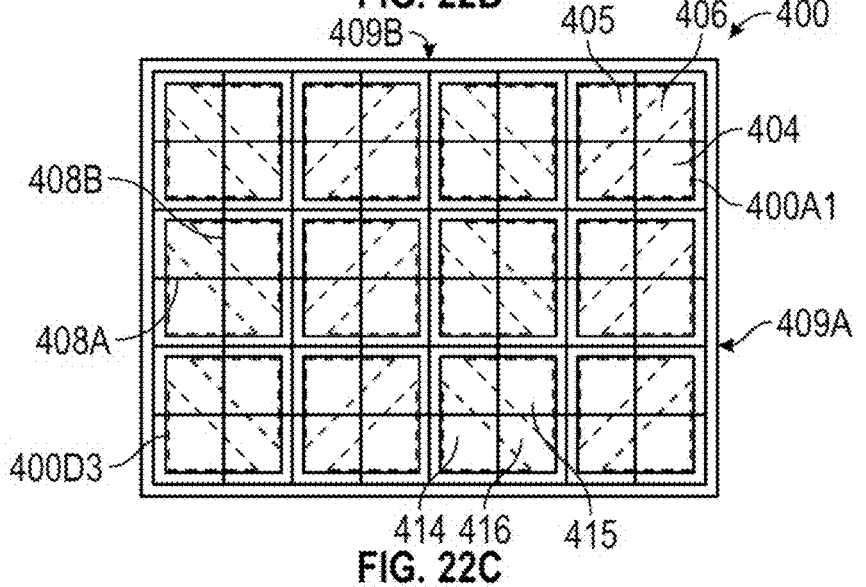
FIG. 22C is a schematic top plan view illustration of the pixelated-LED chip of FIGS. 22A and 22B.

FIG. 22A is a schematic bottom plan view illustration of a portion of a pixelated-LED chip 400 including twelve pixels 400A1 to 400D3 each having an anode 404, 414 and a cathode 405, 415 of a right triangular shape, with an anode-cathode boundary region 406, 416 between each anode 404, 414 and cathode 405, 415 extending at a forty-five degree angle relative to streets 409A, 409B between the pixels 400A1 to 400D3. Different pixels may have anode-cathode boundary regions 406, 416 configured as mirror images of adjacent items to facilitate electrical layout of an underlying mounting surface (not shown) FIG. 22B is a schematic bottom plan view illustration of the pixelated-LED chip 400 of FIG. 22A, with a phantom (dashed) line illustration of the light extraction surface recesses 408A, 408B defined in a top surface of the substrate. FIG. 22C is a schematic top plan view illustration of the pixelated-LED chip 400 of FIGS. 22A and 22B, showing the pixels 400A1 to 400D3 each having an anode 404, 414 and a cathode 405, 415 of a right triangular shape, with an anode-cathode boundary region 406, 416 between each anode 404, 414 and cathode 456, 415 extending at a forty-five degree angle relative to streets 409A, 409B between the pixels 400A1 to 400D3. As shown in FIGS. 22A and 22B, the light extraction surface recesses 408A, 408B are non-aligned with, and non-parallel with, each anode-cathode boundary region 406, 416. This arrangement serves to reduce a likelihood of cracking in portions of a pixelated-LED chip, such as may result during formation of light extraction surface recesses by sawing.

Although FIGS. 22A-22C illustrate an anode-cathode boundary region 406, 416 that are roughly linear or rectangular in shape, it is to be appreciated that anode-cathode boundary region of other shapes and configurations may be used. For example, each anode/cathode boundary may comprise a curved shape or an angularly segmented shape (e.g., including multiple segments that are non-paralllel to one another), or an island-within-an-island (e.g., bullseye) configuration.

Figure 23A:
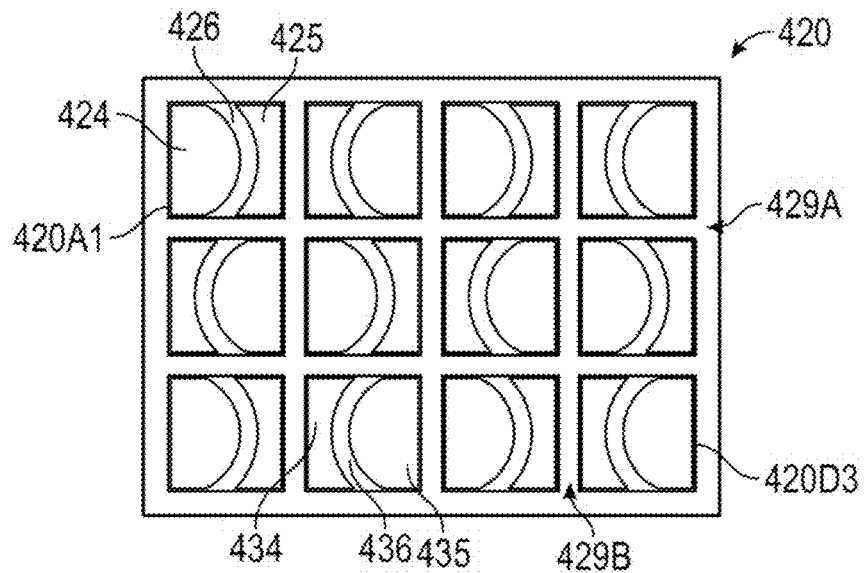
FIG. 23A is a schematic bottom plan view illustration of a portion of a pixelated-LED chip including twelve pixels each having an anode and a cathode shaped as a portion of a rectangle with a C-shaped intermediate boundary that is unaligned with streets between the pixels.
Figure 23B:
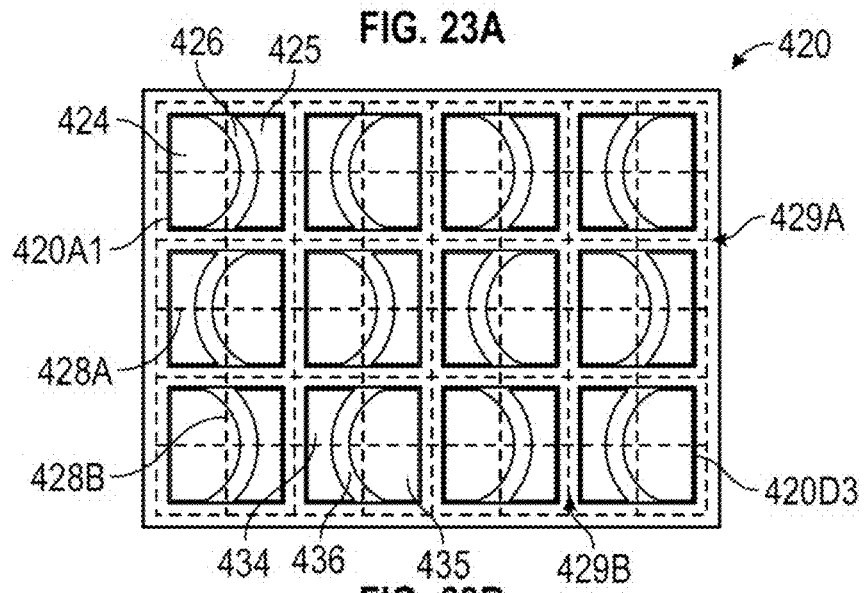
FIG. 23B is a schematic bottom plan view illustration of the pixelated-LED chip of FIG. 23A, with phantom line illustration of the orientation of light extraction surface recesses defined in a top surface of the substrate.
Figure 23C:
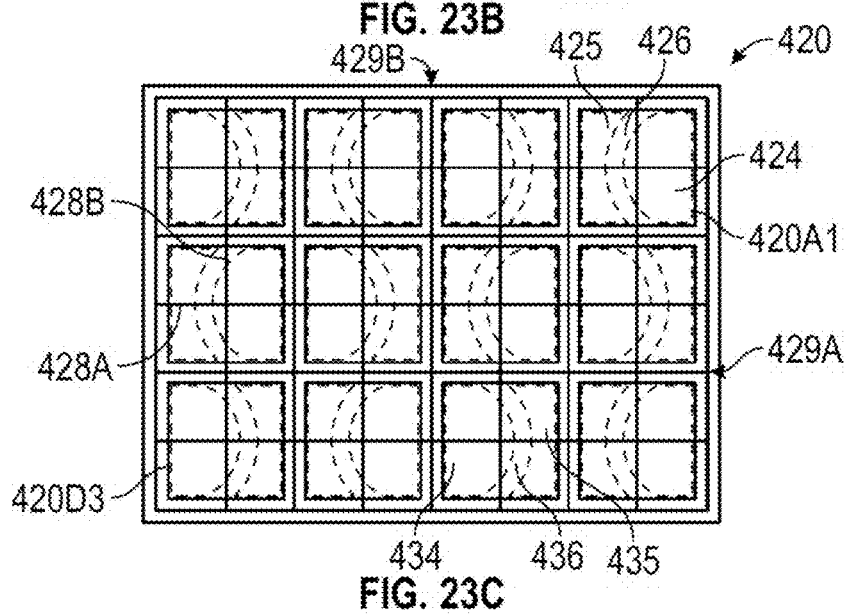
FIG. 23C is a schematic top plan view illustration of the pixelated-LED chip of FIGS. 23A and 23B.

FIG. 23A is a schematic bottom plan view illustration of a portion of a pixelated-LED chip 420 including twelve pixels 420A1 to 420D3 each having an anode 424, 434 and a cathode 425, 435 shaped as a portion of a rectangle with a C-shaped anode-cathode boundary region 426, 436 arranged therebetween, wherein the anode-cathode boundary region 426, 436 is unaligned with streets between the pixels 420A1 to 420D3. Different pixels may have anode-cathode boundary regions 426, 436 configured as mirror images of adjacent items to facilitate electrical layout of an underlying mounting surface (not shown). FIG. 23B is a schematic bottom plan view illustration of the pixelated-LED chip 420 of FIG. 23A, with a phantom (dashed) line illustration of the light extraction surface recesses 428A, 428B defined in a top surface of the substrate. FIG. 23C is a schematic top plan view illustration of the pixelated-LED chip 420 of FIGS. 23A and 23B, showing the pixels 420A1 to 420D3 each having an anode 424, 434 and a cathode 425, 435 of a right triangular shape, with an anode-cathode boundary region 426, 436 between each anode 424, 434 and cathode 425, 435. As shown in FIGS. 23A and 23B, the light extraction surface recesses 428A, 428B are non-aligned with, and non-parallel with, each anode-cathode boundary region 426, 436. This arrangement serves to reduce a likelihood of cracking in portions of a pixelated-LED chip, such as may result during formation of light extraction surface recesses by sawing.

In certain embodiments, pixelated-LED chips and devices incorporating pixelated-LED chips as disclosed herein may be used in automotive applications, such as in headlamps, tail lamps, automotive interior lighting, and the like.

In certain embodiments, pixelated-LED chips and devices incorporating pixelated-LED chips as disclosed herein may be used in a variety of non-automotive applications, including stationary and portable lighting devices. Stationary lighting devices may include sequentially illuminated displays, backlighting with localized dimming for display screens, micro-LED displays, image projectors, video displays, premises interior lighting (e.g., residential, commercial, and/or industrial), premises exterior lighting, instrumentation, industrial fabrication tools (e.g., for fabrication of masks, patterning of material, curing of compounds, etc.), roadway lighting, and indoor or outdoor signage. Portable lighting devices may include flashlights or lanterns, and personal display devices such as personal computers, tablets, phones, watches, and the like. In some embodiments, variable levels of lighting may be provided for stationary or portable lighting devices by selectively energizing a pixel or a subgroup of pixels of a pixelated-LED chip and/or by operating pixels of a pixelated-LED chip at reduced current levels. Additionally, different current levels may be used to energize different pixels or different subgroups of pixels within a pixelated-LED chip. Accordingly, a lighting device may be configured to simultaneously illuminate or project an image and provide general illumination to a surface. In other embodiments, a lighting device may be configured to provide selective illumination or selective dimming to a surface.

In some embodiments, a stationary lighting device such as an indoor lighting device may include at least one pixelated-LED chip. Indoor lighting devices include, by way of examples, area lights, downlights, high-bay or low-bay lighting fixtures, suspended lighting fixtures, troffers, wall-mounted or ceiling mounted fixtures, track lighting, plug-in devices such as table and floor lamps, and light bulbs.

In some embodiments, a stationary lighting device such as an outdoor lighting device may include at least one pixelated-LED chip. Outdoor lighting devices include, by way of examples, area lights, street and roadway lighting fixtures, canopy light fixtures, soffit light fixtures, parking garage lighting fixture, flood lighting, and wall-mounted or ceiling mounted outdoor fixtures.

In some embodiments, a plurality of stationary lighting devices may be grouped together to form a network of lighting devices that collectively provide general illumination as well as provide various images such as alphanumeric characters, symbols, different colors, still images, and moving images such as videos that are projected onto one or more surfaces. The network of lighting devices may be dynamically or collaboratively controlled to provide or communicate coordinated information. In some embodiments, individual lighting devices of the network of lighting devices may all provide the same image. In other embodiments, different lighting devices of the network of lighting devices may provide images that differ from one another to provide a coordinated image, or sequenced images that vary based on location.

Those skilled in the art will recognize improvements and modifications to the preferred embodiments of the present disclosure. All such improvements and modifications are considered within the scope of the concepts disclosed herein and the claims that follow.

What is claimed is:

1. A pixelated-LED chip comprising:
   an active layer comprising a plurality of active layer portions, with a plurality of streets defined through the active layer and arranged to segregate individual active layer portions of the plurality of active layer portions;
   a plurality of substrate portions supporting the plurality of active layer portions, wherein each substrate portion comprises a light-transmissive material, a light injection surface, and a light extraction surface, wherein the light injection surface is arranged between the active layer and the light extraction surface; and
   a plurality of anode-cathode pairs associated with the plurality of active layer portions;
   wherein each active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels;
   wherein the light extraction surface of each substrate portion comprises a plurality of light extraction surface recesses, and each light extraction surface recess of the plurality of light extraction surface recesses is non-parallel to each street of the plurality of streets defined through the active layer;
   wherein the light extraction surface of each substrate portion further comprises a plurality of protruding features, each protruding feature of the plurality of protruding features is separated from at least one other protruding feature by a light extraction surface recess of the plurality of light extraction surface recesses, and each protruding feature of the plurality of protruding features comprises a maximum width of from about one fifth to about one half of a maximum width of a pixel of the plurality of pixels with which each protruding feature is associated.

2. The pixelated-LED chip of claim 1, wherein the plurality of light extraction surface recesses forms a crossing pattern of light extraction surface recesses, and the plurality of streets form a crossing pattern of streets.

3. The pixelated-LED chip of claim 1, wherein at least some light extraction surface recesses of the plurality of light extraction surface recesses extend in a direction that differs from a direction of at least some streets of the plurality of streets by an angle within a range of 30 to 60 degrees.

4. The pixelated-LED chip of claim 1, wherein each light extraction surface recess of the plurality of light extraction surface recesses extend in a direction that differs from a direction each street of the plurality of streets by an angle of 45 degrees or by an angle of 135 degrees.

5. The pixelated-LED chip of claim 1, wherein each protruding feature of the plurality of protruding features comprises a polyhedral or truncated polyhedral shape with a plurality of inclined lateral faces, and each inclined lateral face of the plurality of inclined lateral faces comprises an angle of inclination from vertical in a range of from about fifteen degrees to about forty-five degrees.

6. The pixelated-LED chip of claim 1, further comprising at least one lumiphoric material arranged on or over the plurality of protruding features, wherein the at least one lumiphoric material is configured to receive at least a portion of light emitted by the plurality of active layer portions and to responsively generate lumiphor emissions.

7. The pixelated-LED chip of claim 6, wherein the at least one lumiphoric material is continuous on the plurality of pixels.

8. The pixelated-LED chip of claim 6, wherein the at least one lumiphoric material comprises a plurality of light segregation elements that are registered between pixels of the plurality of pixels.

9. The pixelated-LED chip of claim 6, wherein lumiphoric material associated with at least one first pixel of the plurality of pixels differs with respect to at least one of (a) composition, (b) concentration, (c) particle size, or (d) distribution relative to lumiphoric material associated with at least one second pixel of the plurality of pixels.

10. The pixelated-LED chip of claim 1, further comprising an underfill material arranged between (i) lateral sidewalls of the plurality of pixels and (ii) between the anode and the cathode of each pixel of the plurality of pixels.

11. The pixelated-LED chip of claim 10, wherein the underfill material comprises a light-altering or a light-reflecting material.

12. The pixelated-LED chip of claim 1, wherein the plurality of substrate portions comprises a plurality of discontinuous substrate portions.

13. The pixelated-LED chip of claim 1, further comprising a plurality of light segregation elements that are registered between pixels of the plurality of pixels.

14. The pixelated-LED chip of claim 1, wherein the plurality of protruding features and the plurality of light extraction surface recesses are defined by mechanical sawing.

15. The pixelated-LED chip of claim 1, comprising a peak-to-trough height differential between the plurality of protruding features and the plurality of light extraction surface recesses in a range of between 30 µm and 40 µm.

16. A method for fabricating a pixelated-LED chip, comprising:
    defining a plurality of streets through an active layer on a substrate to form a plurality of active layer portions, wherein the substrate comprises (i) a light injection surface proximate to a plurality of active layer portions, and (ii) a light extraction surface generally opposing the light injection surface, wherein streets of the plurality of streets are defined through the light injection surface and arranged generally between the plurality of active layer portions, and the substrate includes a plurality of anode-cathode pairs in conductive electrical communication with the plurality of active layer portions; and
    defining a plurality of light extraction surface recesses in the substrate, wherein each light extraction surface recess of the plurality of light extraction surface recesses is non-parallel to each street of the plurality of streets defined through the active layer, wherein the light extraction surface of each substrate portion further comprises a plurality of protruding features, each protruding feature of the plurality of protruding features is separated from at least one other protruding feature by a light extraction surface recess of the plurality of light extraction surface recesses, and each protruding feature of the plurality of protruding features comprises a maximum width of from about one fifth to about one half of a maximum width of a pixel of the plurality of pixels with which each protruding feature is associated;

wherein each active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels.

17. The method of claim 16, wherein the plurality of light extraction surface recesses forms a crossing pattern of light extraction surface recesses, and the plurality of streets form a crossing pattern of streets.

18. The method of claim 16, further comprising:
mounting the substrate over a mounting surface before the defining of a plurality of light extraction surface recesses in the substrate, and
thinning the substrate after said mounting of the substrate over the mounting surface, and before the defining of a plurality of light extraction surface recesses in the substrate.

19. The method of claim 18, further comprising applying an underfill material between the substrate and the mounting surface, between the plurality of anode-cathode pairs, and between the plurality of active layer portions before the thinning of the substrate.

20. The method of claim 16, further comprising removing portions of the substrate through an entire thickness of the substrate along a plurality of regions registered with the plurality of streets to form a plurality of discontinuous substrate portions.

21. The method of claim 16, further comprising applying a first lumiphoric material to the light extraction surface, and removing portions of the first lumiphoric material registered between pixels of the plurality of pixels to form a plurality of light segregation elements.

22. The method of claim 16, wherein at least some light extraction surface recesses of the plurality of light extraction surface recesses extend in a direction that differs from a direction of at least some streets of the plurality of streets by an angle within a range of 30 to 60 degrees.

23. The method of claim 16, wherein the defining of a plurality of light extraction surface recesses in the substrate comprises passing a saw blade across the substrate.

24. A pixelated-LED chip comprising:
an active layer comprising a plurality of active layer portions, with a plurality of streets defined through the active layer and arranged to segregate individual active layer portions of the plurality of active layer portions;
a plurality of substrate portions supporting the plurality of active layer portions, wherein each substrate portion comprises a light-transmissive material, a light injection surface, and a light extraction surface, wherein the light injection surface is arranged between the active layer and the light extraction surface; and
a plurality of anode-cathode pairs associated with the plurality of active layer portions, wherein each anode-cathode pair includes an anode and a cathode separated by an anode/cathode boundary;

wherein each active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels;

wherein the light extraction surface of each substrate portion comprises a plurality of light extraction surface recesses, and each light extraction surface recess of the plurality of light extraction surface recesses is non-aligned with the anode/cathode boundary of each anode-cathode pair of the plurality of anode-cathode pairs; and wherein the light extraction surface of each substrate portion further comprises a plurality of protruding features, each protruding feature of the plurality of protruding features is separated from at least one other protruding feature by a light extraction surface recess of the plurality of light extraction surface recesses, and each protruding feature of the plurality of protruding features comprises a maximum width of from about one fifth to about one half of a maximum width of a pixel of the plurality of pixels with which each protruding feature is associated.

25. The pixelated-LED chip of claim 24, wherein each anode/cathode boundary comprises a curved shape or an angularly segmented shape.

26. The pixelated-LED chip of claim 24, wherein the anode/cathode boundary of the at least some anode-cathode pairs of the plurality of anode-cathode pairs includes a segment that extends in a direction non-parallel to each light extraction surface recesses of the plurality of light extraction surface recesses.

27. The pixelated-LED chip of claim 24, wherein
each protruding feature of the plurality of protruding features comprises a polyhedral or truncated polyhedral shape with a plurality of inclined lateral faces, and each inclined lateral face of the plurality of inclined lateral faces comprises an angle of inclination from vertical in a range of from about fifteen degrees to about forty-five degrees.

28. The pixelated-LED chip of claim 24, further comprising at least one lumiphoric material arranged on or over the plurality of protruding features, wherein the at least one lumiphoric material is configured to receive at least a portion of light emitted by the plurality of active layer portions and to responsively generate lumiphor emissions.

29. The pixelated-LED chip of claim 28, wherein the at least one lumiphoric material is continuous on the plurality of pixels.

30. The pixelated-LED chip of claim 28, wherein the at least one lumiphoric material comprises a plurality of light segregation elements that are registered between pixels of the plurality of pixels.

31. The pixelated-LED chip of claim 30, wherein the plurality of light segregation elements comprises gaps or cuts in the at least one lumiphoric material.

32. The pixelated-LED chip of claim 31, wherein the plurality of light segregation elements comprises reflective material arranged in gaps defined in the at least one lumiphoric material.

33. The pixelated-LED chip of claim 28, wherein lumiphoric material associated with at least one first pixel of the plurality of pixels differs with respect to at least one of (a) composition, (b) concentration, (c) particle size, or (d) distribution relative to lumiphoric material associated with at least one second pixel of the plurality of pixels.

34. The pixelated-LED chip of claim 24, further comprising an underfill material arranged between (i) lateral sidewalls of the plurality of pixels and (ii) between the anode and the cathode of each pixel of the plurality of pixels.

35. The pixelated-LED chip of claim 34, wherein the underfill material comprises a light-altering or a light-reflecting material.

36. The pixelated-LED chip of claim 24, wherein the plurality of substrate portions comprises a plurality of discontinuous substrate portions.

37. The pixelated-LED chip of claim 24, further comprising a plurality of light segregation elements that are registered between pixels of the plurality of pixels.

38. The pixelated-LED chip of claim 37, wherein:
a first group of light extraction surface recesses of the plurality of light extraction surface recesses is substantially parallel to a first group of streets of the plurality of streets defined through the active layer; and
a second group of light extraction surface recesses of the plurality of light extraction surface recesses is substantially parallel to a second group of streets of the plurality of streets defined through the active layer.

39. The pixelated-LED chip of claim 24, each light extraction surface recess of the plurality of light extraction surface recesses is non-parallel to the anode/cathode boundary of each anode-cathode pair of the plurality of anode-cathode pairs.

40. The pixelated-LED chip of claim 39, wherein the anode/cathode boundary of each anode-cathode pair comprises a linear anode/cathode boundary.

41. The pixelated-LED chip of claim 40, wherein:
the plurality of light extraction surface recesses forms a crossing pattern of light extraction surface recesses; and
the linear anode/cathode boundary line for a first group of pixels of the plurality of pixels extends in a first direction, and the linear anode/cathode boundary line for a second group of pixels of the plurality of pixels extends in a second direction that intersects with the first direction.

42. The pixelated-LED chip of claim 41, wherein the second direction is substantially perpendicular to the first direction.

43. The pixelated-LED chip of claim 41, wherein at least some light extraction surface recesses of the plurality of light extraction surface recesses extend in a direction that differs from at least one of the first direction or the second direction by an angle within a range of 10 to 80 degrees.

44. The pixelated-LED chip of claim 24, wherein the plurality of protruding features and the plurality of light extraction surface recesses are defined by mechanical sawing.

45. The pixelated-LED chip of claim 24, comprising a peak-to-trough height differential between the plurality of protruding features and the plurality of light extraction surface recesses in a range of between 30 μm and 40 μm.

* * * * *